| (12) | United States Patent | (10) Patent No.: | US 10,242,994 B2 |
|---|---|---|---|
| | Inomata et al. | (45) Date of Patent: | *Mar. 26, 2019 |

(54) THREE-DIMENSIONAL MEMORY DEVICE CONTAINING ANNULAR ETCH-STOP SPACER AND METHOD OF MAKING THEREOF

(71) Applicant: SANDISK TECHNOLOGIES LLC, Plano, TX (US)

(72) Inventors: Takashi Inomata, Yokkaichi (JP); Nobuo Hironaga, Yokkaichi (JP); Junichi Ariyoshi, Yokkaichi (JP); Tadashi Nakamura, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/704,370

(22) Filed: Sep. 14, 2017

(65) Prior Publication Data

US 2018/0006049 A1    Jan. 4, 2018

Related U.S. Application Data

(63) Continuation-in-part of application No. 15/183,195, filed on Jun. 15, 2016, now Pat. No. 9,780,034, which
(Continued)

(51) Int. Cl.
*H01L 27/11524* (2017.01)
*H01L 27/11556* (2017.01)
(Continued)

(52) U.S. Cl.
CPC .. *H01L 27/11556* (2013.01); *H01L 21/76805* (2013.01); *H01L 21/76816* (2013.01);
(Continued)

(58) Field of Classification Search
CPC ........ H01L 29/205; H01L 33/04; H01L 33/32
See application file for complete search history.

(56) References Cited

U.S. PATENT DOCUMENTS 5,915,167 A    6/1999  Leedy
8,884,357 B2   11/2014 Wang et al.
(Continued)

FOREIGN PATENT DOCUMENTS

WO    WO2017065839 A1    4/2017

OTHER PUBLICATIONS

Endoh et al., "Novel Ultra High Density Memory with a Stacked-Surrounding Gate Transistor (S-SGT) Structured Cell," IEDM Proc. (2001) 33-36.
(Continued)

*Primary Examiner* — Jarrett J Stark
(74) *Attorney, Agent, or Firm* — The Marbury Law Group PLLC

(57) ABSTRACT

A monolithic three-dimensional memory device includes a first alternating stack of first insulating layers and first electrically conductive layers located over a top surface of a substrate, an insulating cap layer overlying the first alternating stack, a second alternating stack of second insulating layers and second electrically conductive layers and overlying the insulating cap layer, memory openings extending through the second alternating stack, the insulating cap layer, and the first alternating stack, memory stack structures located within the memory openings, and annular spacers located within the insulating cap layer and laterally surrounding a respective one of the memory stack structures.

10 Claims, 58 Drawing Sheets

Related U.S. Application Data is a continuation-in-part of application No. 15/071,575, filed on Mar. 16, 2016, now Pat. No. 9,768,192.

(51) Int. Cl.

| | |
|---|---|
| *H01L 27/1157* | (2017.01) |
| *H01L 27/11582* | (2017.01) |
| *H01L 21/768* | (2006.01) |
| *H01L 23/522* | (2006.01) |
| *H01L 23/528* | (2006.01) |
| *H01L 27/11565* | (2017.01) |
| *H01L 27/11519* | (2017.01) |
| *H01L 29/792* | (2006.01) |
| *H01L 27/11575* | (2017.01) |

(52) U.S. Cl.
CPC .. *H01L 21/76831* (2013.01); *H01L 21/76877* (2013.01); *H01L 23/5226* (2013.01); *H01L 23/5283* (2013.01); *H01L 27/1157* (2013.01); *H01L 27/11524* (2013.01); *H01L 27/11582* (2013.01); *H01L 27/11519* (2013.01); *H01L 27/11565* (2013.01); *H01L 27/11575* (2013.01); *H01L 29/7926* (2013.01)

(56) References Cited

U.S. PATENT DOCUMENTS

| | | | |
|---|---|---|---|
| 8,946,023 | B2 | 2/2015 | Makala et al. |
| 9,224,752 | B1 | 12/2015 | Lee et al. |
| 9,230,987 | B2 | 1/2016 | Pachamuthu et al. |
| 9,343,358 | B1 | 5/2016 | Xu |
| 9,502,471 | B1 | 11/2016 | Lu et al. |
| 9,570,463 | B1 | 2/2017 | Zhang et al. |
| 9,627,403 | B2 | 4/2017 | Liu et al. |
| 9,728,551 | B1 | 8/2017 | Lu et al. |
| 2011/0287612 | A1 | 11/2011 | Lee et al. |
| 2012/0001247 | A1* | 1/2012 | Alsmeier ........... H01L 27/11551 257/316 |
| 2015/0016242 | A1 | 1/2015 | Ernstrom et al. |
| 2015/0155296 | A1 | 4/2015 | Yoon |
| 2015/0294978 | A1 | 10/2015 | Lu et al. |
| 2017/0062454 | A1 | 3/2017 | Lu et al. |
| 2017/0229472 | A1 | 8/2017 | Lu et al. |
| 2017/0236835 | A1 | 8/2017 | Nakamura et al. |
| 2017/0243879 | A1 | 8/2017 | Yu et al. |

OTHER PUBLICATIONS

Hammond, M. L., "Silicon Epitaxy by Chemical Vapor Deposition," pp. 45-106.

Csepregi, L. et al., "Substrate-Orientation Dependence of the Epitaxial Regrowth Rate from Si-Implanted Amorphous Si," Journal of Applied Physics, vol. 49, No. 7, pp. 3906-3911 (1978).

Seidel, H. et al., "Anisotropic Etching of Crystalline Silicon in Alkaline Solutions," J. Electrochem. Soc., vol. 137, No. 11, pp. 3612-3626, (1990).

Non-Final Office Communication for U.S. Appl. No. 15/071,575, dated Nov. 16, 2016, 13 pages.

Invitation to Pay Additional Fees from the International Searching Authority for International Patent Application No. PCT/US2017/017823, dated May 4, 2017, 18 pages.

International Application No. PCT/US2017/017823, International Search Report and Written Opinion, dated Jul. 5, 2017, 24pgs.

U.S. Appl. No. 15/071,575, filed Mar. 16, 2016, Sandisk Technologies LLC.

U.S. Appl. No. 15/183,195, filed Jun. 15, 2016, Sandisk Technologies LLC.

U.S. Appl. No. 15/593,820, filed May 12, 2017, Sandisk Technologies LLC.

U.S. Appl. No. 15/632,983, filed Jun. 26, 2017, Sandisk Technologies LLC.

European Patent Office Communication Pursuant to Rules 161(1) and 162 EPC for EP Application No. 17708043.9, dated Jul. 5, 2018, 3 pages.

International Search Report and Written Opinion of the International Search Authority for International Patent Application No. PCT/US2018/035129, dated Sep. 19, 2018, 14 pages.

International Preliminary Report on Patentability and Written Opinion of the International Searching Authority for International Patent Application No. PCT/US2017/017823, dated Sep. 27, 2018, 16 pages.

\* cited by examiner

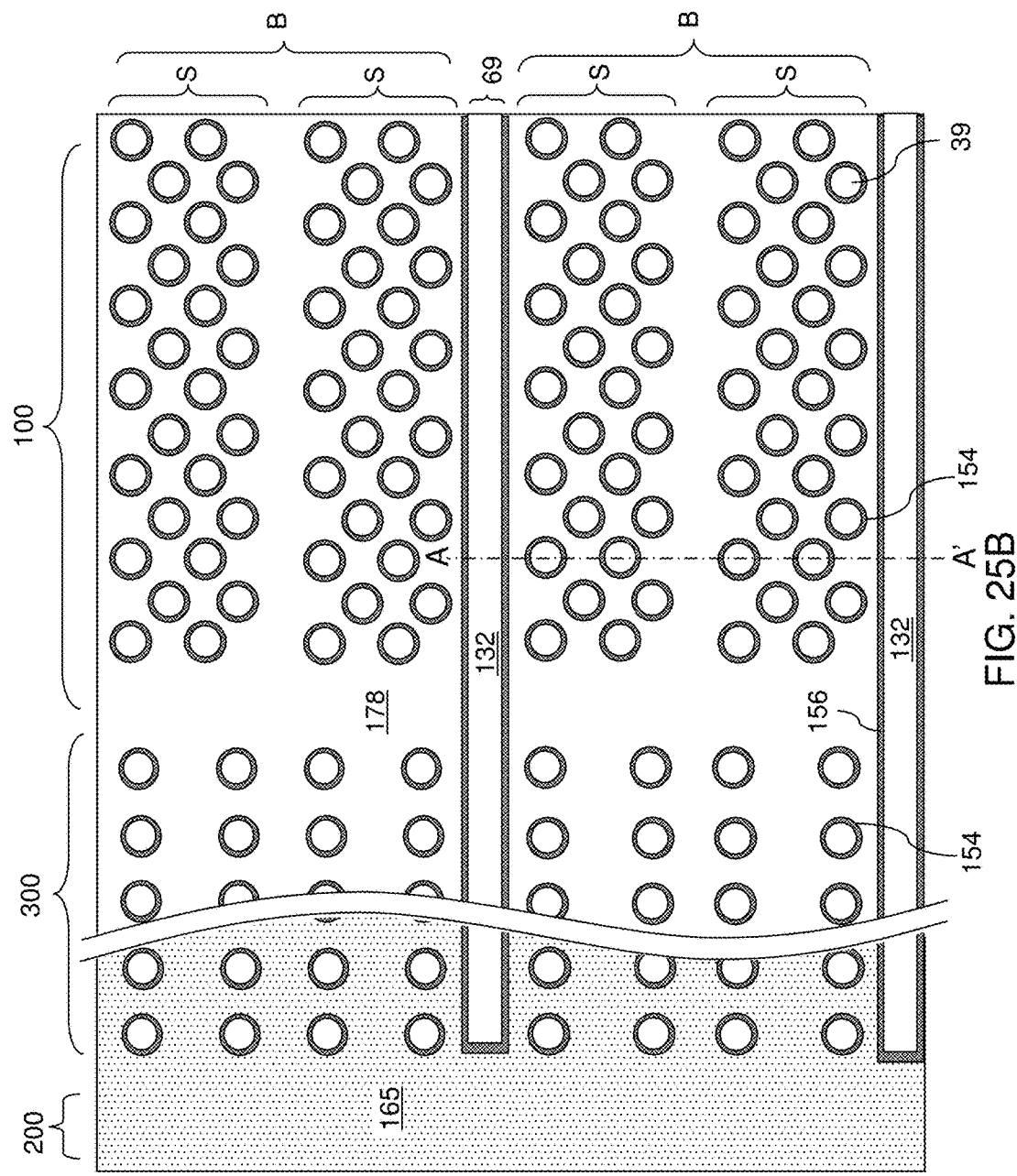

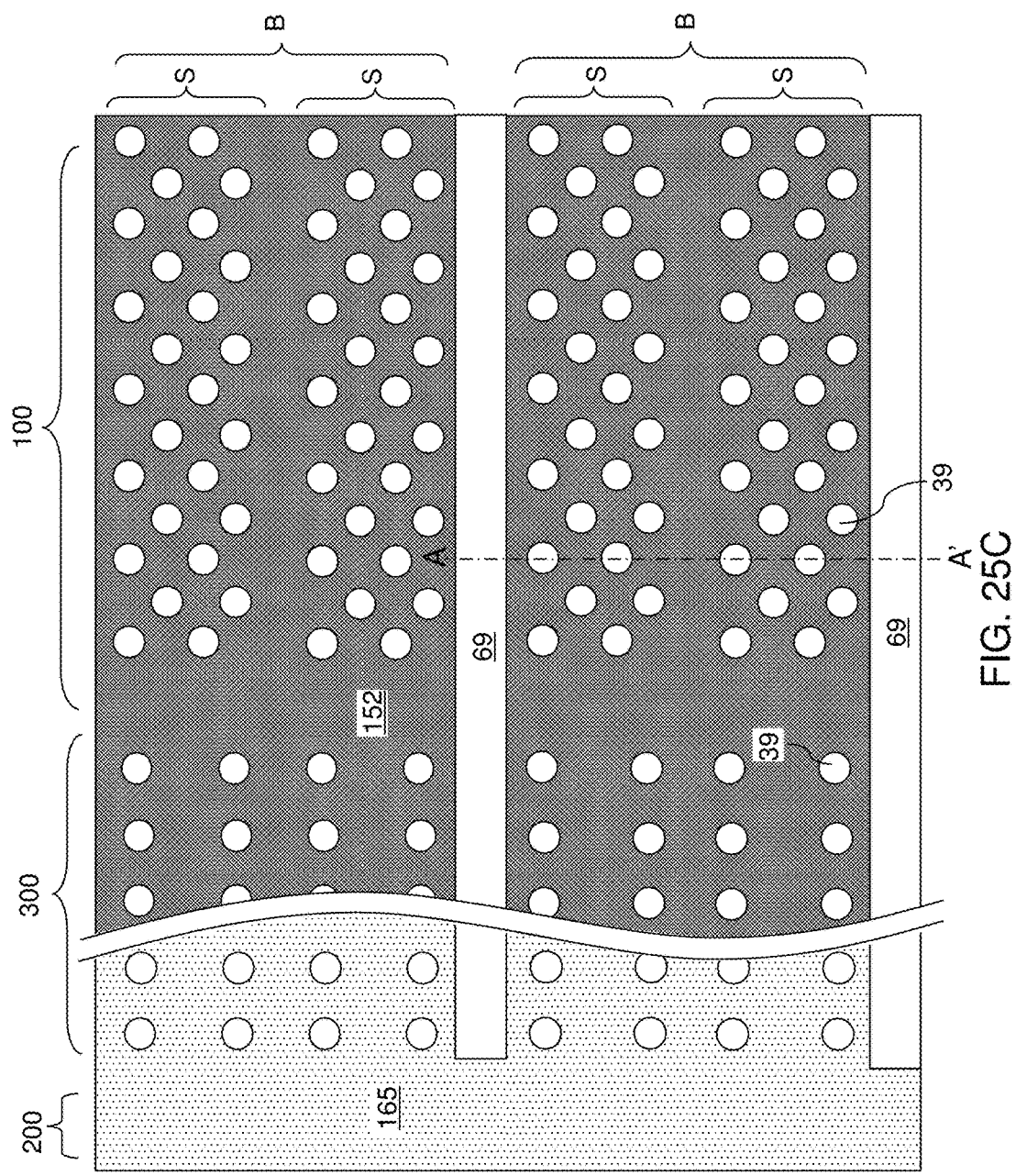

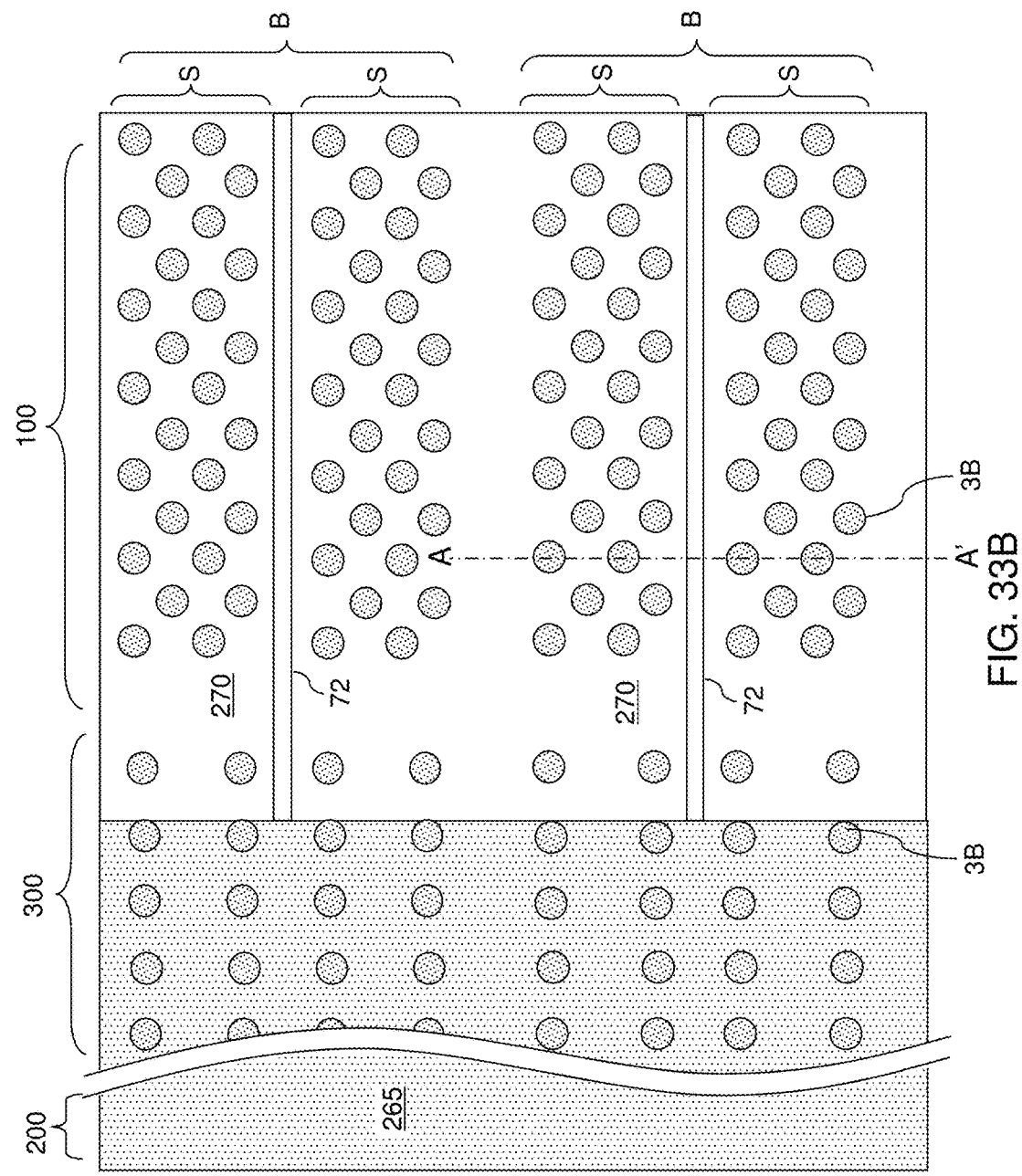

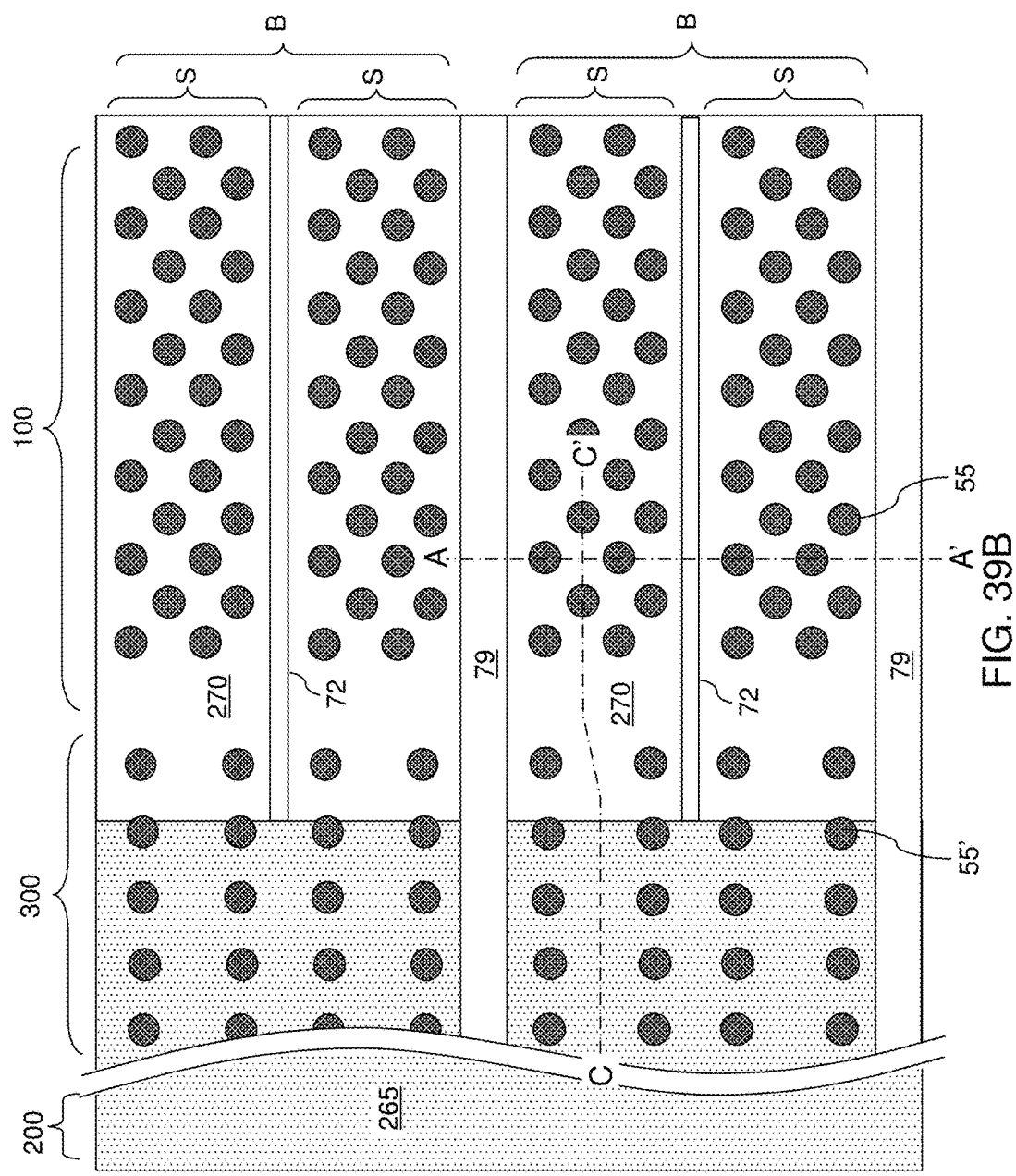

THREE-DIMENSIONAL MEMORY DEVICE CONTAINING ANNULAR ETCH-STOP SPACER AND METHOD OF MAKING THEREOF

RELATED APPLICATIONS

This application is a continuation-in-part application of U.S. application Ser. No. 15/183,195 filed on Jun. 15, 2016, which is a continuation-in-part application U.S. application Ser. No. 15/071,575 filed on Mar. 16, 2016, the entire contents of which are incorporated herein by reference.

FIELD

The present disclosure relates generally to the field of three-dimensional memory devices and specifically to three-dimensional memory devices including a vertical stack of multilevel memory arrays and methods of making the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a monolithic three-dimensional memory device is provided, which comprises: a first alternating stack of first insulating layers and first electrically conductive layers located over a top surface of a substrate; an insulating cap layer overlying the first alternating stack; a second alternating stack of second insulating layers and second electrically conductive layers and overlying the insulating cap layer; memory openings extending through the second alternating stack, the insulating cap layer, and the first alternating stack; memory stack structures located within the memory openings, wherein each of the memory stack structures comprises a semiconductor channel and a memory film; and annular spacers located within the insulating cap layer and laterally surrounding a respective one of the memory stack structures.

According to another aspect of the present disclosure, a method of forming a three-dimensional memory device is provided, which comprises the steps of: forming a first alternating stack of first insulating layers and first sacrificial material layers over a substrate; forming a first insulating cap layer over the first alternating stack; forming memory region recesses by patterning the first insulating cap layer; forming annular spacers at peripheries of the memory region recesses; forming a second insulating cap layer on the annular spacers and the first insulating cap layer; forming lower memory openings through the annular spacers and through the first alternating stack; forming sacrificial pillar structures in the lower memory openings; forming a second alternating stack of second insulating layers and second sacrificial material layers over the second insulating cap layer; forming upper memory openings through the second alternating stack and over the sacrificial pillar structures; removing the sacrificial pillar structures through the upper memory openings to form memory openings; and forming memory stack structures in the memory openings, wherein each of the memory stack structures comprises a semiconductor channel and a memory film.

BRIEF DESCRIPTION OF THE DRAWINGS

FIG. 25B is a top-down view of the second exemplary structure of FIG. 25A. The vertical plane A-A' is the plane of the vertical cross-sectional view of FIG. 25A.

FIG. 25C is a vertical cross-sectional view of the second exemplary structure of FIG. 25A along the horizontal plane C-C'.

FIG. 33B is a top-down view of the second exemplary structure of FIG. 33A. The vertical plane A-A' is the plane of the vertical cross-sectional view of FIG. 33A.

FIG. 39B is a top-down view of the second exemplary structure of FIG. 39A. The vertical plane A-A' is the plane of the vertical cross-sectional view of FIG. 39A.

DETAILED DESCRIPTION

Figure 1:
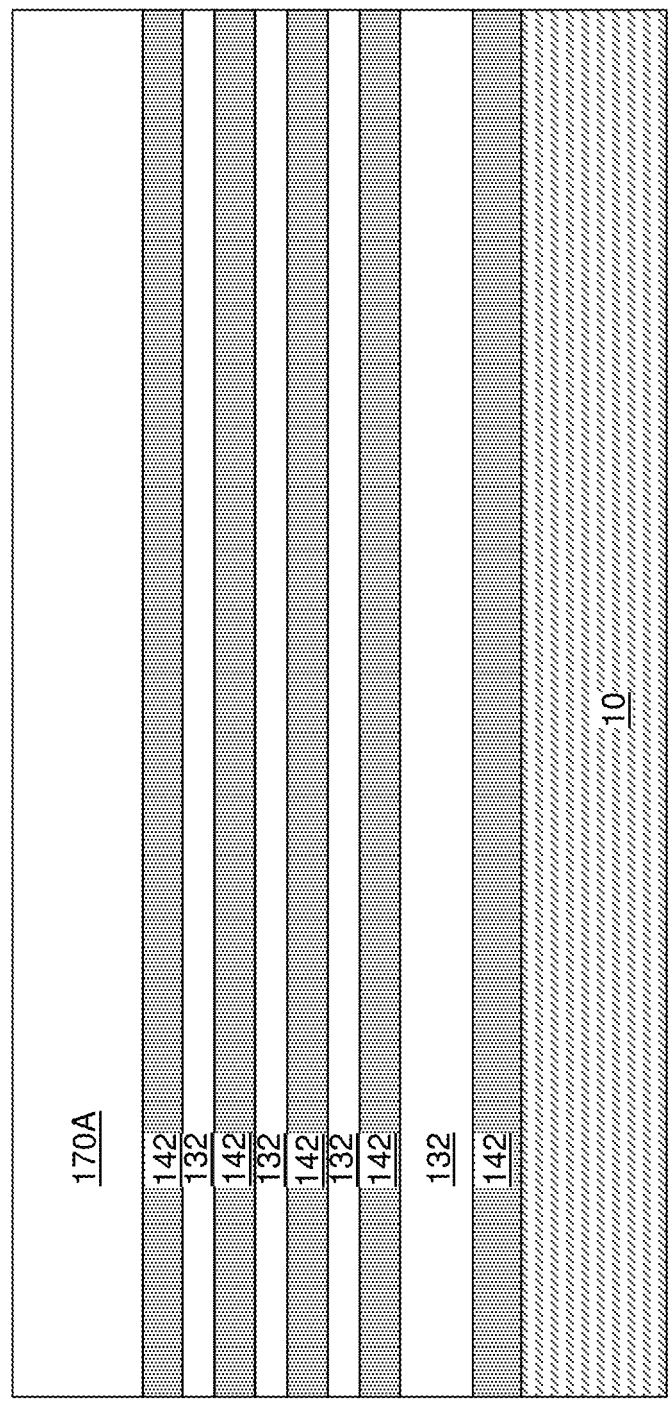
FIG. 1 is a vertical cross-sectional view of a first exemplary structure after formation of a first alternating stack of first insulating layers and first sacrificial material layers and formation of an overlying first insulating cap layer according to a first embodiment of the present disclosure.

As discussed above, the present disclosure is directed to three-dimensional memory devices including a vertical stack of multilevel memory arrays and methods of making the same, the various aspects of which are described below. An embodiment of the disclosure can be employed to form semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two-dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three Dimensional Structure Memory." The substrates may be thinned or removed from the memory levels before bonding, but as the memory levels are initially formed over separate substrates, such memories are not true monolithic three dimensional memory arrays. The various three-dimensional memory devices of the present disclosure include a monolithic three-dimensional NAND string memory device, and can be fabricated employing the various embodiments described herein.

Referring to FIG. 1, a first exemplary structure according to an embodiment of the present disclosure is illustrated, which can be employed, for example, to fabricate a device structure containing vertical NAND memory devices. The first exemplary structure includes a substrate, which can be a semiconductor substrate. The substrate can include a substrate semiconductor layer 10. The substrate semiconductor layer 10 can be a semiconductor material layer, and can include at least one elemental semiconductor material, at least one III-V compound semiconductor material, at least one II-VI compound semiconductor material, at least one organic semiconductor material, or other semiconductor materials known in the art. The substrate semiconductor layer 10 can comprise a single crystalline semiconductor material, such as a single crystal silicon wafer.

As used herein, a "semiconductor material" refers to a material having electrical conductivity in the range from $1.0 \times 10^{-6}$ S/cm to $1.0 \times 10^{5}$ S/cm, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulating material" or a "dielectric material" refers to a material having electrical conductivity less than $1.0 \times 10^{-6}$ S/cm. All measurements for electrical conductivities are made at the standard condition. Optionally, at least one doped well (not expressly shown) can be formed within the substrate semiconductor layer 10. While the substrate semiconductor layer 10 is alternatively referred to as the substrate 10 in the present disclosure, it is understood that the substrate 10 may optionally include additional material layers (such as a handle substrate and a buried insulator layer as in the case of a semiconductor-on-insulator substrate).

The first exemplary structure includes a device region, in which memory devices can be subsequently formed, and a contact region (not shown), in which stepped surfaces are subsequently formed. As used herein, a "contact region" refers to a region in which contact via structures are to be formed. At least one semiconductor device for a peripheral circuitry can be formed in a peripheral device region (not shown). The at least one semiconductor device can include, for example, one or more field effect transistors. The least one semiconductor device for the peripheral circuitry can contain a driver circuit for memory devices to be subsequently formed, which can include at least one NAND device.

Optionally, a doped semiconductor well (not separately shown) can be provided in an upper portion of the substrate semiconductor layer 10. The doped semiconductor well can be formed, for example, by implantation of electrical dopants (p-type dopants or n-type dopants) into an upper portion of the substrate semiconductor layer 10, or by deposition of a single crystalline semiconductor material, for example, by selective epitaxy. In one embodiment, the doped semiconductor well can include a single crystalline semiconductor material (e.g., p-well).

An alternating stack of first material layers and second material layers is subsequently formed. Each first material layer can include a first material, and each second material layer can include a second material that is different from the first material. The alternating stack is herein referred to as a first alternating stack. In one embodiment, the first material layers and the second material layers can be first insulating layers 132 and first sacrificial material layers 142, respectively. In one embodiment, each first insulating layer 132 can include a first insulating material, and each first sacrificial material layer 142 can include a first sacrificial material. An alternating plurality of first insulating layers 132 and first sacrificial material layers 142 is formed over the semiconductor substrate layer 10, which is a portion of a substrate. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first alternating stack (132, 142) can include first insulating layers 132 composed of the first material, and first sacrificial material layers 142 composed of the second material, which is different from the first material. The first material of the first insulating layers 132 can be at least one insulating material. Insulating materials that can be employed for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 can be silicon oxide.

The second material of the first sacrificial material layers 142 is a sacrificial material that can be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 can be subsequently replaced with electrically conductive electrodes which can function, for example, as control gate electrodes of a vertical NAND device. In one embodiment, the first sacrificial material layers 142 can be material layers that comprise silicon nitride.

In one embodiment, the first insulating layers 132 can include silicon oxide, and sacrificial material layers can include silicon nitride sacrificial material layers. The first material of the first insulating layers 132 can be deposited, for example, by chemical vapor deposition (CVD). For example, if silicon oxide is employed for the first insulating layers 132, tetraethylorthosilicate (TEOS) can be employed as the precursor material for the CVD process. The second material of the first sacrificial material layers 142 can be formed, for example, CVD or atomic layer deposition (ALD).

The thicknesses of the first insulating layers 132 and the first sacrificial material layers 142 can be in a range from 20 nm to 50 nm, although lesser and greater thicknesses can be employed for each first insulating layer 132 and for each first sacrificial material layer 142. The number of repetitions of the pairs of a first insulating layer 132 and a first sacrificial material layer 142 can be in a range from 2 to 1,024, and typically from 8 to 256, although a greater number of repetitions can also be employed. In one embodiment, each first sacrificial material layer 142 in the first alternating stack (132, 142) can have a uniform thickness that is substantially invariant within each respective first sacrificial material layer 142.

A first insulating cap layer 170A is sequentially formed. The first insulating cap layer 170A includes a dielectric material, which can be any dielectric material that can be employed for the first insulating layers 132. In one embodiment, the first insulating cap layer 170A includes the same dielectric material as the first insulating layers 132. The thickness of the insulating cap layer 170A can be in a range from 20 nm to 300 nm, although lesser and greater thicknesses can also be employed.

Optionally, the first insulating cap layer 170A and the first alternating stack (132, 142) can be patterned to form first stepped surfaces in a contact region (not shown). The contact region includes a first stepped area in which the first stepped surfaces are formed, and a second stepped area in which additional stepped surfaces are to be subsequently formed in a second tier structure (to be subsequently formed over a first tier structure). The first stepped surfaces can be formed, for example, by forming a mask layer with an opening therein, etching a cavity within the levels of the first insulating cap layer 170A, and iteratively expanding the etched area and vertically recessing the cavity by etching each pair of a first insulating layer 132 and a first sacrificial material layer 142 located directly underneath the bottom surface of the etched cavity within the etched area. A dielectric material can be deposited to fill the first stepped cavity to form a first retro-stepped dielectric material portion (not shown). As used herein, a "retro-stepped" element refers to an element that has stepped surfaces and a horizontal cross-sectional area that increases monotonically as a function of a vertical distance from a top surface of a substrate on which the element is present.

Figure 2:
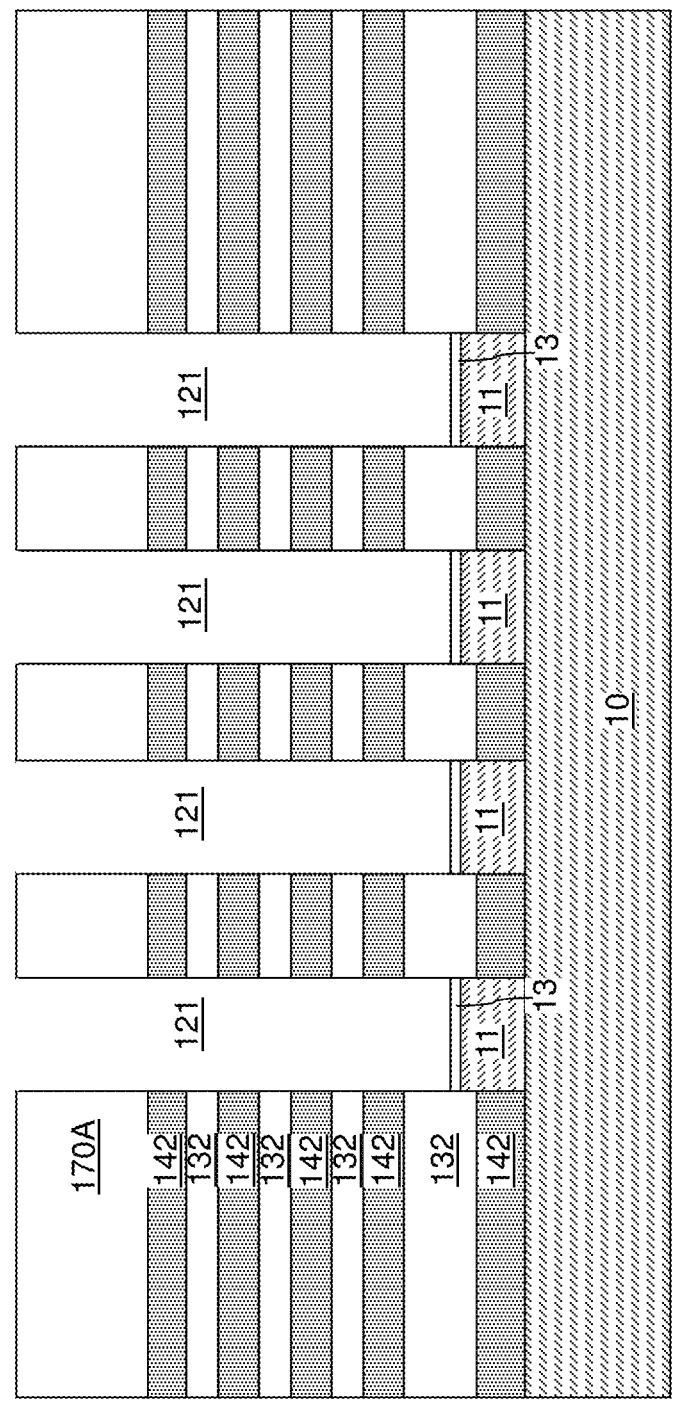
FIG. 2 is a vertical cross-sectional view of the first exemplary structure after formation of lower memory openings, optional epitaxial channel portions, and semiconductor oxide portions according to the first embodiment of the present disclosure.

Referring to FIG. 2, lower memory openings 121 extending to a top surface of the substrate 10 are formed through the first alternating stack (132, 142). The lower memory openings 121 can be formed in the device region. For example, a lithographic material stack (not shown) including at least a photoresist layer can be formed over the first insulating cap layer 170A, and can be lithographically patterned to form openings within the lithographic material stack. The pattern in the lithographic material stack can be transferred through the first insulating cap layer 170A and through the entirety of the first alternating stack (132, 142) by at least one anisotropic etch that employs the patterned lithographic material stack as an etch mask. Portions of the first insulating cap layer 170A and the first alternating stack (132, 142) underlying the openings in the patterned lithographic material stack are etched to form the lower memory openings 121. In other words, the transfer of the pattern in the patterned lithographic material stack through the first insulating cap layer 170A and the first alternating stack (132, 142) forms the lower memory openings 121.

In one embodiment, the chemistry of the anisotropic etch process employed to etch through the materials of the first alternating stack (132, 142) can alternate to optimize etching of the first and second materials in the first alternating stack (132, 142). The anisotropic etch can be, for example, a series of reactive ion etches. The sidewalls of the lower memory openings 121 can be substantially vertical, or can be tapered. Subsequently, the patterned lithographic material stack can be subsequently removed, for example, by ashing.

A selective epitaxy process can be performed to deposit a semiconductor material on physically exposed semiconductor surfaces. Specifically, epitaxial channel portions 11 can grow from the semiconductor surfaces at the bottom of the lower memory openings 121 during the selective epitaxy process. The epitaxial channel portions 11 comprise a single crystalline semiconductor material in epitaxial alignment with the single crystalline substrate semiconductor material of the substrate semiconductor layer 10.

In one embodiment, the deposited semiconductor material may be doped with in-situ doping of a p-type dopant or an n-type dopant. Thus, the epitaxial channel portions 11 can be doped with electrical dopants of a suitable conductivity type. In one embodiment, the substrate semiconductor layer 10 and the epitaxial channel portions 11 can have a doping of the first conductivity type (e.g., p-type). The epitaxial channel portions 11 may comprise silicon.

The selective epitaxy process can be performed, for example, by sequentially or simultaneously flowing a reactant gas (such as $SiH_4$, $SiH_2Cl_2$, $SiHCl_3$, $SiCl_4$, $Si_2H_6$, $GeH_4$, $Ge_2H_6$, other semiconductor precursor gases, or combinations there) with an etchant gas (such as HCl). The deposition rate of the semiconductor material on amorphous surfaces (such as the surfaces of dielectric materials) is less than the etch rate of the semiconductor material by the etchant, while the deposition rate of the semiconductor material on crystalline surfaces (such as the top surface of the substrate semiconductor layer 10) is greater than the etch rate of the semiconductor material by the etchant. Thus, the semiconductor material is deposited only on the semiconductor surface, which is the physically exposed portion of the top surface of the substrate semiconductor layer 10. The process conditions (such as the deposition temperature, the partial pressure of the various gases in a process chamber, etc.) can be selected such that the deposited semiconductor material is epitaxial, i.e., single crystalline silicon or another semiconductor material with atomic alignment with the single crystalline structure of the substrate semiconductor layer 10 (e.g., p-well). Each epitaxial channel portion 11 can be formed at a bottom portion of a respective lower memory opening 121.

Subsequently, a thermal oxidation process or a plasma oxidation process can be performed to oxidize a surface portion of each epitaxial channel portion 11, thereby converting the surface portion into a respective semiconductor oxide portion 13. The thickness of the semiconductor oxide portion 13 can be in a range from 1 nm to 10 nm, although lesser and greater thicknesses can also be employed.

Figure 3:
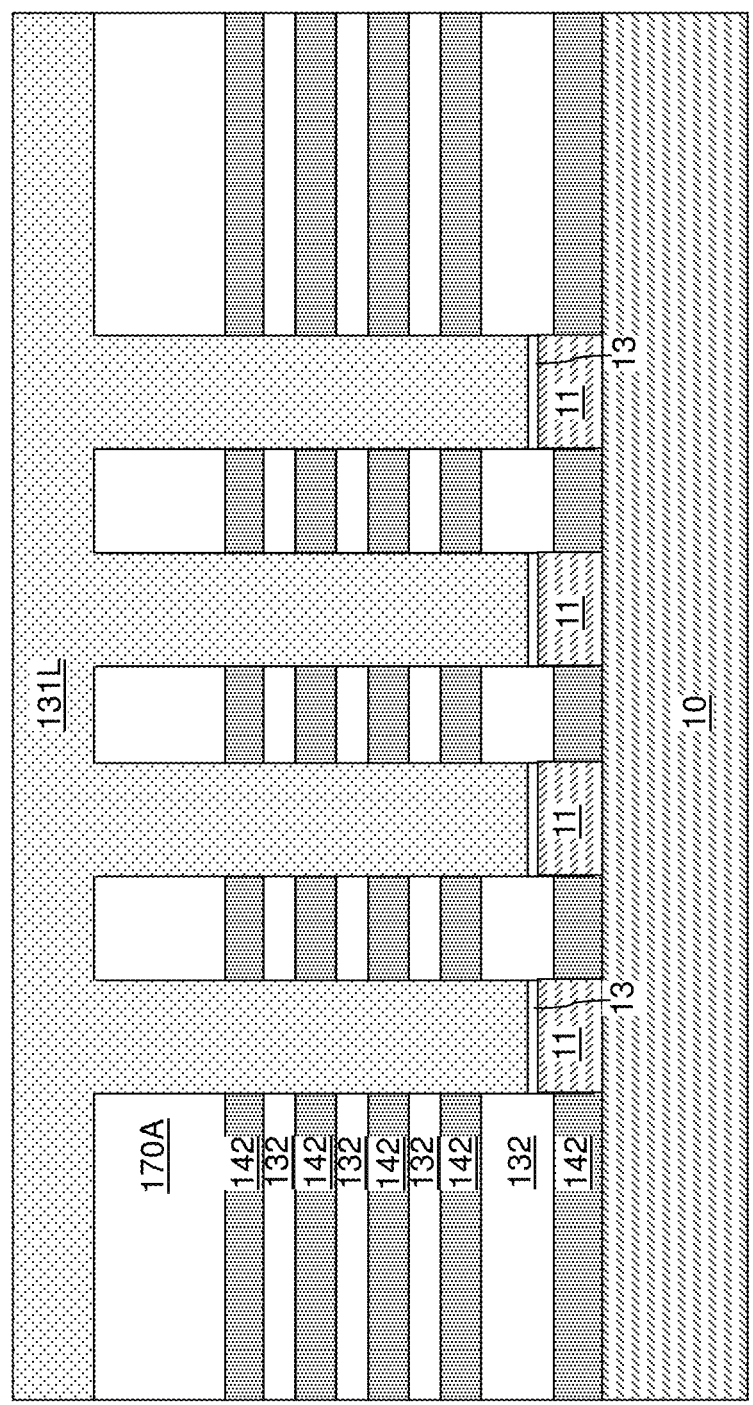
FIG. 3 is a vertical cross-sectional view of the first exemplary structure after deposition of a sacrificial fill material layer according to the first embodiment of the present disclosure.

Referring to FIG. 3, a sacrificial fill material layer 131L can be deposited over the epitaxial channel portions 11 in the lower memory openings 121. The sacrificial fill material layer 131L includes a temporary material, i.e., a sacrificial material, which is subsequently removed selective to the materials of the first insulator layers 132 and the first sacrificial material layers 142. In one embodiment, the sacrificial fill material layer 131L includes a semiconductor material such as silicon, a silicon-germanium alloy, germanium, a III-V compound semiconductor material, or a combination thereof. The sacrificial fill material layer 131L may be formed by a non-conformal deposition or a conformal deposition method. In one embodiment, a cavity may be formed inside one or more of the lower memory openings 121 in case a non-conformal deposition method is employed to form the sacrificial fill material layer 131L. In one embodiment, the sacrificial fill material layer 131L can be formed directly on the semiconductor oxide portions 13.

In one embodiment, the sacrificial fill material layer 131L can include an undoped semiconductor material. As used herein, an "undoped" semiconductor material refers to a semiconductor material that is intrinsic, or not intentionally doped, and thus, having a low dopant concentration such as less than $1.0 \times 10^{17}/cm^3$. In one embodiment, the sacrificial fill material layer 131L can be an amorphous or polycrystalline silicon layer including undoped amorphous or polycrystalline silicon.

Figure 4:
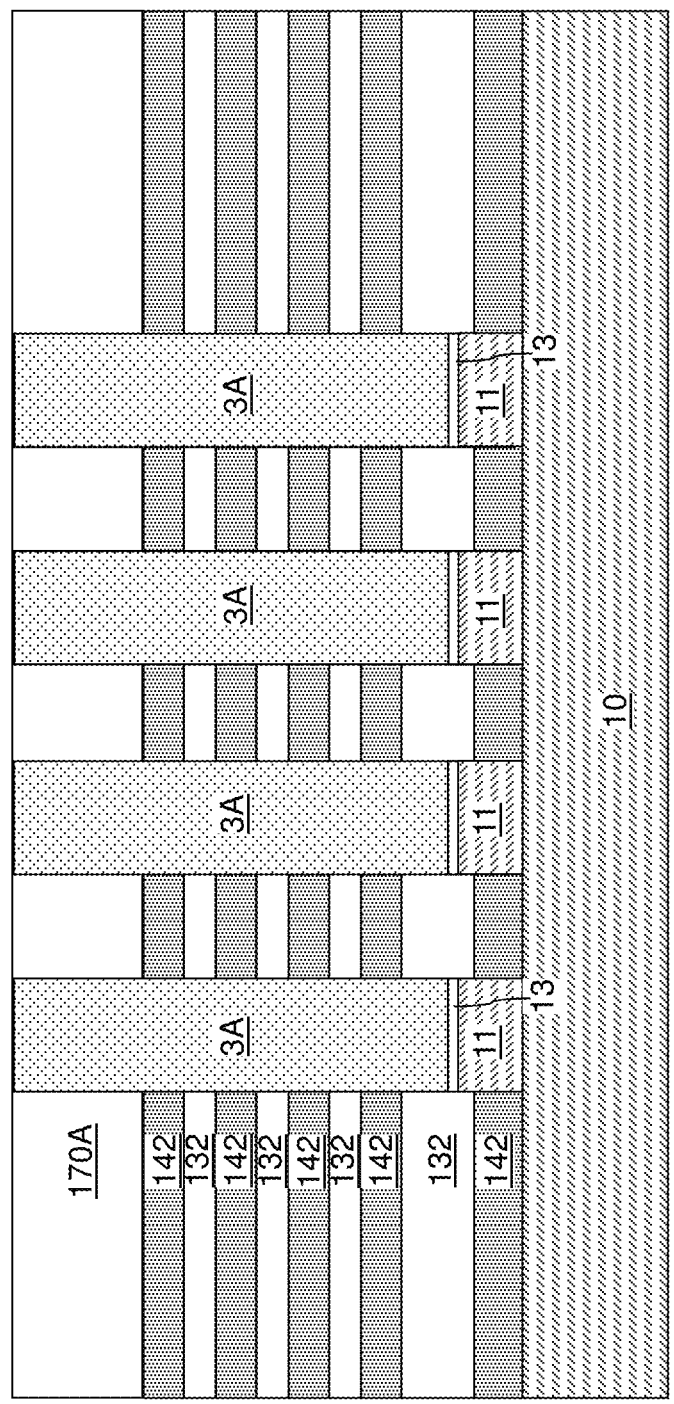
FIG. 4 is a vertical cross-sectional view of the first exemplary structure after formation of sacrificial pillar structures according to the first embodiment of the present disclosure.

Referring to FIG. 4, portions of the deposited sacrificial material can be removed from above the first insulating cap layer 170A. Specifically, the sacrificial fill material layer 131L can be recessed to a top surface of the first insulating cap layer 170A employing a planarization process. The planarization process can include a recess etch, chemical mechanical planarization (CMP), or a combination thereof. The top surface of the first insulating layer 170A can be employed as an etch stop layer or a planarization stop layer. Each remaining portion of the sacrificial material in a lower memory opening constitutes a sacrificial pillar structure 3A. The top surfaces of the sacrificial pillar structures 3A can be coplanar with the top surface of the first insulating cap layer 170A. The sacrificial pillar structures 3A may, or may not, include cavities therein.

Figure 5:
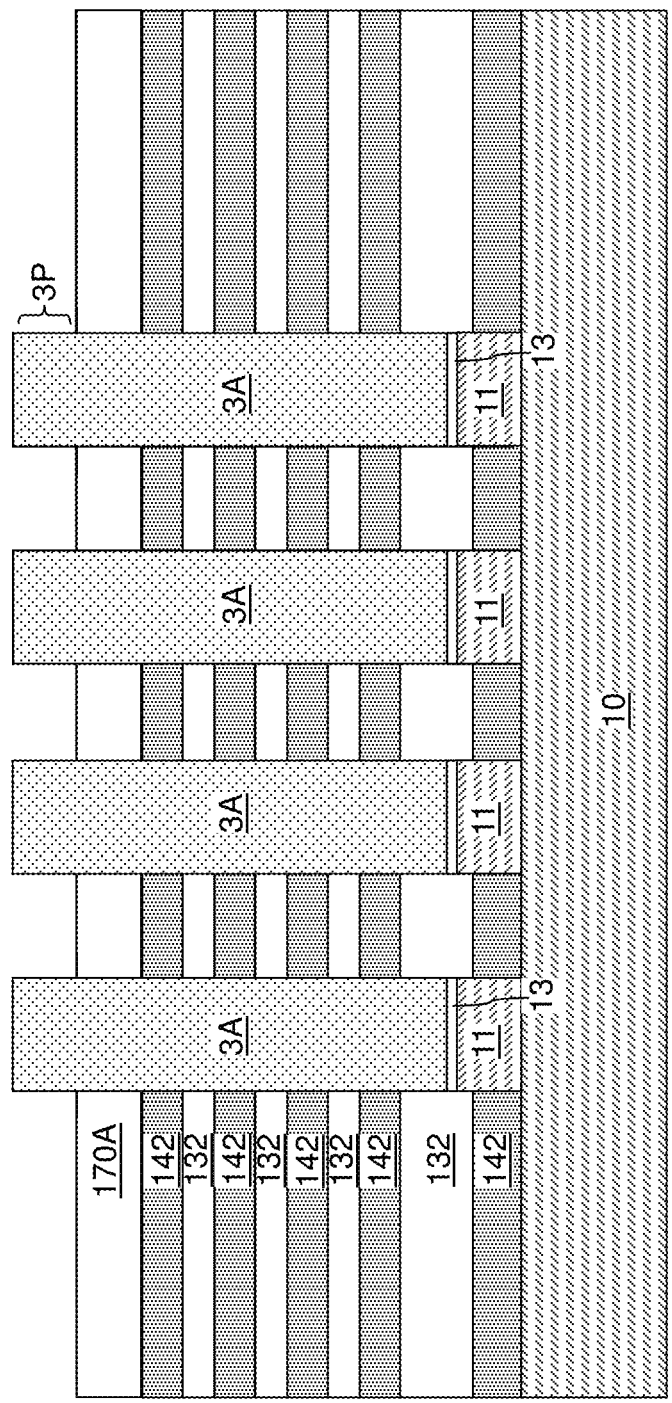
FIG. 5 is a vertical cross-sectional view of the first exemplary structure after recessing the first insulating cap layer according to the first embodiment of the present disclosure.

Referring to FIG. 5, the first insulating cap layer 170A can be recessed selective to the material of the sacrificial pillar structures 3A. The recessing of the first insulating cap layer 170A with respect to the top surfaces of the sacrificial pillar structures 3A can be performed employing a selective etch process, which can be an isotropic etch or an anisotropic etch. In an illustrative example, if the first insulating cap layer 170A includes silicon oxide and if the sacrificial pillar structures 3A include semiconductor materials, the first insulating cap layer 170A can be recessed by a wet etch employing KOH. The recess depth can be in a range from 10% to 90% of the initial thickness of the first insulating cap layer 170A, and may be in a range from 25% to 75% of the initial thickness of the first insulating cap layer 170A. The recess depth is the same as the height of the protruding portions 3P of the sacrificial pillar structures above the recessed top surface of the first insulating cap layer 170A. In an illustrative example, the recess depth can be in a range from 20 nm to 200 nm, although lesser and greater thicknesses can also be employed.

Figure 6:
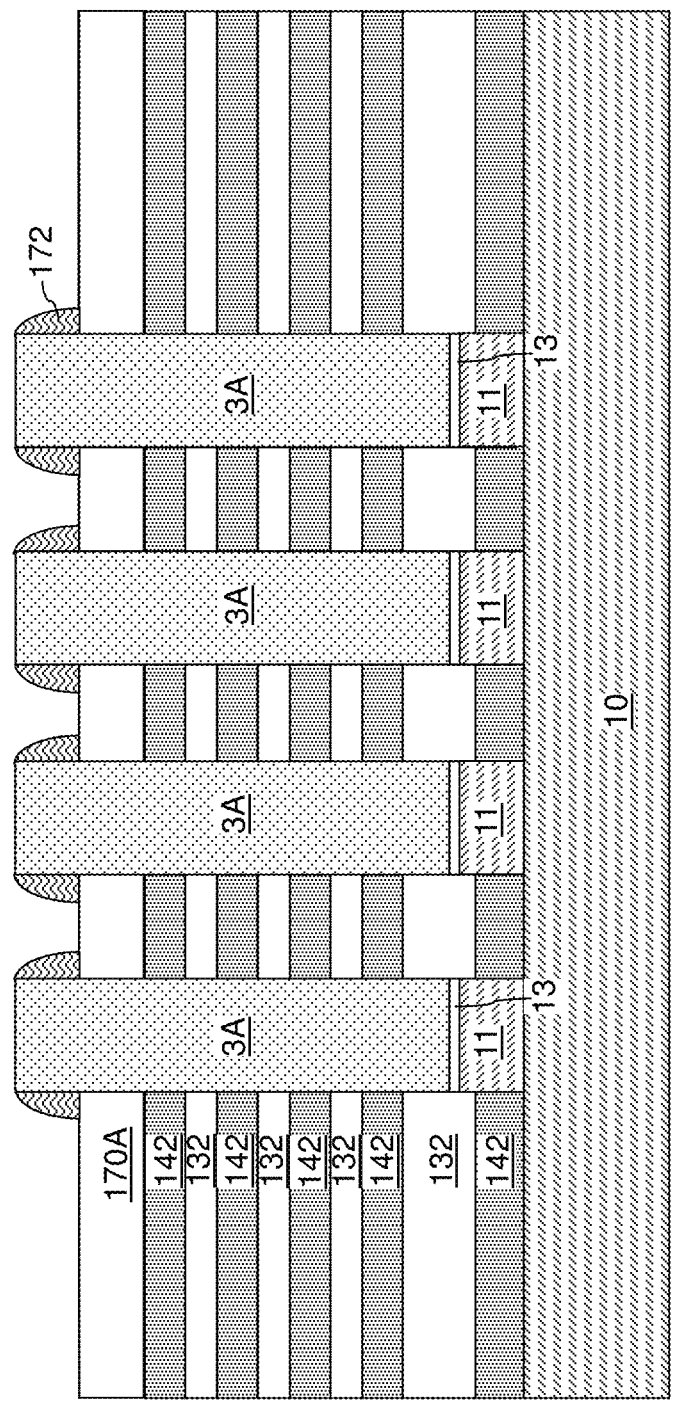
FIG. 6 is a vertical cross-sectional view of the first exemplary structure after formatting of annular spacers around protruding portions of the sacrificial pillar structures according to the first embodiment of the present disclosure.

Referring to FIG. 6, annular spacers 172 can be formed around protruding portions 3P of the sacrificial pillar structures 3A. Each annular spacer 172 can be formed on sidewalls of the protruding portion 3P of a respective sacrificial pillar structure 3A above a recessed top surface of the first insulating cap layer 170A. For example, a spacer material layer can be formed over the sacrificial pillar structures 3A and over the recessed top surface of the first insulating cap layer and around the protruding portion of the sacrificial pillar structures 3A. The spacer material layer includes a material that is different from the material of the sacrificial pillar structures 3A. In one embodiment, the sacrificial material layer includes a semiconductor material that is different from the material of the sacrificial pillar structures 3A. In one embodiment, the sacrificial pillar structures 3A include undoped amorphous or polycrystalline silicon, and the spacer material layer includes a heavily doped semiconductor material (such as heavily doped silicon, such as heavily doped amorphous or polycrystalline silicon). As used herein, a "heavily doped" semiconductor material refers to a semiconductor material that is doped with p-type dopants or n-type dopants at a dopant concentration greater than $1.0 \times 10^{18}/cm^3$, such as $1.0 \times 10^{19}/cm^3$ to $1.0 \times 10^{22}/cm^3$, including $1.0 \times 10^{20}/cm^3$ to $1.0 \times 10^{21}/cm^3$. In one embodiment, the spacer material layer can be a conformal material layer having a uniform thickness in a range from 20 nm to 100 nm, although lesser and greater thicknesses can also be employed.

The spacer material layer can be anisotropically etched using any suitable sidewall spacer anisotropic etch to remove horizontal portions of the spacer material layer from above the top surfaces of the sacrificial pillar structures 3A and from portions of the recessed top surface of the first insulating cap layer 170A that are spaced from the sidewalls of the sacrificial pillar structures 3A by more than the thickness of the spacer material layer. Each remaining annular portion of the spacer material layer constitutes an annular spacer 172. The lateral thickness of each annular spacer 172, as measured at the bottom portion thereof between the outer sidewall and a most proximate portion of the inner sidewall, can be substantially the same as the initial thickness of the sacrificial material layer.

Figure 7:
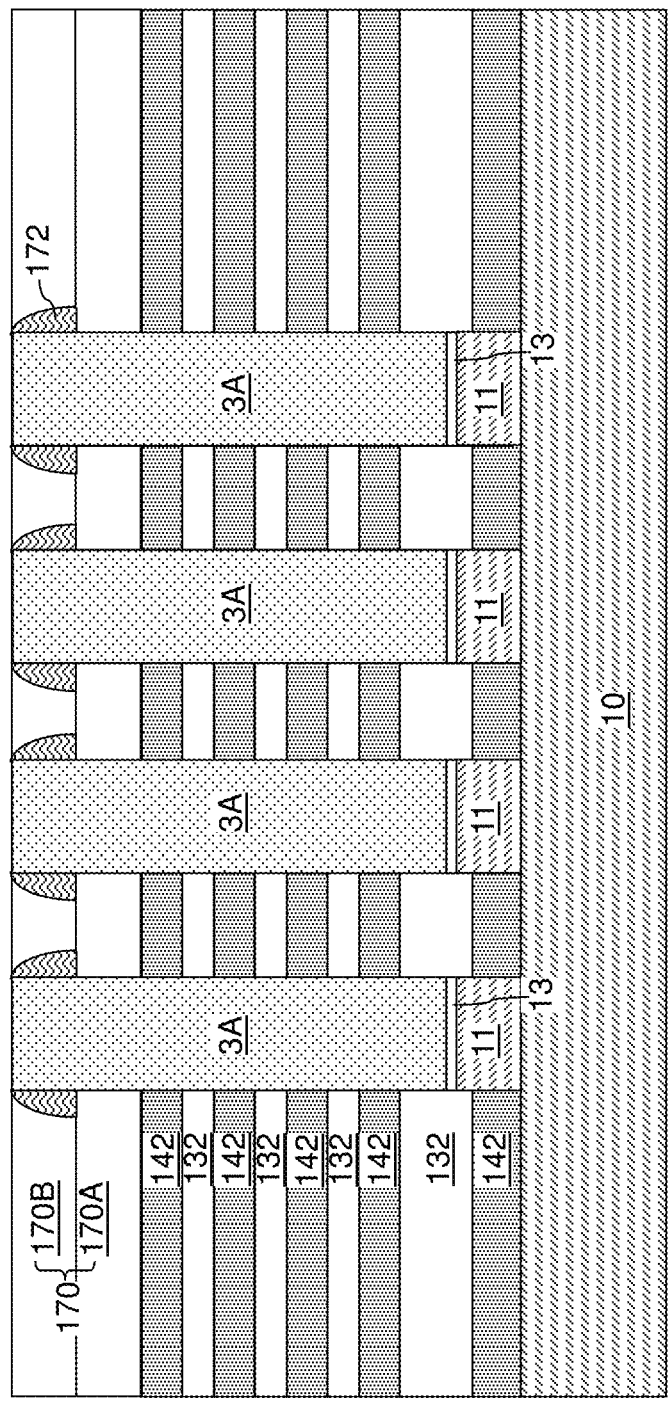
FIG. 7 is a vertical cross-sectional view of the first exemplary structure after deposition and planarization of a second insulating cap layer according to the first embodiment of the present disclosure.

Referring to FIG. 7, a second insulating cap layer 170B can be deposited over the annular spacers 172, the sacrificial pillar structures 3A, and the physically exposed surfaces of the first insulating cap layer 170A. The second insulating cap layer 170B includes a dielectric material that can be subsequently planarized. For example, the second insulating cap layer 170B can include doped silicate glass, undoped silicate glass (e.g., silicon oxide deposited by CVD using a TEOS source), or organosilicate glass. The second insulating cap layer 170B can be formed employing chemical vapor deposition (CVD) or spin-on coating.

Subsequently, the second insulating cap layer 170B can be planarized to remove portions above a horizontal plane including the top surfaces of the sacrificial pillar structures 3A. The planarization of the second insulating cap layer 170B can be performed, for example, by chemical mechanical planarization employing the sacrificial pillar structures 3A as stopping structures. In one embodiment, a planarized top surface of the second insulating cap layer 170B can be within a same horizontal plane as the topmost surfaces of each annular spacer 172. The first insulating cap layer 172A and the second insulating cap layer 172B are collectively referred to a first insulating tier cap layer 170. The first alternating stack (132, 142), the first insulating tier cap layer 170, and elements embedded in the first alternating stack (132, 142) (e.g., elements 3A and 172) collectively constitute a first tier structure (132, 142, 170, 3A).

Figure 8:
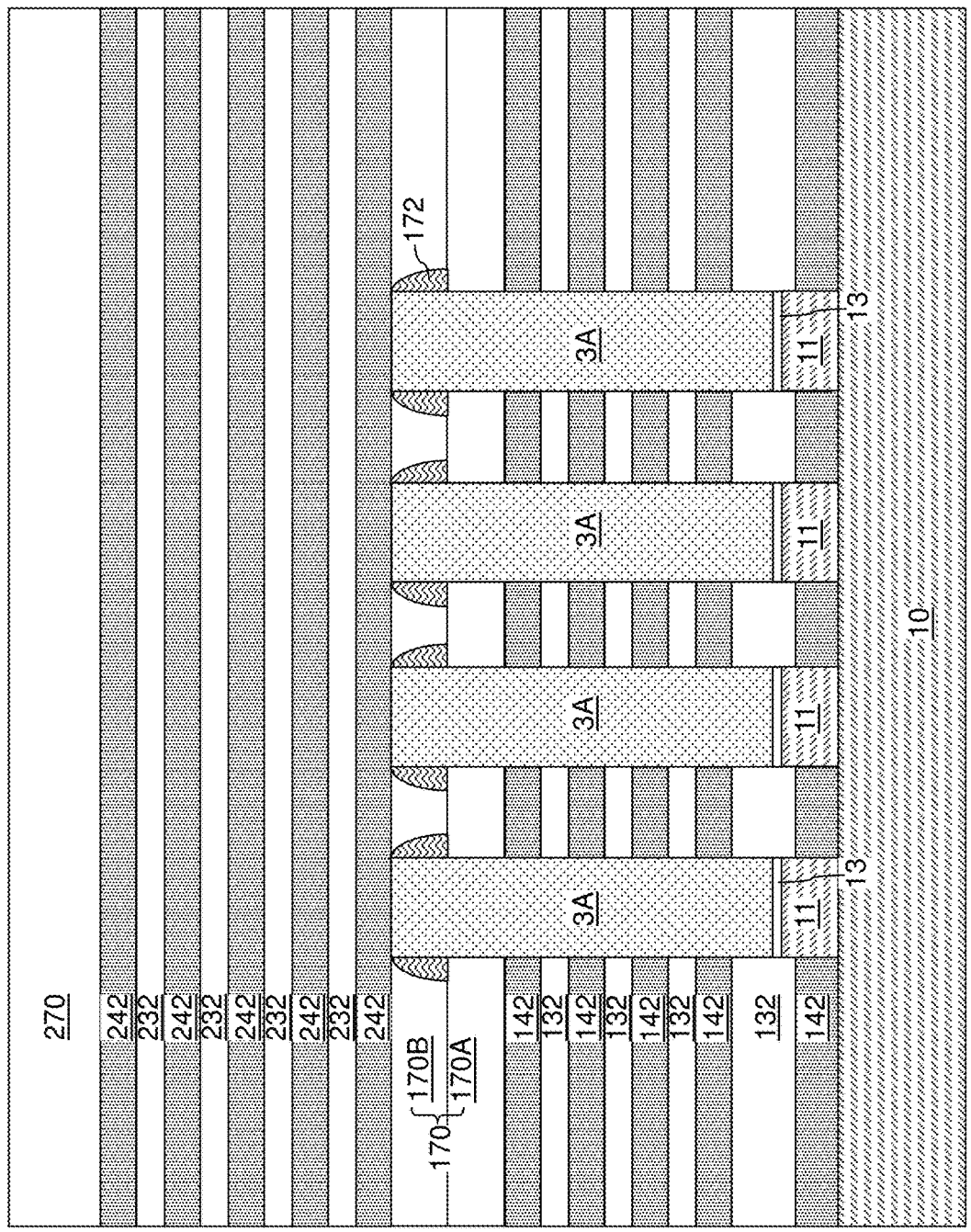
FIG. 8 is a vertical cross-sectional view of the first exemplary structure after formation of a second alternating stack of second insulating layers and second sacrificial material layers according to the first embodiment of the present disclosure.

Referring to FIG. 8, a second tier structure can be formed over the first tier structure (132, 142, 170, 3A). The second tier structure can include an additional alternating stack of insulating layers and spacer material layers, which can be sacrificial material layers. For example, a second alternating stack (232, 242) of material layers can be subsequently formed on the top surface of the first alternating stack (132, 142). The second stack (232, 242) includes an alternating plurality of third material layers and fourth material layers. Each third material layer can include a third material, and each fourth material layer can include a fourth material that is different from the third material. In one embodiment, the third material can be the same as the first material of the first insulating layer 132, and the fourth material can be the same as the second material of the first sacrificial material layers 142.

In one embodiment, the third material layers can be second insulating layers 232 and the fourth material layers can be second spacer material layers that provide vertical spacing between each vertically neighboring pair of the second insulating layers 232. In one embodiment, the third material layers and the fourth material layers can be second insulating layers 232 and second sacrificial material layers 242, respectively. The third material of the second insulating layers 232 may be at least one insulating material. The fourth material of the second sacrificial material layers 242 may be a sacrificial material that can be removed selective to the third material of the second insulating layers 232. The second sacrificial material layers 242 may comprise an insulating material, a semiconductor material, or a conductive material. The fourth material of the second sacrificial material layers 242 can be subsequently replaced with electrically conductive electrodes which can function, for example, as control gate electrodes of a vertical NAND device.

In one embodiment, each second insulating layer 232 can include a second insulating material, and each second sacrificial material layer 242 can include a second sacrificial material. In this case, the second stack (232, 242) can include an alternating plurality of second insulating layers 232 and second sacrificial material layers 242. The third material of the second insulating layers 232 can be deposited, for example, by chemical vapor deposition (CVD). The fourth material of the second sacrificial material layers 242 can be formed, for example, CVD or atomic layer deposition (ALD).

The third material of the second insulating layers 232 can be at least one insulating material. Insulating materials that can be employed for the second insulating layers 232 can be any material that can be employed for the first insulating layers 132. The fourth material of the second sacrificial material layers 242 is a sacrificial material that can be removed selective to the third material of the second insulating layers 232. Sacrificial materials that can be employed for the second sacrificial material layers 242 can be any material that can be employed for the first sacrificial material layers 142. In one embodiment, the second insulating material can be the same as the first insulating material, and the second sacrificial material can be the same as the first sacrificial material.

The thicknesses of the second insulating layers 232 and the second sacrificial material layers 242 can be in a range from 20 nm to 50 nm, although lesser and greater thicknesses can be employed for each second insulating layer 232 and for each second sacrificial material layer 242. The number of repetitions of the pairs of a second insulating layer 232 and a second sacrificial material layer 242 can be in a range from 2 to 1,024, and typically from 8 to 256, although a greater number of repetitions can also be employed. In one embodiment, each second sacrificial material layer 242 in the second stack (232, 242) can have a uniform thickness that is substantially invariant within each respective second sacrificial material layer 242.

A second insulating tier cap layer 270 can be subsequently formed over the second stack (232, 242). The second insulating tier cap layer 270 includes a dielectric material that is different from the material of the second sacrificial material layers 242. In one embodiment, the insulating cap layer 70 can include silicon oxide. In one embodiment, the first and second sacrificial material layers (142, 242) can comprise silicon nitride. Optionally, second stepped surfaces (not shown) can be region in the contact region in the same manner as formation of the first stepped surfaces. A second retro-stepped dielectric material portion may be formed over the second stepped surfaces.

Figure 9:
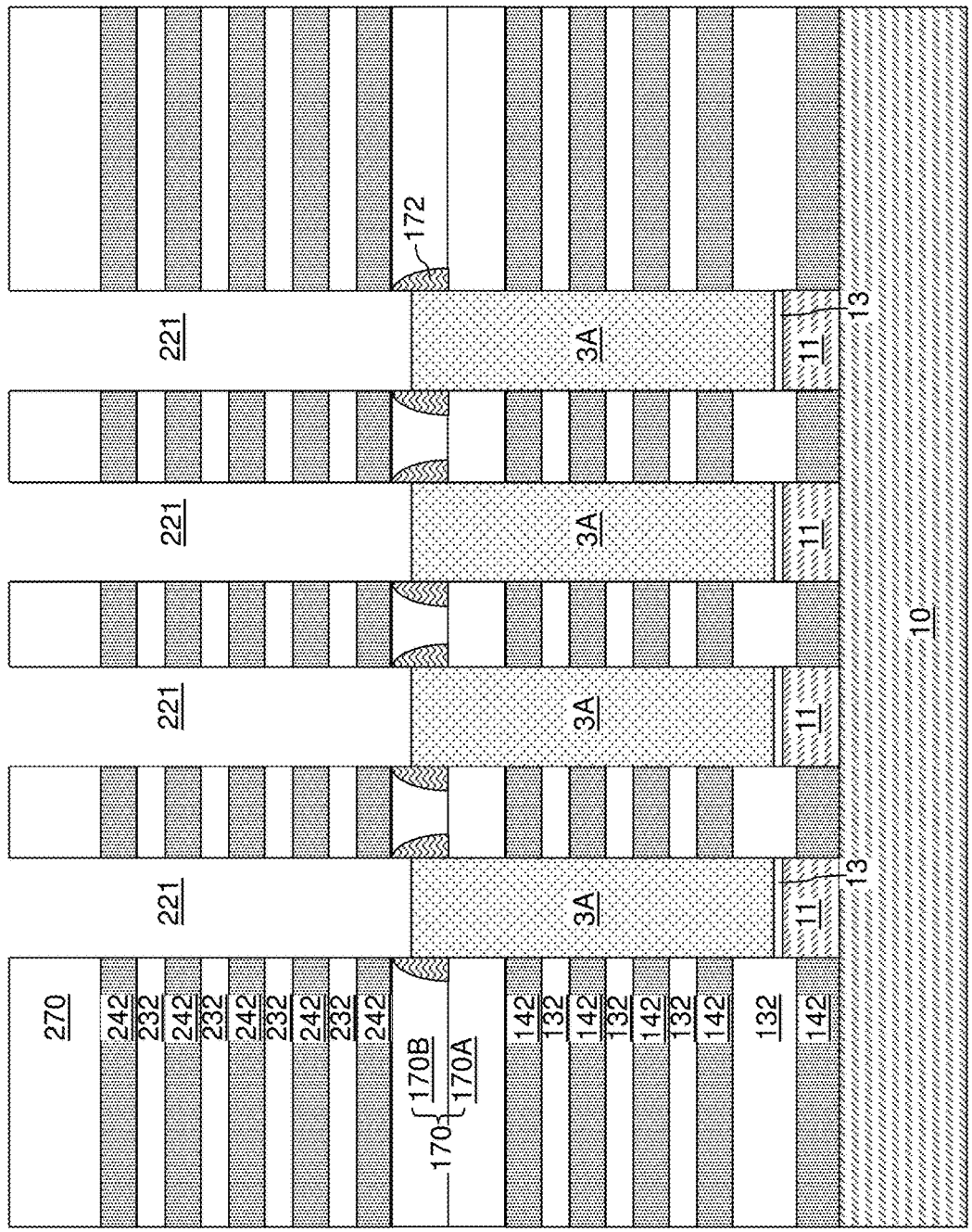
FIG. 9 is a vertical cross-sectional view of the first exemplary structure after formation of upper memory openings according to the first embodiment of the present disclosure.

Referring to FIG. 9, upper memory openings 221 can be formed through the second tier structure (232, 242, 270) in an area overlying the lower memory openings 121, i.e., in areas that substantially coincides with the areas of the lower memory openings 121. The upper memory openings 221 can be formed to the top surface of the sacrificial pillar structures 3A. For example, a lithographic material stack (not shown) including at least a photoresist layer can be formed over the second insulating tier cap layer 270 and the second tier structure (232, 242, 270), and can be lithographically patterned to form openings within the lithographic material stack. The pattern in the lithographic material stack can be transferred through the entirety of the second tier structure (232, 242, 270) by at least one anisotropic etch that employs the patterned lithographic material stack as an etch mask. Portions of the second insulating tier cap layer 270 and the second tier structure (232, 242, 270) underlying the openings in the patterned lithographic material stack are etched to form the upper memory openings 221. In other words, the transfer of the pattern in the patterned lithographic material stack through the second insulating tier cap layer 270 and the second tier structure (232, 242, 270) forms the upper memory openings 221. While not illustrated in FIG. 9, a misalignment can occur between the upper memory openings 221 and the lower memory openings 121 due to overlay variations that are inherent in lithographic alignment of a new pattern (the pattern of the openings for the upper memory openings) with a pre-existing pattern (the pattern of the sacrificial fill structures 3A).

In one embodiment, the chemistry of the anisotropic etch process employed to etch through the materials of the second stack (232, 242) can alternate to optimize etching of the third and fourth materials in the second stack (232, 242). The anisotropic etch can be, for example, a series of reactive ion etches. The sidewalls of the upper memory openings 221 can be substantially vertical, or can be tapered. In one embodiment, the sacrificial pillar structures 3A may be employed as stopping structures for the anisotropic etch process that forms the upper memory openings 221. An overetch into upper portions of the sacrificial pillar structures 3A can occur during the anisotropic etch. In other words, the upper memory openings 221 can be formed employing an anisotropic etch process that stops at a height between a first horizontal plane including topmost surfaces of the annular spacers 172 and a second horizontal plane including bottom surfaces of the annular spacers 172.

Figure 10:
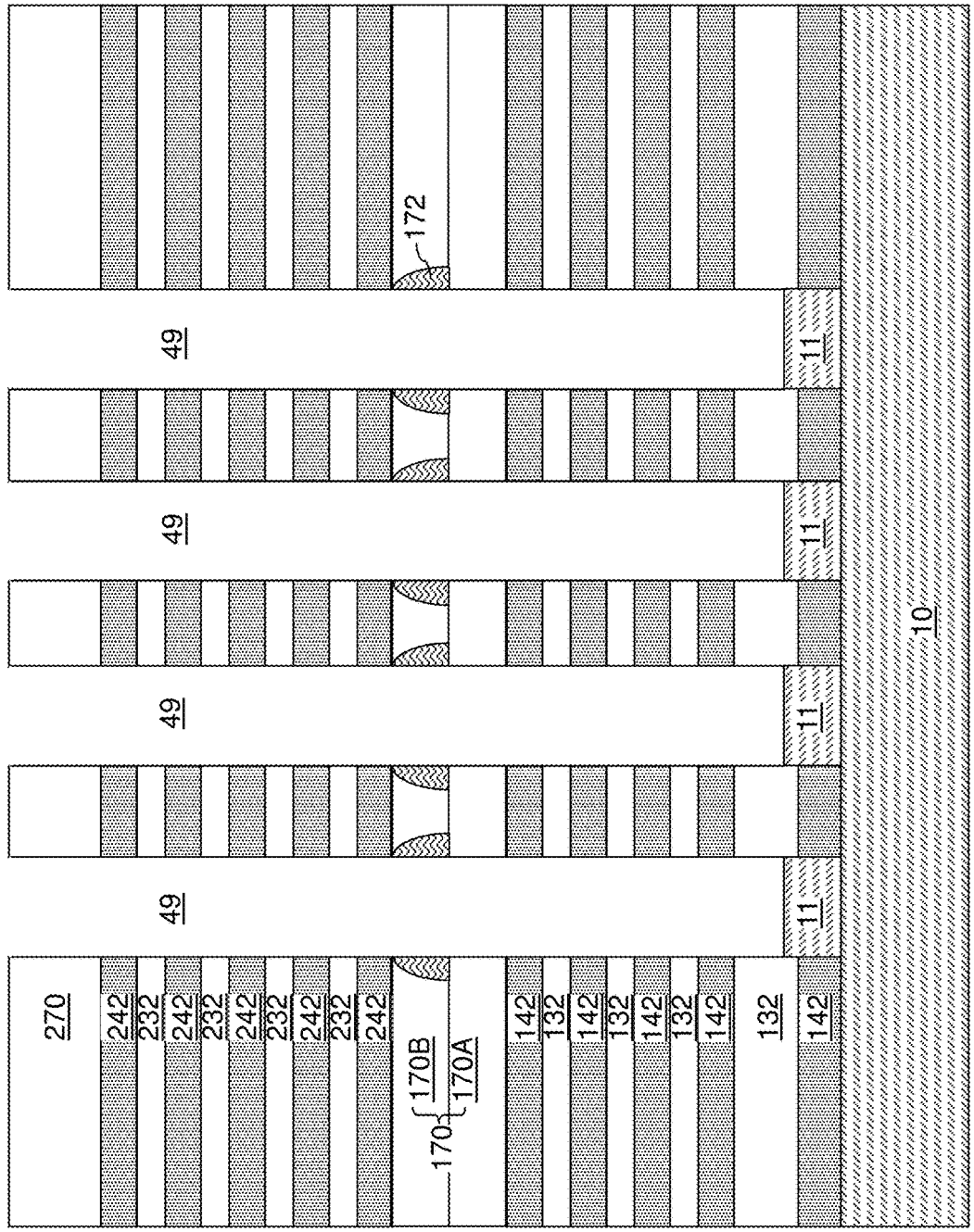
FIG. 10 is a vertical cross-sectional view of the first exemplary structure after removal of the sacrificial pillar structures to form memory openings according to the first embodiment of the present disclosure.

Referring to FIG. 10, the sacrificial pillar structures 3A can be removed selective to the materials of the annular spacers 172, the first and second insulating tier cap layers (170, 270), the lower and second tier structures (132, 142, 232, 242), and the semiconductor oxide portions 13. In case the sacrificial pillar structures 3A comprise an undoped semiconductor material (such as undoped amorphous silicon or polycrystalline silicon), an etch chemistry that removes the undoped semiconductor material selective to dielectric materials and to the material of the annular spacers 172 can be employed. If the annular spacers 172 includes heavily doped semiconductor material (such as heavily doped amorphous or polycrystalline silicon), a wet etch employing hot trimethyl-2 hydroxyethyl ammonium hydroxide ("hot TMY") can be employed. A plurality of memory openings 49 can be formed through the first and second tier structures (132, 142, 232, 242, 170, 270).

In one embodiment, removal of the sacrificial pillar structures 3A can be performed selective to the annular spacers 172 such that the spacers 172 are substantially retained employing an etch chemistry that provides differential etch rates that depend on the concentration of electrical dopants (e.g., which etches the pillar structures 3A at a rate that is at least 50 times greater, such as 100 to 150 times greater, than the spacers 172). In one embodiment, the sacrificial pillar structures 3A can include a first semiconductor material that does not include electrical dopants or includes electrical dopants at an atomic concentration less than $1.0 \times 10^{17}/cm^3$, and the annular spacers 172 can include a second semiconductor material that includes electrical dopants at an atomic concentration greater than $1.0 \times 10^{18}/cm^3$. In one embodiment, the sacrificial pillar structures 3A can include amorphous or polycrystalline silicon that does not include electrical dopants or includes electrical dopants at an atomic concentration less than $1.0 \times 10^{17}/cm^3$, the annular spacers 172 can include amorphous or polycrystalline silicon that includes electrical dopants at an atomic concentration greater than $1.0 \times 10^{18}/cm^3$, and removal of the sacrificial pillar structures 3A selective to the annular spacers 172 can be performed employing hot trimethyl-2 hydroxyethyl ammonium hydroxide.

Subsequently, semiconductor oxide portions 13 may be optionally removed to physically expose the top surfaces of the epitaxial channel portions 11. In one embodiment, the semiconductor oxide portions 13 can be removed by a wet etch employing hydrofluoric acid. In another embodiment, the semiconductor oxide portions are not removed.

Figure 11:
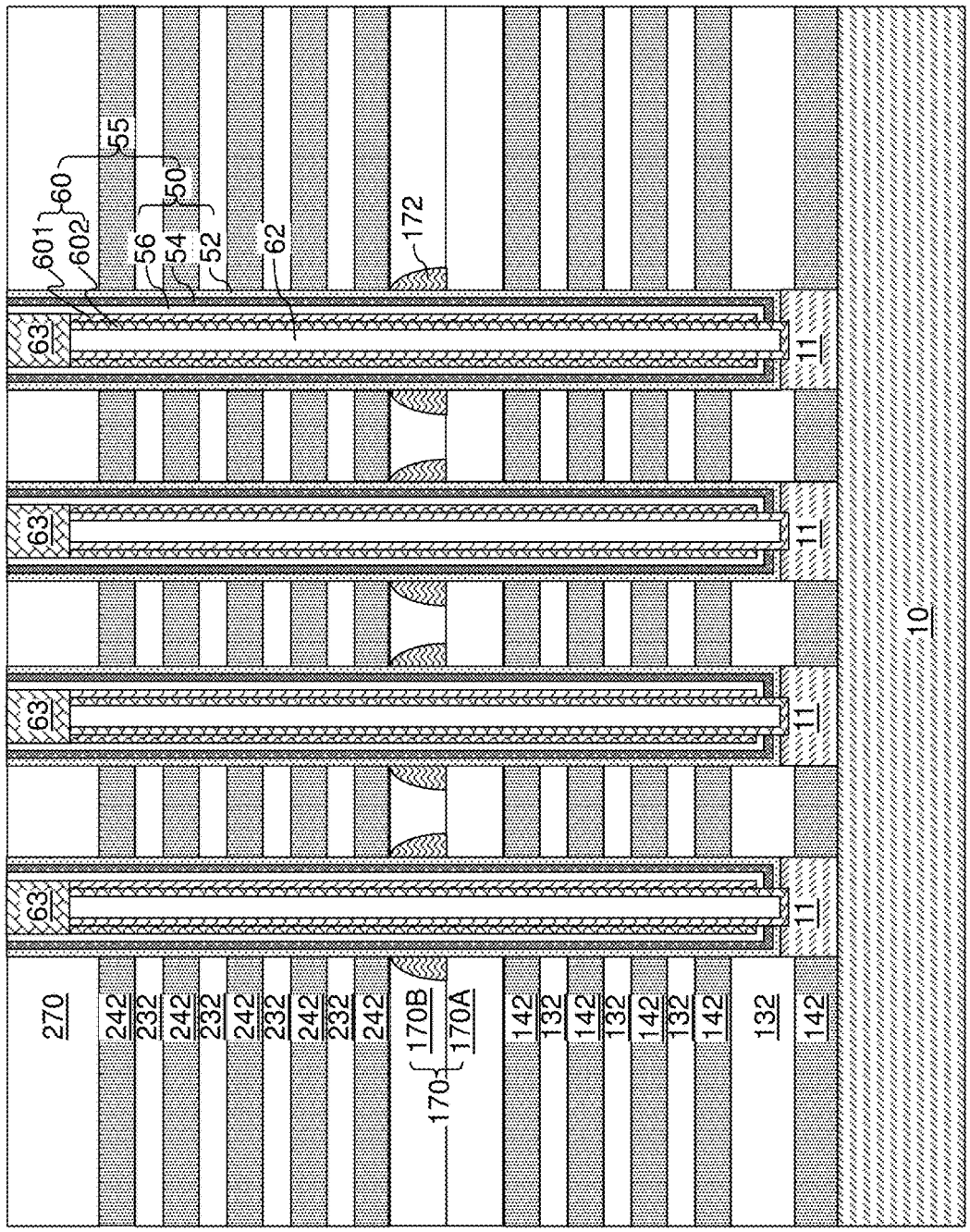
FIG. 11 is a vertical cross-sectional view of the first exemplary structure after formation of memory stack structures, dielectric cores, and drain regions according to the first embodiment of the present disclosure.

Referring to FIG. 11, memory stack structures 55 can be formed in the memory openings 49. In an illustrative example, each memory stack structure 55 can include a memory film 50 and a vertical semiconductor channel 60. In one embodiment, each memory film 50 can include a blocking dielectric layer 52, a memory material layer 54, and a tunneling dielectric layer 56. In one embodiment, each vertical semiconductor channel 60 can include a first semiconductor channel 601 and a second semiconductor channel 602.

The blocking dielectric layer 52 includes a blocking dielectric layer material such as silicon oxide, a dielectric metal oxide (such as aluminum oxide), or a combination thereof. Alternatively, the blocking dielectric layer 52 may be omitted during this processing step and instead be formed through backside recesses as will be described in more detail below. In one embodiment, the memory material layer 54 can be a charge trapping material including a dielectric charge trapping material, which can be, for example, silicon nitride.

The memory material layer 54 can be formed as a single memory material layer of homogeneous composition, or can include a stack of multiple memory material layers. The multiple memory material layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the memory material layer 54 may comprise an insulating charge trapping material, such as one or more silicon nitride segments. Alternatively, the memory material layer 54 may comprise conductive nanoparticles such as metal nanoparticles, which can be, for example, ruthenium nanoparticles. The memory material layer 54 can be formed, for example, by chemical vapor deposition (CVD), atomic layer deposition (ALD), physical vapor deposition (PVD), or any suitable deposition technique for storing electrical charges therein. The thickness of the memory material layer 54 can be in a range from 2 nm to 20 nm, although lesser and greater thicknesses can also be employed. Each portion of the memory material layer 54 located at the levels of the electrically conductive layers (146, 246).

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. The thickness of the tunneling dielectric layer 56 can be in a range from 2 nm to 20 nm, although lesser and greater thicknesses can also be employed.

A first semiconductor channel layer can be deposited over the memory films 50 by a conformal deposition method such as low pressure chemical vapor deposition (LPCVD). The thickness of the first semiconductor channel layer can be in a range from 2 nm to 10 nm, although lesser and greater thicknesses can also be employed. The first semiconductor channel layer and the memory films 50 can be anisotropically etched to remove horizontal portions thereof. A horizontal bottom portion of each memory film 50 can be removed from the bottom of each memory opening. Each remaining portion of the first semiconductor channel layer constitutes a first semiconductor channel 601. The first semiconductor channels can include a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channels 601 can include amorphous silicon or polysilicon. The memory film 50 and the first semiconductor channel 601 are anisotropically etched to remove the memory film 50 and the first semiconductor channel 601 (and layer 13 if present) at the bottom of the memory opening 49 to expose the structures 11, while leaving the memory film 50 and the first semiconductor channel 601 on the sidewalls of the memory opening 49.

A second semiconductor channel layer can be deposited on the first semiconductor channels 601 (i.e., the remaining vertical portions of the first semiconductor channel layer) and on top surface of the epitaxial channel portions 11 (or of the substrate semiconductor layer 10 in case the epitaxial channel portions 11 are not present). The second semiconductor channel layer includes a semiconductor material, which can be any semiconductor material that can be employed for the first semiconductor channel layer. The first and second semiconductor channel layers can have a doping of the first conductivity type (i.e., the same conductivity type as the substrate semiconductor layer 10) or can be substantially intrinsic, i.e., having a dopant concentration that does not exceed $1.0 \times 10^{17}/cm^3$. In one embodiment, the second semiconductor channel layer can include amorphous silicon or polysilicon. The thickness of the second semiconductor channel layer can be in a range from 2 nm to 10 nm, although lesser and greater thicknesses can also be employed.

A dielectric material can be deposited in cavities surrounded by the second semiconductor channel layer, and subsequently recessed below the top surface of the second dielectric tier cap layer 270. Each remaining portion of the dielectric material in the memory openings constitutes a dielectric core 62. A doped semiconductor material having a second conductivity type (which is the opposite of the first conductivity type) can be deposited over the dielectric cores 62 and within the cavities in the memory openings to form drain regions 63. The doped semiconductor material can be, for example, doped polysilicon. Excess portions of the deposited semiconductor material can be removed from above the top surface of the second insulating tier cap layer 270, for example, by chemical mechanical planarization (CMP) or a recess etch to form the drain region 63. Each remaining portion of the second semiconductor channel layer constitutes a second semiconductor channel 602. A combination of a first semiconductor channel 601 and a second semiconductor channel 602 inside a memory opening constitutes a vertical semiconductor channel 60.

Each memory film 50 can include a blocking dielectric layer 52 contacting a sidewall of the memory opening, a plurality of charge storage regions (embodied as portions of a memory material layer 54 at each level of the sacrificial material layers (142, 242)) located on an inner sidewall of the blocking dielectric layer 52, and a tunneling dielectric layer 56 located inside the plurality of charge storage regions.

Figure 12A:
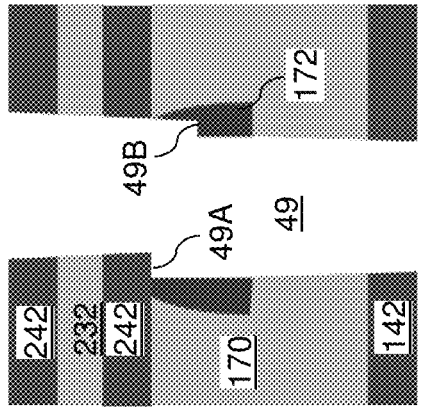
FIG. 12A-12D are sequential vertical cross-sectional views of a joint region during formation of an upper memory opening, removal of an underlying sacrificial pillar structure, and formation of a memory stack structure and a dielectric core according to the first embodiment of the present disclosure.

FIGS. 12A-12D illustrate a joint region between the first tier structure (132, 142, 170) and the second tier structure (232, 242, 270) during formation of an upper memory opening 221 (corresponding to the processing steps of FIG. 9), removal of an underlying sacrificial pillar structure 3A (corresponding to the processing steps of FIG. 10), and formation of a memory stack structure 55 and a dielectric core 62 (corresponding to the processing steps of FIG. 11), respectively. While FIGS. 9-11 illustrate a configuration in which the overlay variation between the sacrificial pillar structure 3A and the upper memory opening 221 is zero, overlay variations that are inherent in the lithographic process that provides the pattern for the upper memory openings 221 with respect to the underlying pattern of the sacrificial pillar structures 3A can cause the lateral offset between an underlying sacrificial pillar structure 3A and an overlying upper memory opening 221 as illustrated in FIG. 12A. In other words, sidewalls of the underlying sacrificial pillar structure 3A can be laterally offset with respect to sidewalls of the upper memory opening 221 that is formed through the second alternating stack (w32, 242). In this case, a first side of the annular spacer 172 can be partly etched during an anisotropic etch that forms the upper memory opening 221, and a second side of the annular spacer 172 that faces the first side may not be etched during the anisotropic etch.

Figure 12B:
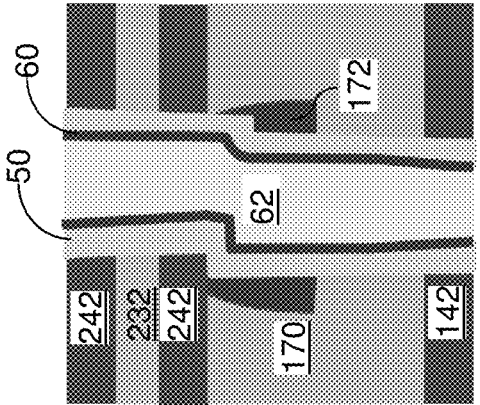

Referring to FIG. 12B, the processing steps of FIG. 10 can be performed to form a memory opening 49 that extends through the first tier structure (132, 142, 170) and the second tier structure (232, 242, 270). The memory opening 49 has first horizontal ledge 49A at an interface between the insulating tier cap layer 170 and the second alternating stack (232, 242), and a second horizontal ledge 49B that contacts a horizontal surface of the annular spacer 172 between a top surface of the annular spacer 172 and a bottom surface of the annular spacer 172.

Figure 12C:
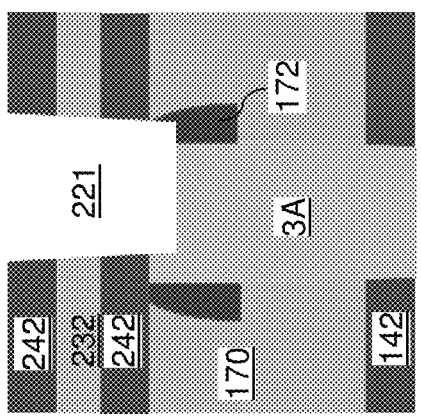
Figure 12D:
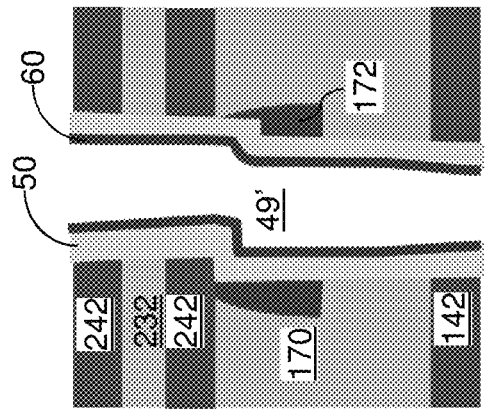

Referring to FIGS. 12C and 12D, the processing steps of FIG. 11 can be performed to form a memory film 50, a vertical semiconductor channel 60, and a dielectric core 62. In the first exemplary structure illustrated in FIGS. 11 and 12D, the memory film 50 is formed inside a remaining portion of the annular spacer 172 within each memory opening 49.

Figure 13:
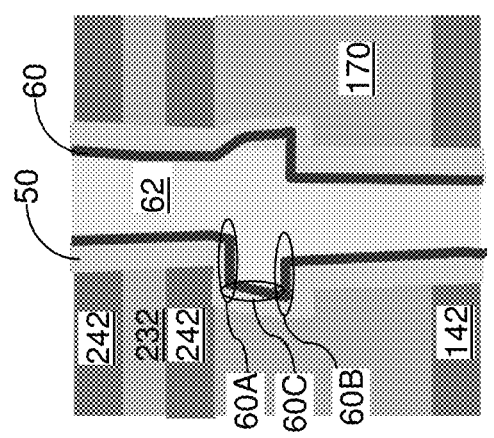
FIG. 13 is a vertical cross-sectional view of a reference structure for comparison with the first exemplary structure according to the first embodiment of the present disclosure.

Referring to FIG. 13, a reference structure is illustrated for comparison with the first exemplary structure of embodiments of the present disclosure. The reference structure can be derived from the first exemplary structure of FIG. 12A by removing the annular spacers 172 concurrently with removal of the sacrificial pillar structure 3A. In that case, substantially horizontal portions (60A, 60B) of the semiconductor channel 60 can face each other in the memory opening. Portions 60A, 60B are connected by a substantially vertical portion 60C which together form a convex portion of the semiconductor channel 60 which bows in an outward direction from the dielectric fill 62. The convex portion (60A, 60B, 60C) increases the channel 60 resistance, decreases cell current and increases electric field concentration. By not removing the annular spacer 172 and depositing the memory film 50 on the inner sidewalls of the annular spacer 172 in each memory opening 49, as shown in FIG. 12D, decreases the channel 60 resistance, increases cell current and decreases electric field concentration.

Figure 14:
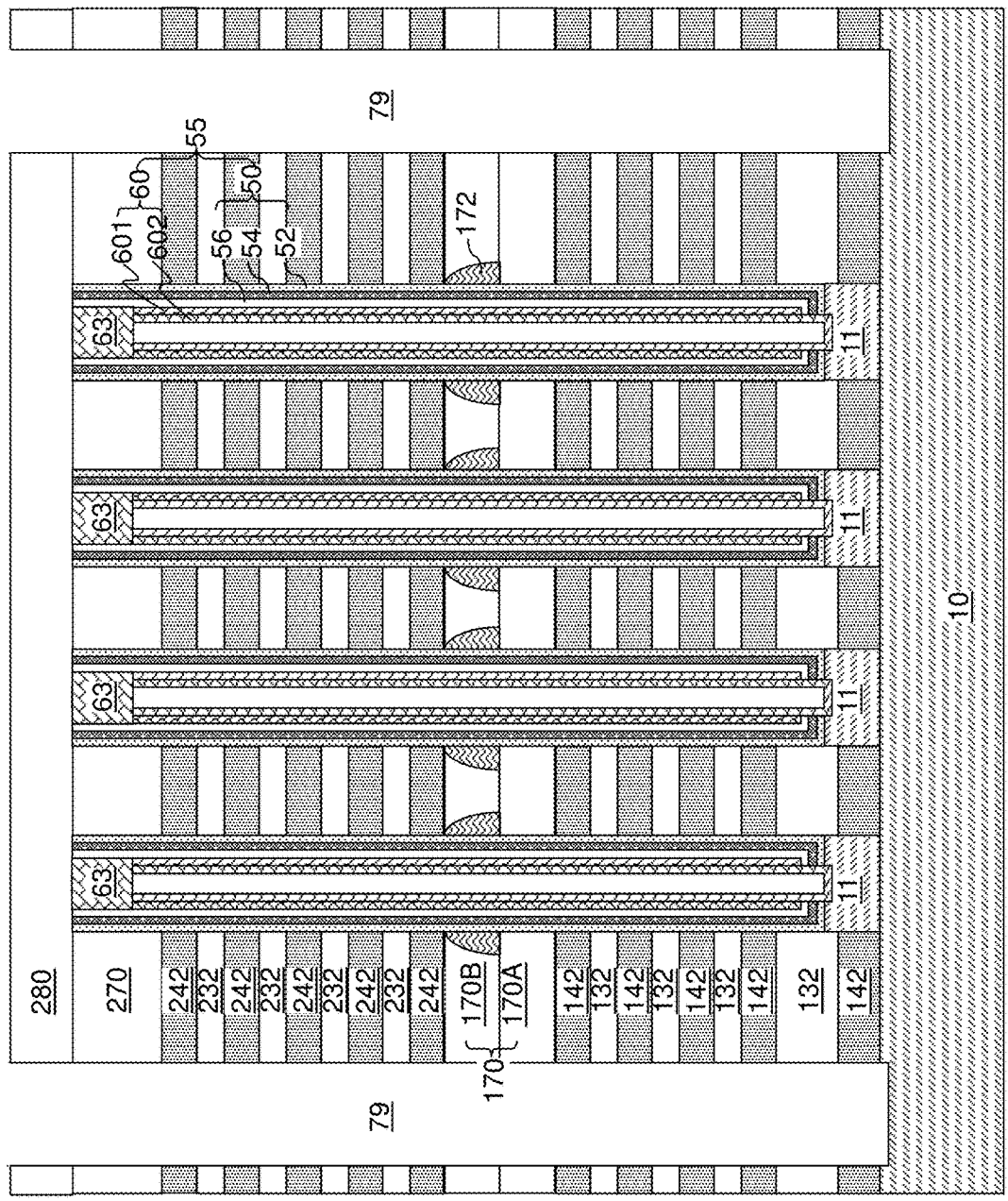
FIG. 14 is a vertical cross-sectional view of the first exemplary structure after formation of backside trenches according to the first embodiment of the present disclosure.

Referring to FIG. 14, a planarization material layer 280 can be formed over the second insulating tier cap layer 270. The planarization material layer 280 may be selected as an in-process structure that is consumed during subsequent planarization processes. In one embodiment, the planarization material layer 280 can include a silicon oxide material deposited by chemical vapor deposition such as tetraethylorthosilicate (TEOS) silicon oxide. The thickness of the planarization material layer 280 can be in a range from 50 nm to 300 nm, although lesser and greater thicknesses can also be employed.

At least one backside trench 79 can be formed through the upper and first tier structures, for example, by applying a photoresist layer (not shown), lithographically patterning the photoresist layer, and transferring the pattern in the photoresist layer through the upper and first tier structures employing an anisotropic etch. The anisotropic etch that forms the at least one backside trench 79 can stop on the substrate 10. The photoresist layer can be subsequently removed, for example, by ashing.

Figure 15:
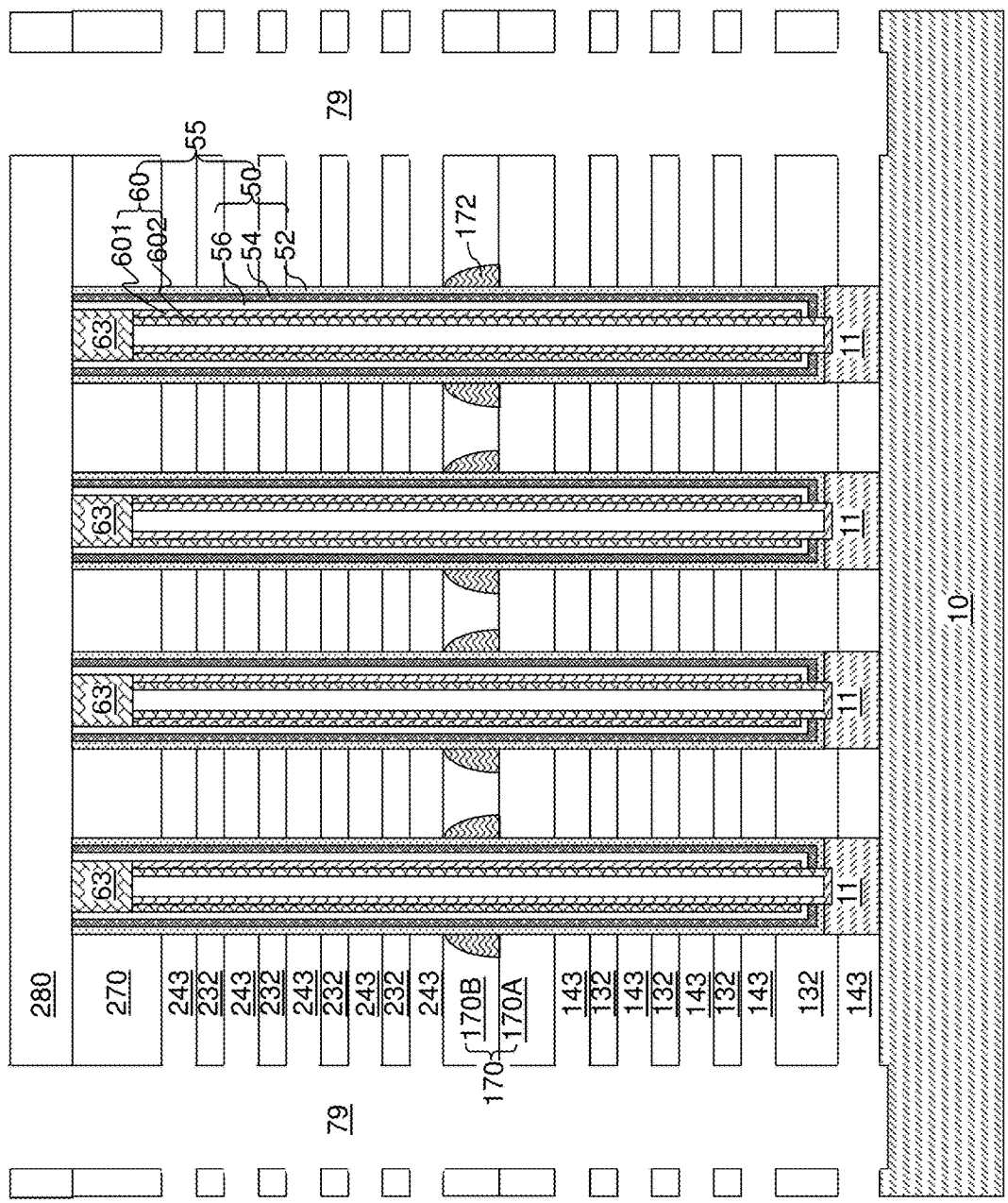
FIG. 15 is a vertical cross-sectional view of the first exemplary structure after formation of backside recesses by removal of the sacrificial material layers according to the first embodiment of the present disclosure.

Referring to FIG. 15, an etchant that selectively etches the materials of the first and second sacrificial material layers (142, 242) with respect to the materials of the first and second insulating layers (132, 232), the material of the dielectric oxide layer 51L, and the first and second insulating cap layers (170, 270) can be introduced into the backside trench 79, for example, employing an isotropic etch process. First backside recesses 143 are formed in volumes from which the first sacrificial material layers 142 are removed. Second backside recesses 243 are formed in volumes from which the second sacrificial material layers 242 are removed. The removal of the materials of the first and second sacrificial material layers (142, 242) can be selective to the materials of the first and second insulating layers (132, 232), and the material of the dielectric oxide layer 51L. In one embodiment, the first and second sacrificial material layers (142, 242) can include silicon nitride, and the materials of the first and second insulating layers (132, 232), can be silicon oxide. In another embodiment, the first and second sacrificial material layers (142, 242) can include a semiconductor material such as germanium or a silicon-germanium alloy, and the materials of the first and second insulating layers (132, 232) can be selected from silicon oxide and silicon nitride.

The isotropic etch process can be a wet etch process employing a wet etch solution, or can be a gas phase (dry) etch process in which the etchant is introduced in a vapor phase into the backside trench 79. For example, if the first and second sacrificial material layers (142, 242) include silicon nitride, the etch process can be a wet etch process in which the first exemplary structure is immersed within a wet etch tank including phosphoric acid, which etches silicon nitride selective to silicon oxide, silicon, and various other materials employed in the art.

Each of the first and second backside recesses (143, 243) can be a laterally extending cavity having a lateral dimension that is greater than the vertical extent of the cavity. In other words, the lateral dimension of each of the first and second backside recesses (143, 243) can be greater than the height of the respective backside recess (143, 243). A plurality of first backside recesses 143 can be formed in the volumes from which the material of the first sacrificial material layers 142 is removed. A plurality of second backside recesses 243 can be formed in the volumes from which the material of the second sacrificial material layers 242 is removed. Each of the first and second backside recesses (143, 243) can extend substantially parallel to the top surface of the substrate 10. A backside recess (143, 243) can be vertically bounded by a top surface of an underlying insulating layer (132 or 232) and a bottom surface of an overlying insulating layer (132 or 232). In one embodiment, each of the first and second backside recesses (143, 243) can have a uniform height throughout.

In one embodiment, a sidewall surface of each epitaxial channel portion 11 and a top surface of a semiconductor material layer in the substrate (i.e., the substrate semiconductor layer 10) can be physically exposed below the bottommost first backside recess 143 after removal of the first and second sacrificial material layers (142, 242).

Figure 16:
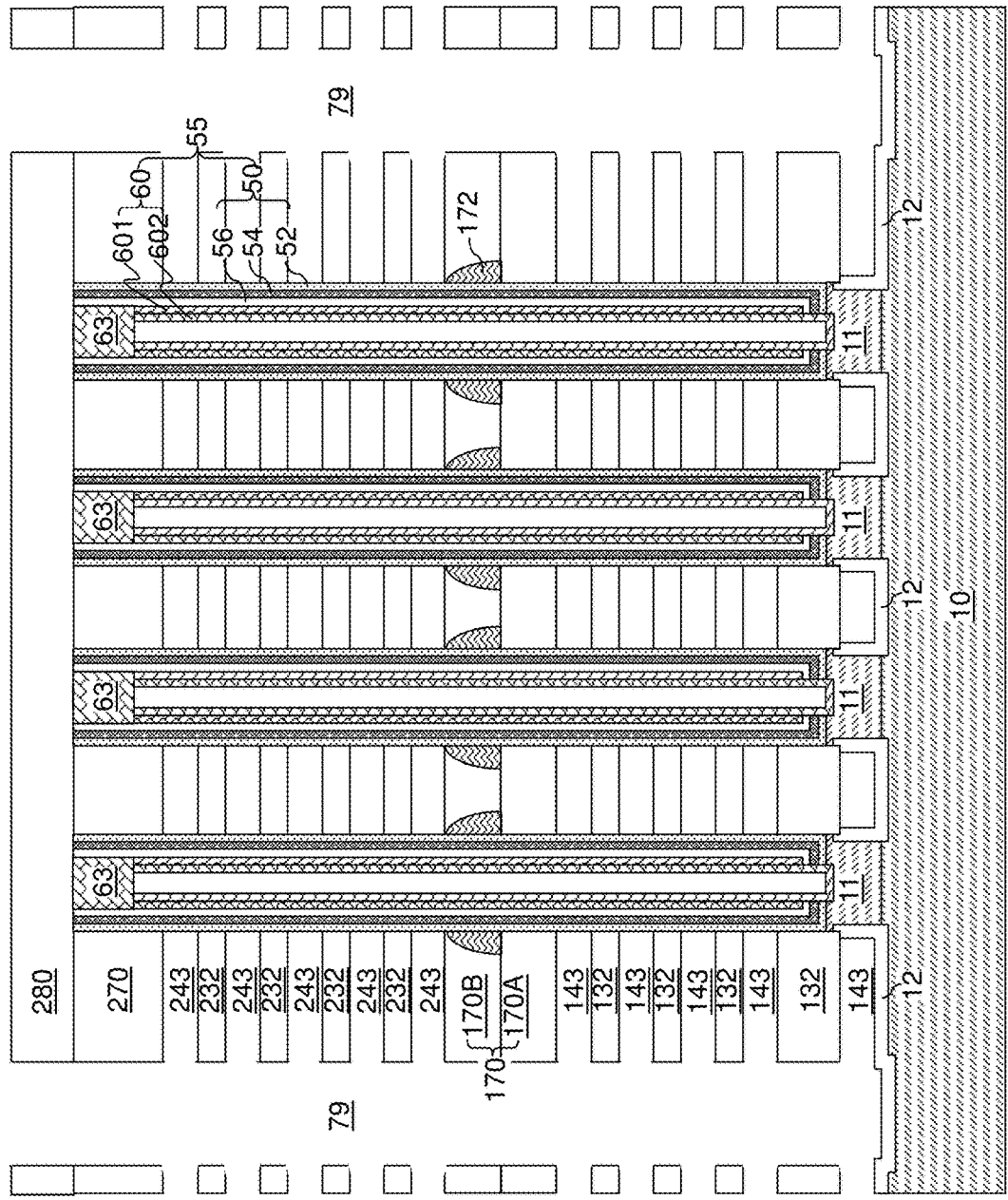
FIG. 16 is a vertical cross-sectional view of the first exemplary structure after formation of a gate dielectric layer according to the first embodiment of the present disclosure.

Referring to FIG. 16, a gate dielectric layer 12 can be formed by converting surface portions of the epitaxial channel portions 11 and the semiconductor material layer (the substrate semiconductor layer 10) into a continuous dielectric material layer. In one embodiment, the gate dielectric layer 12 can be formed by thermal conversion of the surface portions of the epitaxial channel portions 11 and the substrate semiconductor layer 10. In one embodiment, the thermal conversion process can include a thermal oxidation process and/or a thermal nitridation process. In one embodiment, the gate dielectric layer 12 can include a thermal oxide of the semiconductor material of the substrate semiconductor layer 10. The gate dielectric layer 12 can be formed as a single continuous layer.

Figure 17:
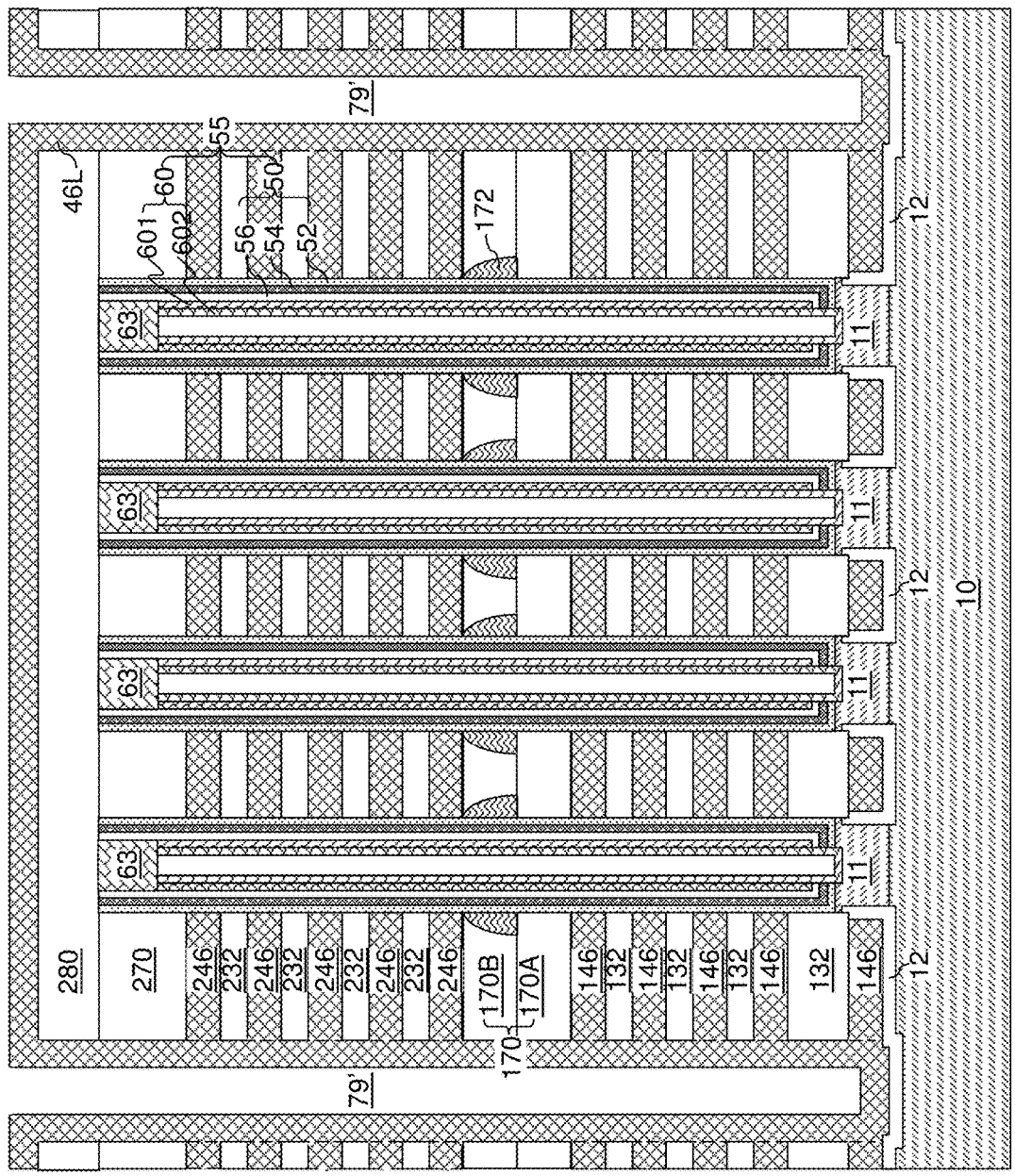
FIG. 17 is a vertical cross-sectional view of the first exemplary structure after formation of electrically conductive layers according to the first embodiment of the present disclosure.

Referring to FIG. 17, a backside blocking dielectric layer (not shown) can be optionally deposited in the backside recesses (143, 243) and the backside trenches 79 and over the planarization dielectric layer 280. The backside blocking dielectric layer can be deposited on the physically exposed portions of the outer surfaces of the memory stack structures 55. The backside blocking dielectric layer includes a dielectric material such as a dielectric metal oxide, silicon oxide, or a combination thereof. If employed, the backside blocking dielectric layer can be formed by a conformal deposition process such as atomic layer deposition or chemical vapor deposition. The thickness of the backside blocking dielectric layer can be in a range from 1 nm to 60 nm, although lesser and greater thicknesses can also be employed.

At least one conductive material can be deposited in the plurality of backside recesses (143, 243), on the sidewalls of the backside trench 79, and over the planarization dielectric layer 280. The at least one conductive material can include at least one metallic material, i.e., an electrically conductive material that includes at least one metallic element.

A plurality of first electrically conductive layers 146 can be formed in the plurality of first backside recesses 143, a plurality of second electrically conductive layers 246 can be formed in the plurality of second backside recesses 243, and a continuous metallic material layer 46L can be formed on the sidewalls of each backside trench 79 and over the planarization dielectric layer 280. In embodiments in which the first spacer material layers and the second spacer material layers are provided as first sacrificial material layers 142 and second sacrificial material layers 242, the first and second sacrificial material layers (142, 242) can be replaced with the first and second conductive material layers (146, 246), respectively. Specifically, each first sacrificial material layer 142 can be replaced with a portion of the backside blocking dielectric layer and a first electrically conductive layer 146, and each second sacrificial material layer 242 can be replaced with a portion of the backside blocking dielectric layer and a second electrically conductive layer 246. A backside cavity is present in the portion of each backside trench 79 that is not filled with the continuous metallic material layer 46L.

The metallic material can be deposited by a conformal deposition method, which can be, for example, chemical vapor deposition (CVD), atomic layer deposition (ALD), electroless plating, electroplating, or a combination thereof. The metallic material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary metallic materials that can be deposited in the backside recesses (143, 243) include tungsten, tungsten nitride, titanium, titanium nitride, tantalum, tantalum nitride, cobalt, and ruthenium. In one embodiment, the metallic material can comprise a metal such as tungsten and/or metal nitride. In one embodiment, the metallic material for filling the backside recesses (143, 243) can be a combination of titanium nitride layer and a tungsten fill material. In one embodiment, the metallic material can be deposited by chemical vapor deposition or atomic layer deposition.

Figure 18:
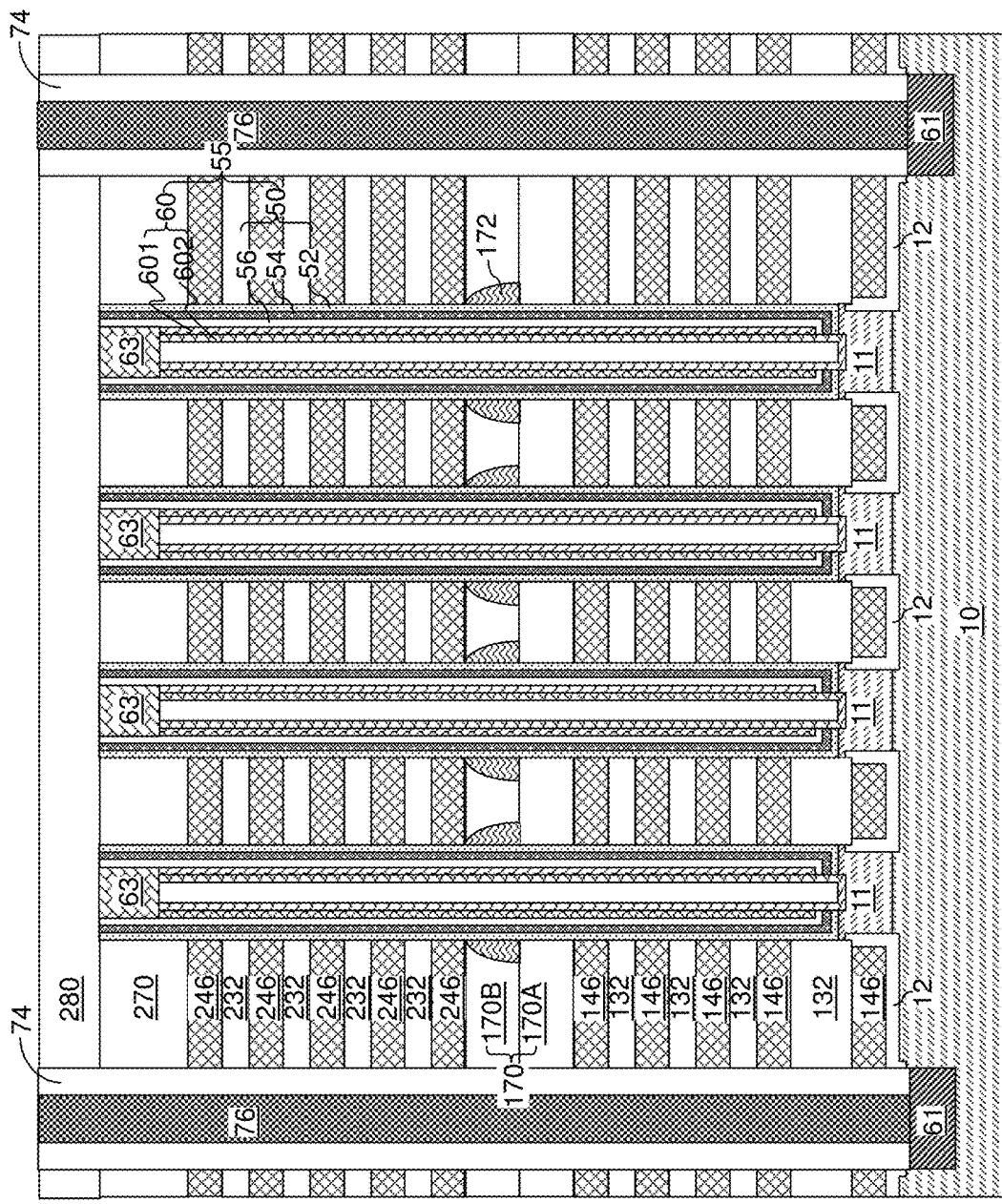
FIG. 18 is a vertical cross-sectional view of the first exemplary structure after removal of residual materials from the backside trenches, formation of source regions, and formation of insulating spacers and backside contact structures according to the first embodiment of the present disclosure.

Referring to FIG. 18, residual material can be removed from each backside trench 79. Specifically, the deposited metallic material of the continuous metallic material layer 46L can be etched back from the sidewalls of each backside trench 79 and from above the planarization dielectric layer 280, for example, by an isotropic etch. Each remaining portion of the deposited metallic material in the first backside recesses 143 constitutes a first electrically conductive layer 146. Each remaining portion of the deposited metallic material in the second backside recesses 243 constitutes a second electrically conductive layer 246. Each electrically conductive layer (146, 246) can be a conductive line structure.

Each electrically conductive layer (146, 246) except the bottommost electrically conductive layer (i.e., the bottommost first electrically conductive layer 146) can function as a combination of a plurality of control gate electrodes located at a same level and a word line electrically interconnecting, i.e., electrically shorting, the plurality of control gate electrodes located at the same level. The control gate electrodes within each electrically conductive layer (146, 246) are the control gate electrodes for a vertical memory device including the memory stack structure 55.

The bottommost first electrically conductive layer 146 can be a source select gate electrode located over the gate dielectric layer 12, which can control activation of a horizontal channel portion of a semiconductor channel that extends between a source region 61 (which is previously formed or which will be subsequently formed underneath each backside trench 79) and drain regions 63. In one embodiment, the backside blocking dielectric layer may be present as a single continuous material layer. In another embodiment, the vertical portions of the backside blocking dielectric layer may be removed from within the backside trenches 79, and the backside blocking dielectric layer can have a plurality of physically disjoined backside blocking dielectric layer portions that are located at each level of the electrically conductive layers (146, 246).

Dopants of a second conductivity type, which is the opposite of the first conductivity type of the substrate semiconductor layer 10, can be implanted into a surface portion of the substrate semiconductor layer 10 to form a source region 61 underneath the bottom surface of each backside trench 79. An insulating spacer 74 including a dielectric material can be formed at the periphery of each backside trench 79, for example, by deposition of a conformal insulating material (such as silicon oxide) and a subsequent anisotropic etch. The planarization dielectric layer 280 may be thinned due to a collateral etch during the anisotropic etch that removes the vertical portions of horizontal portions of the deposited conformal insulating material.

A backside contact via structure 76 can be formed in the remaining volume of each backside trench 79, for example, by deposition of at least one conductive material and removal of excess portions of the deposited at least one conductive material from above a horizontal plane including the top surface of the planarization dielectric layer 80 by a planarization process such as chemical mechanical planarization or a recess etch. Optionally, each backside contact via structure 76 may include multiple backside contact via portions such as a lower backside contact via portion and an upper backside contact via portion. In an illustrative example, the lower backside contact via portion can include a doped semiconductor material (such as doped polysilicon), and can be formed by depositing the doped semiconductor material layer to fill the backside trenches 79 and removing the deposited doped semiconductor material from upper portions of the backside trenches 79. The upper backside contact via portion can include at least one metallic material (such as a combination of a TiN liner and a W fill material), and can be formed by depositing the at least one metallic material above the lower backside contact via portions, and removing an excess portion of the at least one metallic material from above the horizontal plane including the top surface of the planarization dielectric layer 280. The planarization dielectric layer 280 can be thinned and removed during a latter part of the planarization process, which may employ chemical mechanical planarization (CMP), a recess etch, or a combination thereof. Each backside contact via structure 76 can be formed through the at least one tier structure (132, 146, 232, 246) and on a source region 61, which may be a source region. The top surface of each backside contact via structure 76 can be formed within the horizontal plane that includes the top surfaces of the memory stack structures 55.

Figure 19:
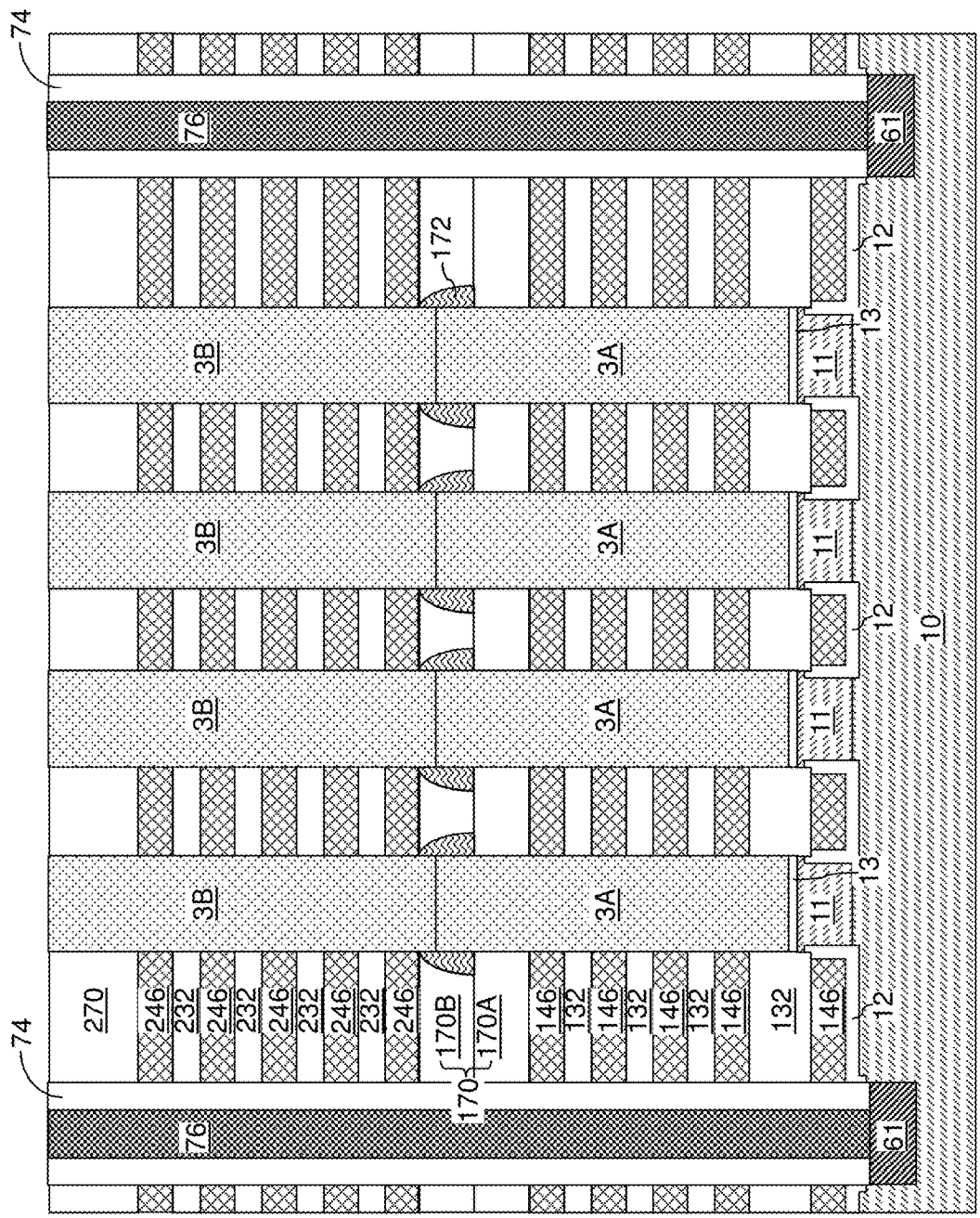
FIG. 19 is vertical cross-sectional view of an alternate embodiment of the first exemplary structure after formation of upper sacrificial pillar structures and backside contact structures according to the first embodiment of the present disclosure.

Referring to FIG. 19, an alternate embodiment of the first exemplary structure can be derived from the first exemplary structure of FIG. 9 by forming upper sacrificial pillar structures 3B in the upper memory openings 221. The sacrificial pillar structures 3A underlying the upper sacrificial pillar structures are herein referred to as lower sacrificial pillar structures. The upper sacrificial pillar structures 3B can include any material that may be employed for the lower sacrificial pillar structures 3A as described above. The upper sacrificial pillar structures 3B may include the same material as, or may include a material different from, the lower sacrificial pillar structures 3A. For example, the upper and lower sacrificial pillar structures (3A, 3B) can include polycrystalline or amorphous undoped silicon. Each adjoining pair of a lower sacrificial pillar structure 3A and an upper sacrificial pillar structure 3B constitutes a pillar structure stack (3A, 3B).

The processing steps of FIGS. 14-18 can be performed to form electrically conductive layers (146, 246), source regions 61, insulating spacers 74, and backside contact via structures 76. While the illustrated embodiment corresponds to a case in which the second insulating tier cap layer 280 is not employed or is thinned and removed, embodiments are expressly contemplated herein, in which the second insulating tier cap layer 280 is present after the processing steps of FIG. 19.

Figure 20:
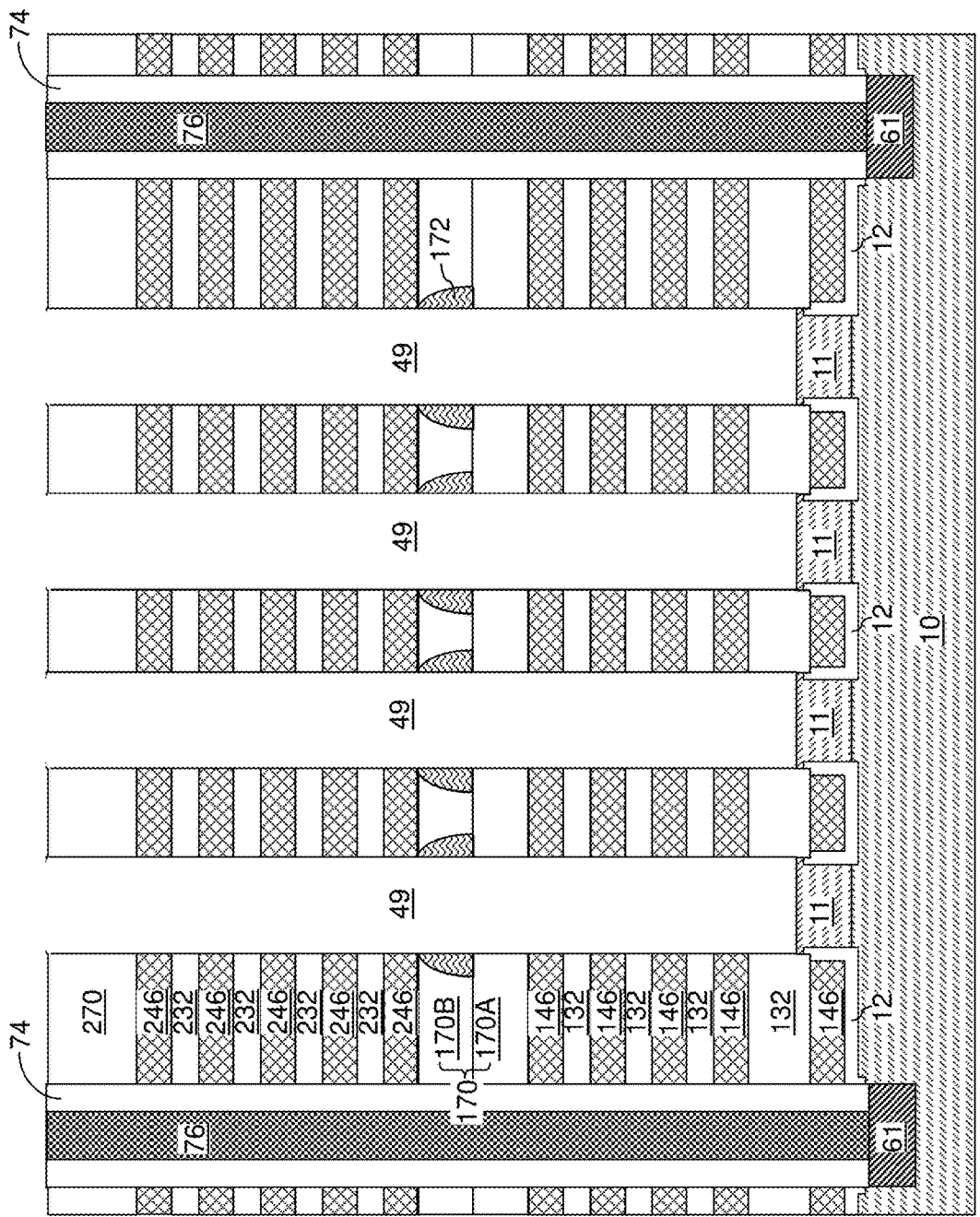
FIG. 20 is a vertical cross-sectional view of the alternate embodiment of the first exemplary structure after removal of the sacrificial pillar structures according to the first embodiment of the present disclosure.

Referring to FIG. 20, the pillar structure stacks (3A, 3B) can be removed selective to the annular spacers 172, the first and second insulating layers (132, 142), the first and second electrically conductive layers (146, 246), the first and second insulating tier cap layers (170, 270), and the epitaxial channel portions 11. The same etch chemistry can be employed as the etch chemistry employed at the processing steps of FIG. 10.

In one embodiment, removal of the pillar structure stacks (3A, 3B) can be performed selective to the annular spacers 172 employing an etch chemistry that provides differential etch rates that depend on the concentration of electrical dopants. In one embodiment, the pillar structure stacks (3A, 3B) can include a first semiconductor material that does not include electrical dopants or includes electrical dopants at an atomic concentration less than $1.0 \times 10^{17}/cm^3$, and the annular spacers 172 can include a second semiconductor material that includes electrical dopants at an atomic concentration greater than $1.0 \times 10^{18}/cm^3$. In one embodiment, the pillar structure stacks (3A, 3B) can include amorphous or polycrystalline silicon that does not include electrical dopants or includes electrical dopants at an atomic concentration less than $1.0 \times 10^{17}/cm^3$, the annular spacers 172 can include amorphous or polycrystalline silicon that includes electrical dopants at an atomic concentration greater than $1.0 \times 10^{18}/cm^3$, and removal of the pillar structure stacks (3A, 3B) selective to the annular spacers 172 can be performed employing hot trimethyl-2 hydroxyethyl ammonium hydroxide.

Figure 21:
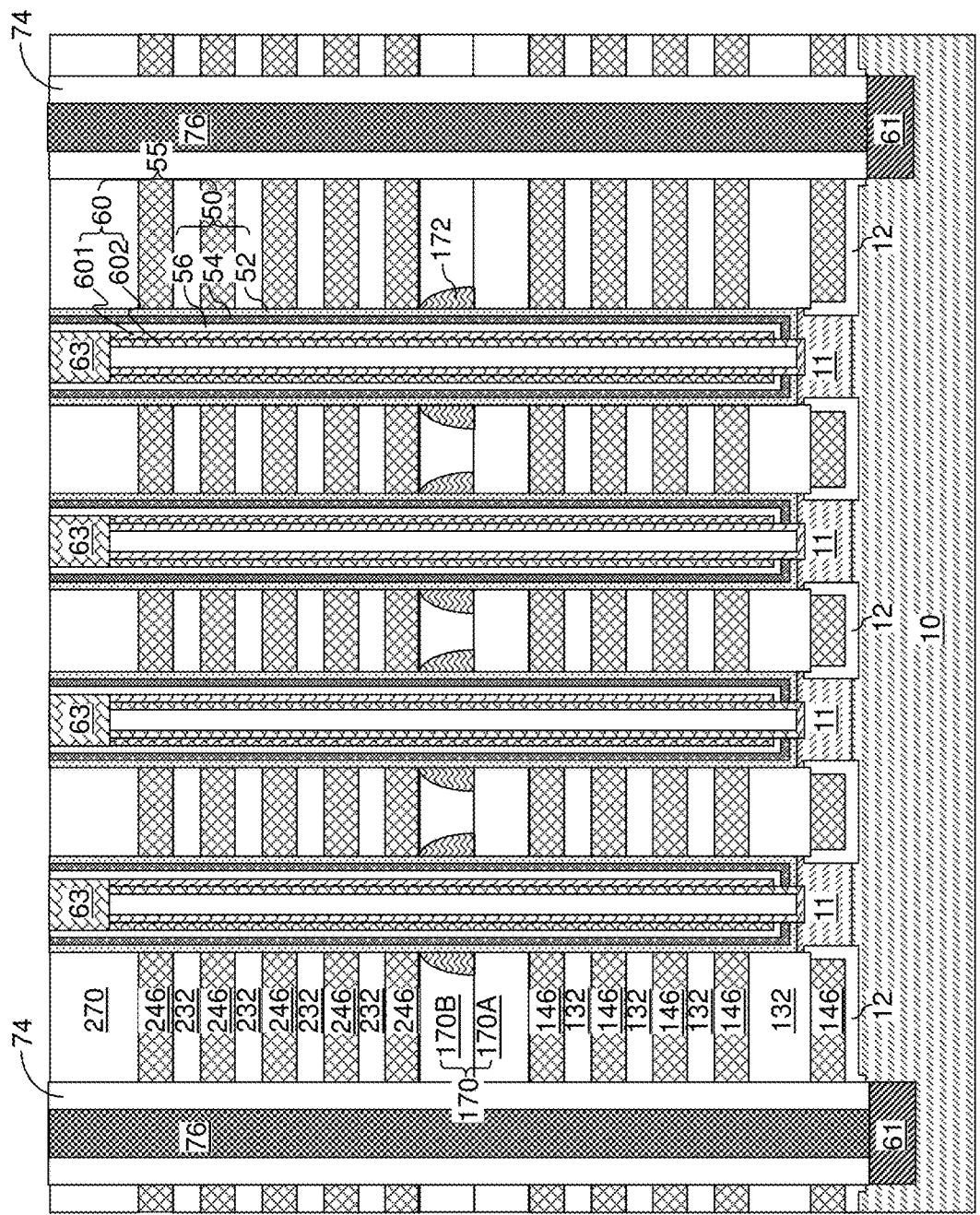
FIG. 21 is a vertical cross-sectional view of the alternate embodiment of the first exemplary structure after formation of memory stack structures, dielectric cores, and drain regions according to the first embodiment of the present disclosure.

Referring to FIG. 21, the processing steps of FIG. 11 can be performed to form memory stack structures 55, dielectric cores 62, and drain regions 63.

The first exemplary structures illustrated in FIGS. 18 and 21 can include a monolithic three-dimensional memory device. The monolithic three-dimensional memory device can include a first alternating stack of first insulating layers 132 and first electrically conductive layers 146 located over a top surface of a substrate 10; an insulating tier cap layer 270 overlying the first alternating stack (132, 146); a second alternating stack located over the insulating tier cap layer 170 and comprising a second alternating stack of second insulating layers 232 and second electrically conductive layers 246; a memory opening extending through the second alternating stack (232, 246), the insulating tier cap layer 170, and the firsts tier structure (132, 146); a memory stack structure 55 located within the memory opening and comprising a memory film 50 including a plurality of charge storage regions (as embodied as portions of the memory material layer 54) located at the levels of the electrically conductive layers (146, 246); and an annular spacer 172 located within the insulating tier cap layer 170 and laterally surrounding the memory stack structure 55.

In one embodiment, an inner sidewall of the annular spacer 172 contacts a portion of an outer sidewall of the memory film 50. In one embodiment, a bottom surface of the annular spacer 172 is vertically spaced from a bottom surface of the insulating tier cap layer 170. In one embodiment, the annular spacer 172 has a horizontal bottom surface and a tapered sidewall surface. In one embodiment, the insulating tier cap layer 170 can comprise a first insulating cap layer 170A having a top surface that is coplanar with a bottom surface of the annular spacer 172, and a second insulating cap layer 170B having a top surface that is coplanar with a topmost surface of the annular spacer 172.

In one embodiment, the annular spacer 172 can comprise a doped semiconductor material.

In one embodiment, the memory opening 49 can have a first horizontal ledge 49A at an interface between the insulating tier cap layer 170 and the second alternating stack (232, 246), and a second horizontal ledge 49B that contacts a horizontal surface of the annular spacer 172 between a top surface of the annular spacer 172 and a bottom surface of the annular spacer 172, as illustrated in FIG. 12B. The first and second horizontal ledges (49A, 49B) extend substantially parallel to the top surface of the substrate 10, and the second horizontal ledge 49B is located closer to the top surface of the substrate 10 than the first horizontal ledge 49A. In one embodiment, first sidewalls of the memory opening 49 located in a lower portion of the insulating tier cap layer 170 (e.g., in layer 170A) can be laterally offset with respect to second sidewalls of the memory opening located in the upper portion of the insulating tier cap layer (e.g., in layer 170B) and in the second alternating stack (232, 246), which is derived from the structure of FIG. 12D by replacement of the sacrificial material layers (142, 242) with electrically conductive layers (146, 246). In one embodiment, one of the first sidewalls of the memory opening 49 can extend to a horizontal plane including an interface (e.g., ledge 49A in FIG. 12B) between the insulating tier cap layer 170 and the second alternating stack (232, 246), and one of the second sidewalls of the memory opening 49 can extend into a middle portion of the annular spacer 172 at ledge 49B, as illustrated in FIG. 12B. The memory film 50 has the same contour as the memory opening 49.

Figure 22A:
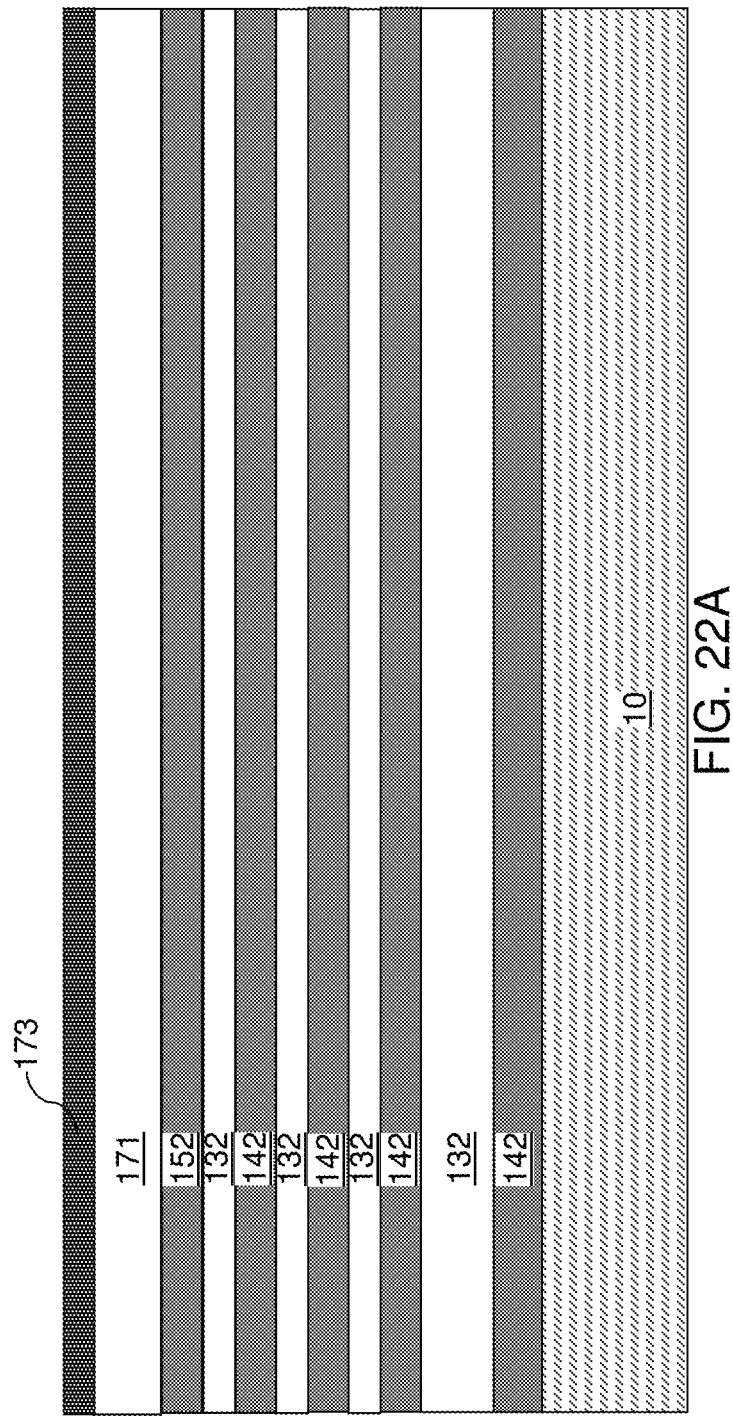
FIG. 22A is a vertical cross-sectional view of a second exemplary structure after formation of an alternating stack of insulating layers and sacrificial material layers, a dielectric etch stop layer, a first insulating cap layer, and a sacrificial hard mask layer according to a second embodiment of the present disclosure.
Figure 22B:
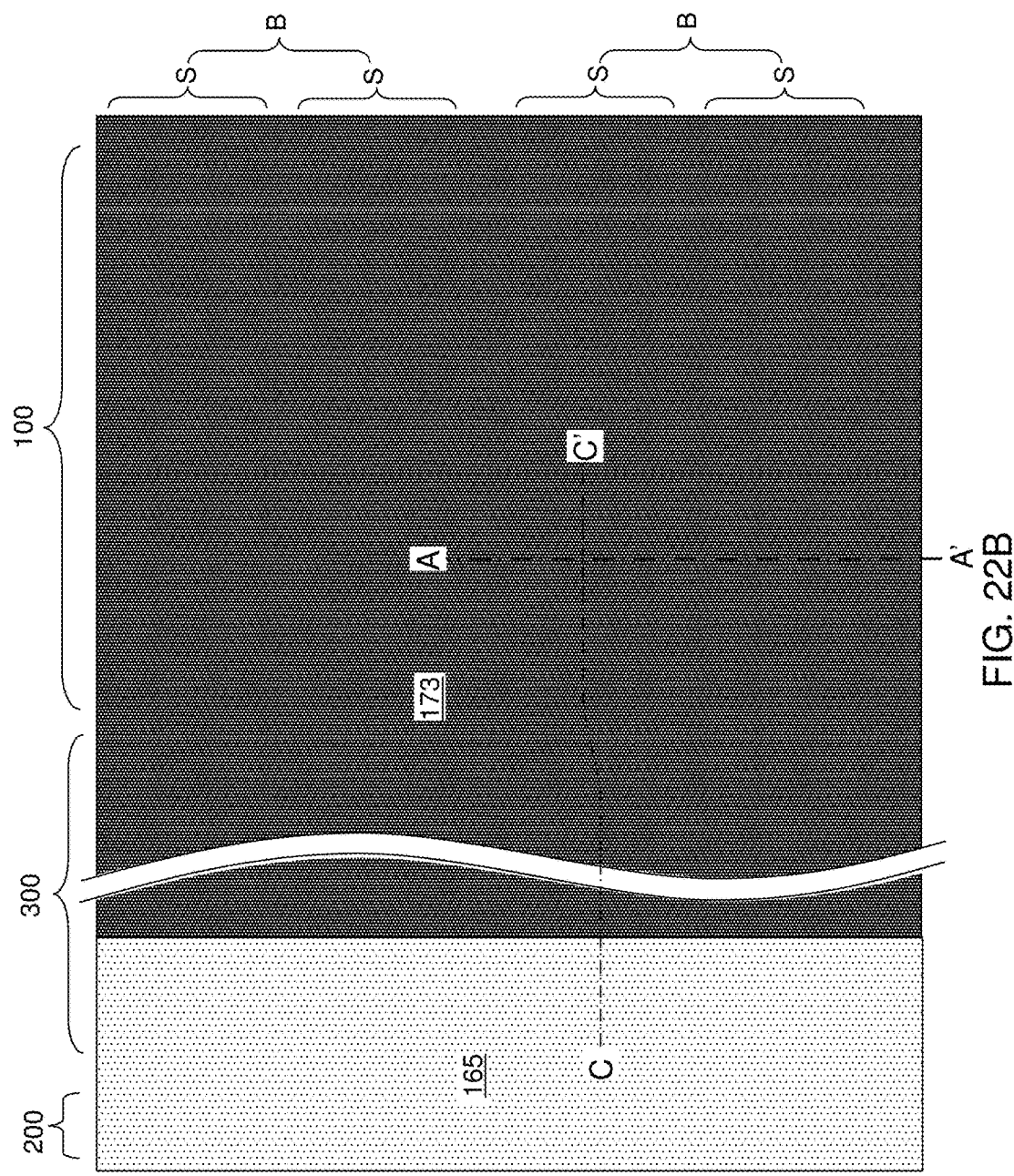
FIG. 22B is a top-down view of the second exemplary structure of FIG. 22A. The vertical plane A-A' is the plane of the vertical cross-sectional view of FIG. 22A.
Figure 22C:
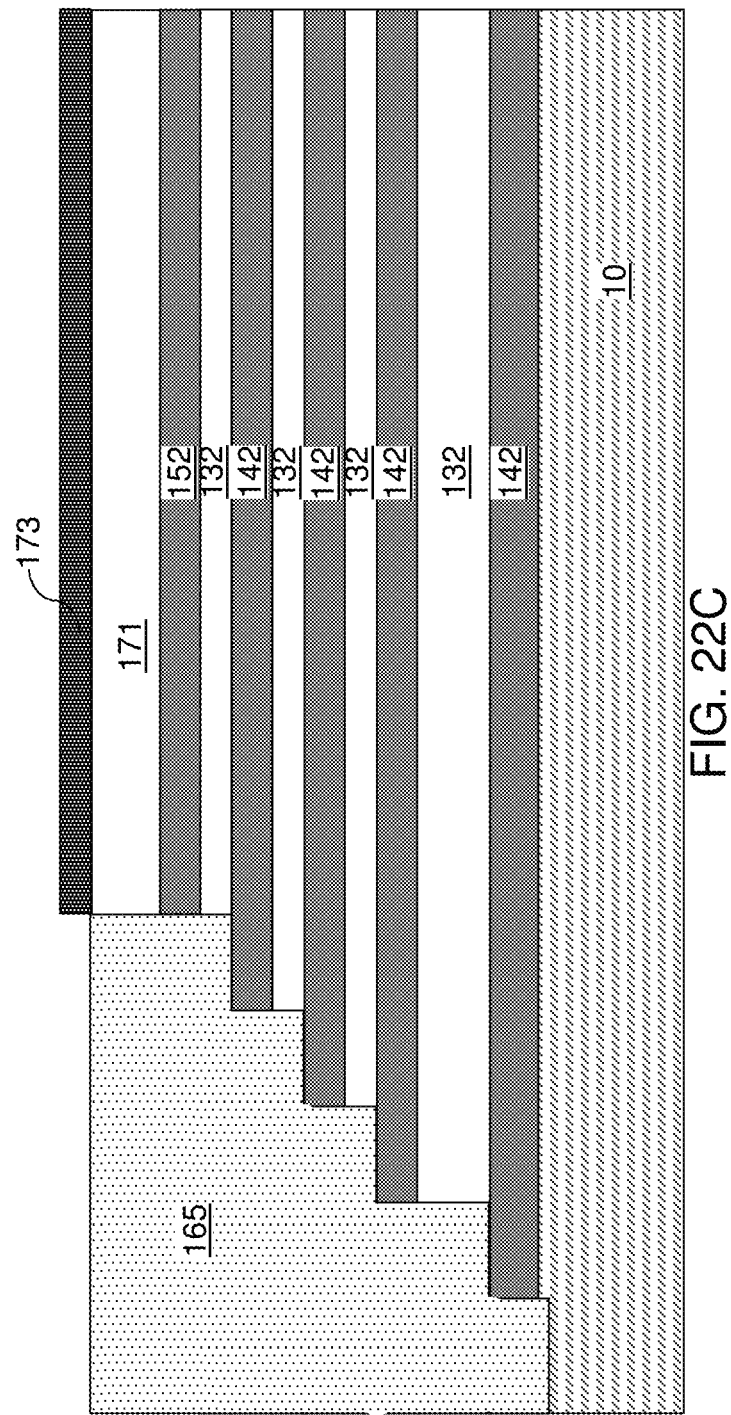
FIG. 22C is another vertical cross-sectional view of the second exemplary structure of FIGS. 22A and 22B along the vertical plane C-C' of FIG. 22B.

Referring to FIGS. 22A-22C, a second exemplary structure according to a second embodiment of the present disclosure is derived from the first exemplary structure of FIG. 1 by forming a layer stack including a dielectric etch stop layer 152, a first insulating cap layer 171, and a sacrificial hard mask layer 173 in lieu of the first insulating cap layer 170A of the first exemplary structure of FIG. 1.

The dielectric etch stop layer 152 comprises a dielectric material that is different in composition from the first insulating layers 132. The dielectric etch stop layer 152 can function as an etch stop layer during subsequent patterning of the first insulating cap layer 171 and the sacrificial hard mask layer 173. The dielectric etch stop layer 152 can include the same material as, or a different material from, the material of the first sacrificial material layers 142. In one embodiment, the dielectric etch stop layer 152 can include silicon nitride or a dielectric metal oxide. In one embodiment, the first sacrificial material layers 142 and the dielectric etch stop layer 152 can include silicon nitride. The thickness of the dielectric etch stop layer 152 can be in a range from 20 nm to 60 nm, although lesser and greater thicknesses can also be employed.

The first insulating cap layer 171 includes a dielectric material that is different from the material of the dielectric etch stop layer 152. In one embodiment, the first insulating cap layer 171 can include the same material as the first insulating layers 132. In one embodiment, the first insulating cap layer 171 and the first insulating layers 132 can include silicon oxide. The thickness of the first insulating cap layer 171 can be in a range from 20 nm to 200 nm, such as from 30 nm to 100 nm, although lesser and greater thicknesses can also be employed.

The sacrificial hard mask layer 173 includes a material that can be employed as a stopping layer during a planarization process. For example, the sacrificial hard mask layer 173 can include silicon nitride. The thickness of the sacrificial hard mask layer 173 can be in a range from 20 nm to 100 nm, although lesser and greater thicknesses can also be employed.

As shown in FIG. 22C, a stepped cavity can be formed within the contact region 300 which is located between the device region 100 and the peripheral region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate 10. In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

After formation of the stepped cavity, a peripheral portion of the first alternating stack (132, 142) can have stepped surfaces after formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A terrace region is formed by patterning the first alternating stack (132, 142). Each first sacrificial material layer 142 other than a topmost first sacrificial material layer 142 within the first alternating stack (132, 142) laterally extends farther than any overlying first sacrificial material layer 142 within the first alternating stack (132, 142). The terrace region includes stepped surfaces of the first alternating stack (132, 142) that continuously extend from a bottommost layer within the first alternating stack (132, 142) to a topmost layer within the first alternating stack (132, 142).

A first retro-stepped dielectric material portion 165 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the sacrificial hard mask layer 173, for example, by chemical mechanical planarization (CMP). The remaining portion of the deposited dielectric material filling the stepped cavity constitutes the retro-stepped dielectric material portion 165. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 165, the silicon oxide of the retro-stepped dielectric material portion 165 may, or may not, be doped with dopants such as B, P, and/or F.

As shown in FIG. 22B, the second exemplary structure can include regions for multiple memory blocks B, in which a smallest set of memory stack structures that can be simultaneously erased can be formed. The memory stack structures in each block can share the same word line in each vertical device level. Each block B can include a plurality of sub-blocks S. The memory stack structures in each sub-block can share the same drain select gate electrode(s) in one or more respective vertical device levels.

Optionally, the first retro-stepped dielectric material portion 165 can be vertically recessed by the thickness of the sacrificial hard mask layer 173, for example, by an isotropic etch such as a wet etch.

Figure 23A:
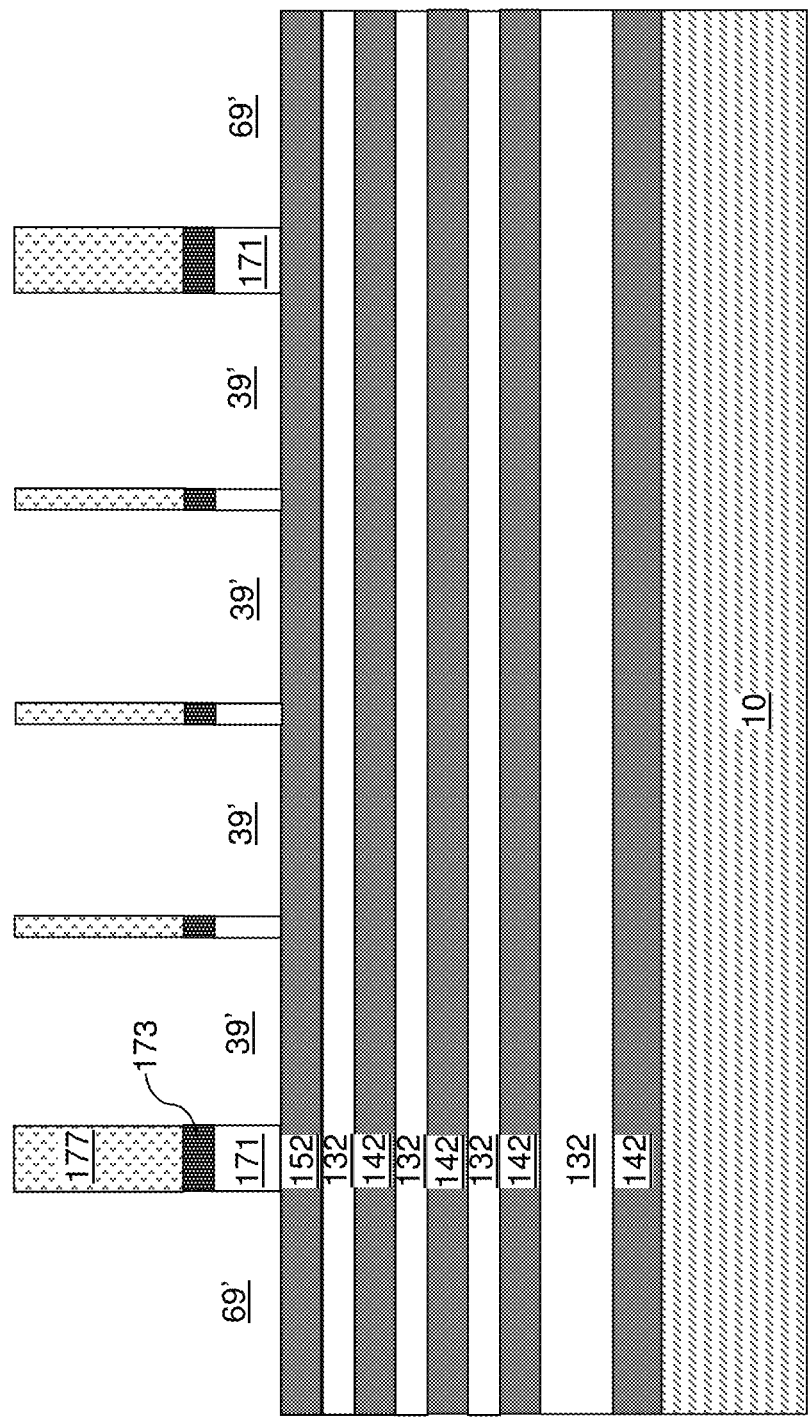
FIG. 23A is a vertical cross-sectional view of the second exemplary structure after formation of memory region recesses and trench region recesses according to the second embodiment of the present disclosure.
Figure 23B:
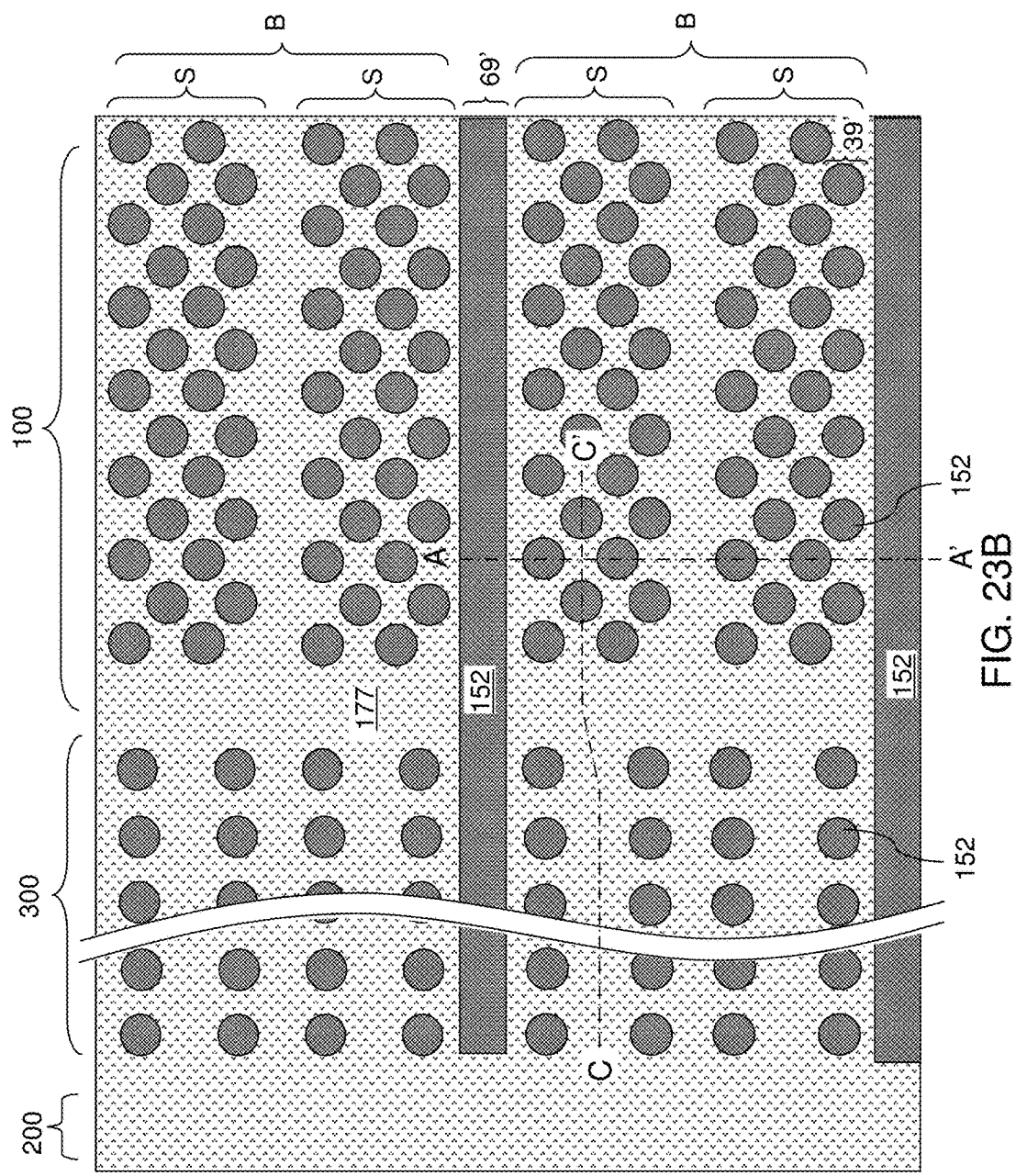
FIG. 23B is a top-down view of the second exemplary structure of FIG. 23A. The vertical plane A-A' is the plane of the vertical cross-sectional view of FIG. 23A.
Figure 23C:
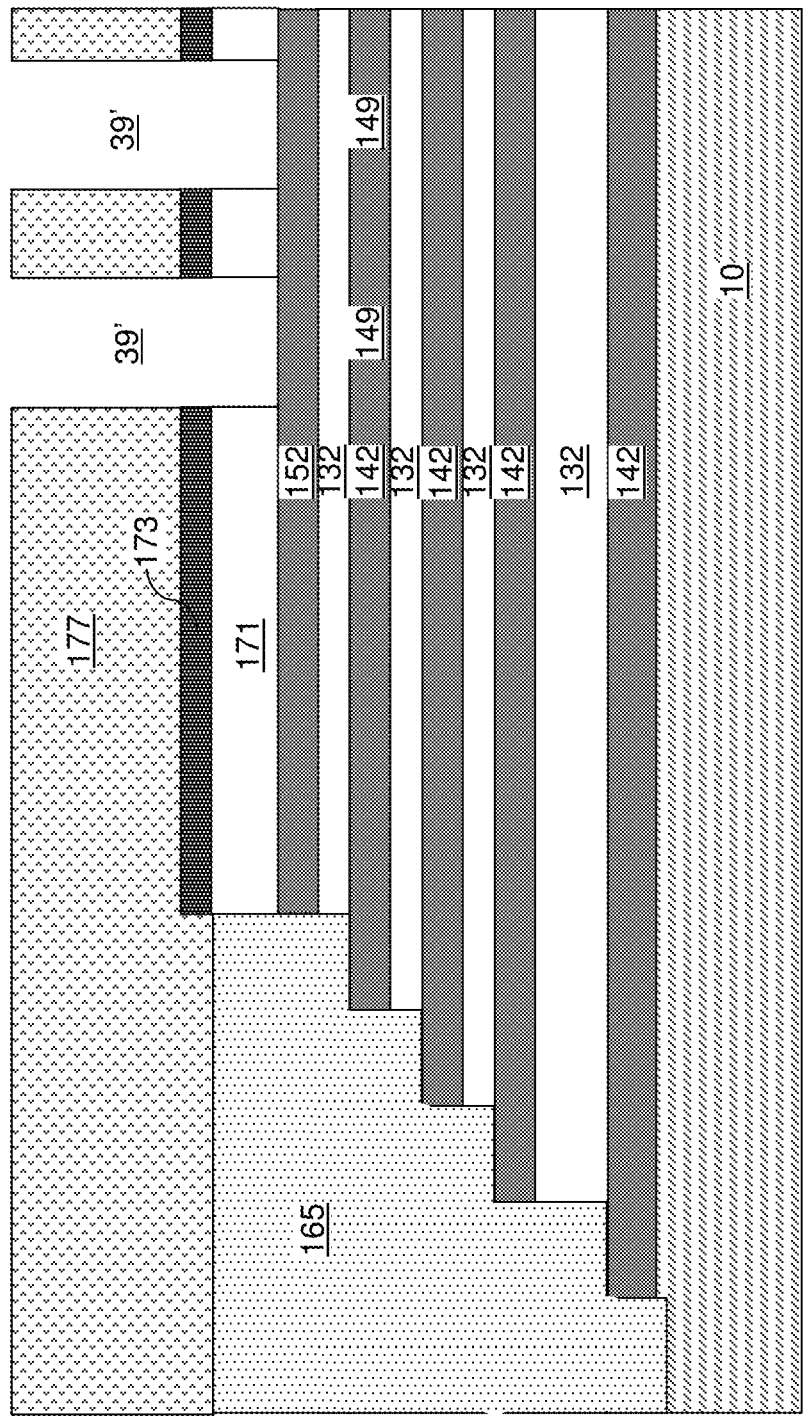
FIG. 23C is a vertical cross-sectional view of the second exemplary structure of FIGS. 23A and 23B along the vertical plane C-C' in FIG. 23B.

Referring to FIGS. 23A-23C, a photoresist layer 177 can be applied over the sacrificial hard mask layer 173 and the first retro-stepped dielectric material portion 165, and can be lithographically patterned to form openings therein. The openings include memory region openings that are formed in areas corresponding to the areas of the memory openings and support openings, and trench region openings that are formed in areas of backside trenches to be subsequently formed. The pattern of the openings in the photoresist layer 177 can be transferred through the sacrificial hard mask layer 173 and the first insulating cap layer 171, and into upper portions of the first retro-stepped dielectric material portion 165 by an anisotropic etch process. The dielectric etch stop layer 152 can be employed as an etch stop structure during the anisotropic etch process.

Memory region recesses 39' are formed underneath the memory region openings in the photoresist layer 177, and trench region recesses 69' can be formed underneath the trench region openings in the photoresist layer 177. In one embodiment the trench region recesses 69' have a larger horizontal size (e.g., larger length and width) than the horizontal size (e.g., diameter) of the memory region recesses 39'. In one embodiment shown in FIG. 23B, the memory region recesses 39' can be include a two-dimensional periodic array within each sub-block S. In one embodiment, each of the memory region recesses 39' can have a vertical sidewall and a horizontal cross-sectional shape of a circle or an ellipse. Each of the trench region recesses 69' can have vertical sidewalls and a rectangular horizontal cross-sectional shape. The trench region recesses 69' can be formed between each neighboring pair of blocks B. The photoresist layer 177 can be subsequently removed, for example, by ashing.

Figure 24:
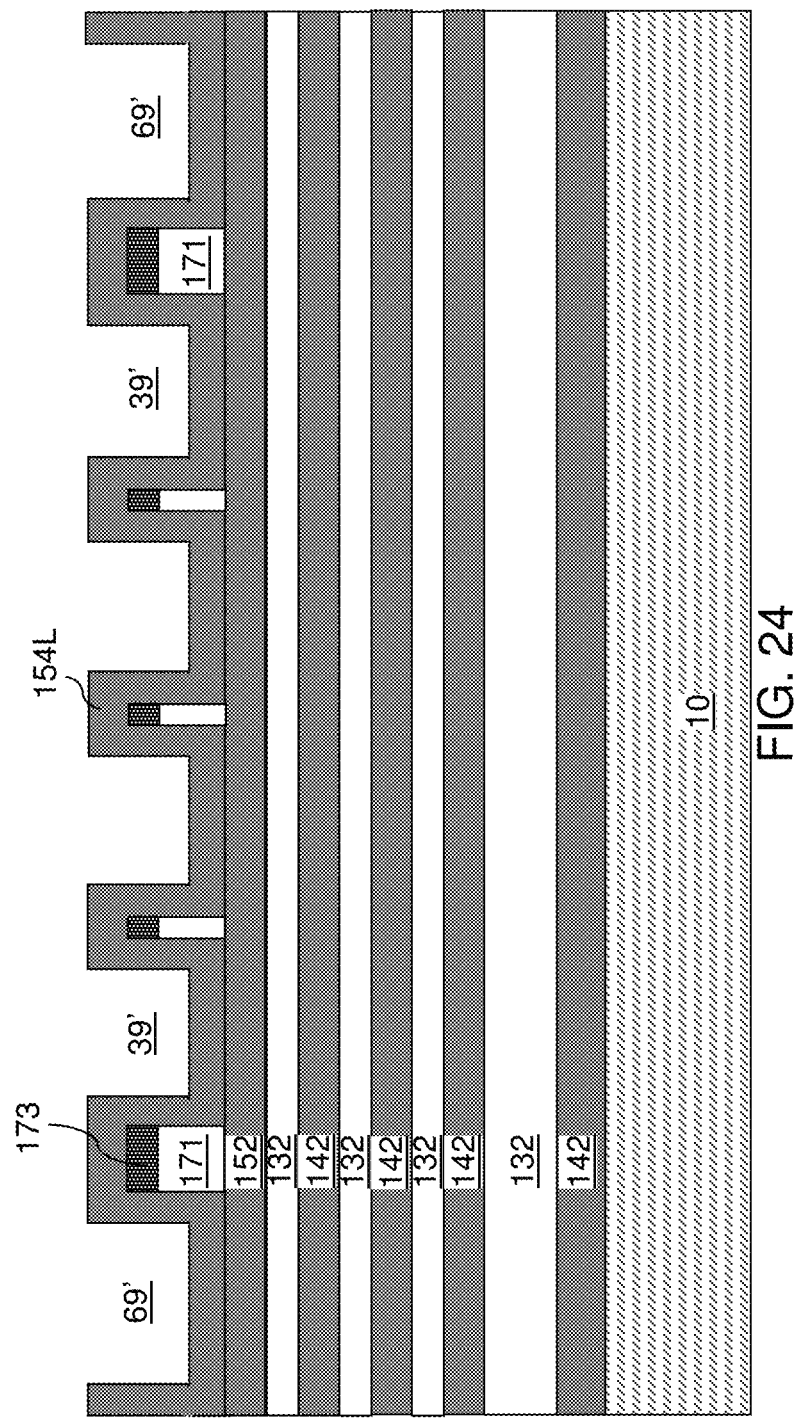
FIG. 24 is a vertical cross-sectional view of the second exemplary structure after deposition of a spacer dielectric material layer according to the second embodiment of the present disclosure.

Referring to FIG. 24, a spacer dielectric material layer 154L can be formed on the bottom surfaces and the sidewalls of the memory region recesses 39' and the trench region recesses 69', over the first retro-stepped dielectric material portion 165, and over the remaining portions of the sacrificial hard mask layer 173. The spacer dielectric material layer 154L includes a material that can be removed selective to the materials of the first insulating cap layer 171, the first insulating layers 132, and second insulating layers to be subsequently formed in a second alternating stack. In one embodiment, the spacer dielectric material layer 154L can include the same material as the first sacrificial material layers 142. In one embodiment, the spacer dielectric material layer 154L and the first sacrificial material layers 142 can include silicon nitride. The thickness of the spacer dielectric material layer 154L can be in a range from 1 nm to 30 nm, such as from 2 nm to 20 nm, although lesser and greater thicknesses can also be employed.

Figure 25A:
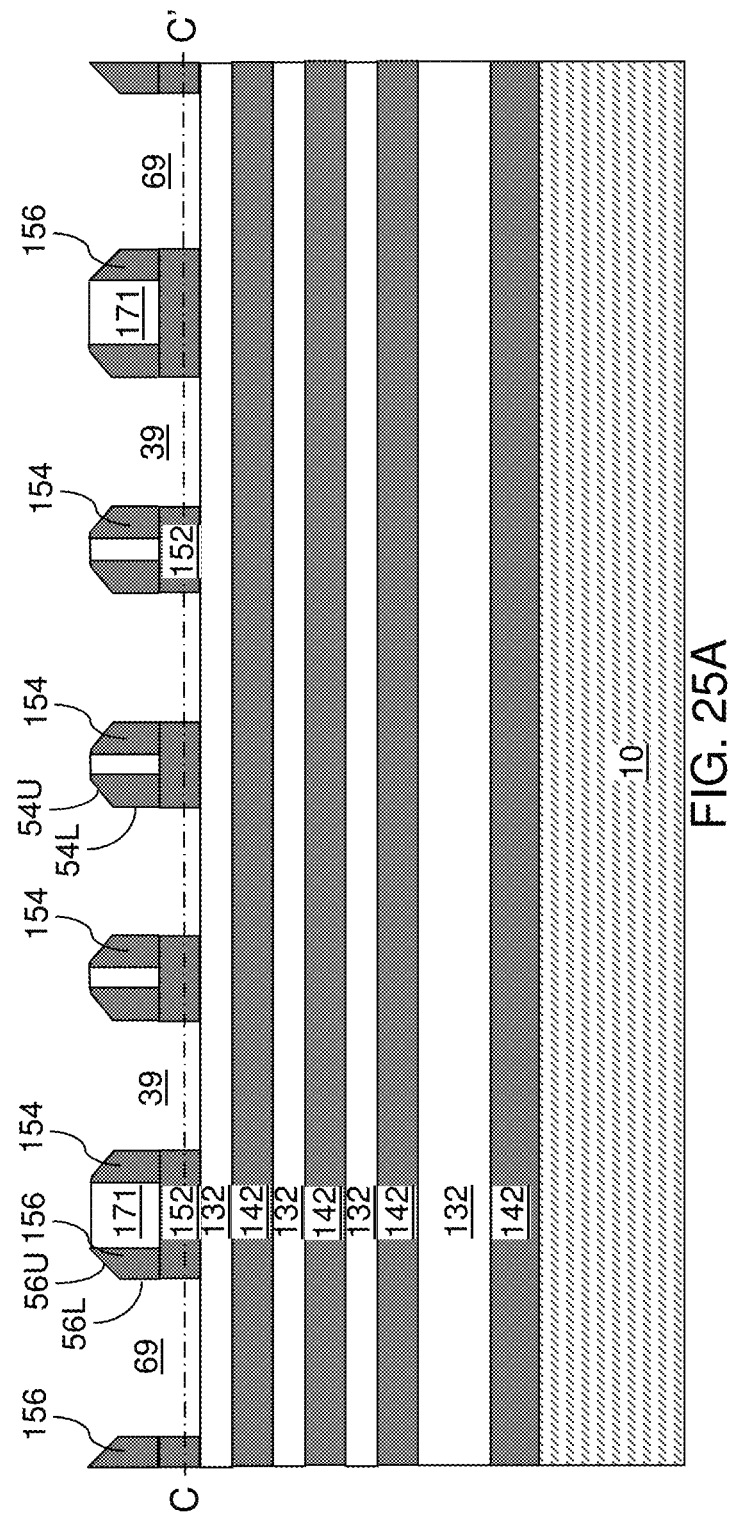
FIG. 25A is a vertical cross-sectional view of the second exemplary structure after formation of annular spacers and rectangular spacers and patterning the dielectric etch stop layer according to the second embodiment of the present disclosure.

Referring to FIGS. 25A-25C, an anisotropic etch process is performed to remove horizontal portions of the spacer dielectric material layer 154L and remaining portions of the sacrificial hard mask layer 173. Horizontal portions of the dielectric etch stop layer 152 that are not masked by the first insulating cap layer 171 or vertical portions of the spacer dielectric material layer 154L can be collaterally removed by the anisotropic etch process. In one embodiment, the spacer dielectric material layer 154L, the sacrificial hard mask layer 173, and the dielectric etch stop layer 152 can include silicon nitride, and the first insulating cap layer 171 and the first insulating layers 132 can include silicon oxide. In this case, the horizontal portions of the dielectric etch stop layer 152, the sacrificial hard mask layer 173, and the portions of the dielectric etch stop layer 152 that not masked by the first insulating cap layer 171 or vertical portions of the spacer dielectric material layer 154L can be removed by an anisotropic etch process that etches silicon nitride selective to silicon oxide.

Each remaining portion of the spacer dielectric material layer 154L around the memory region recesses 39' constitutes an annular spacer, which is herein referred to as an annular dielectric spacer 154. Each annular dielectric spacer 154 is formed at a periphery of, and laterally surrounds, a memory region recess 39' that is vertically extended through the dielectric etch stop layer 152 is herein referred to as an annular spacer opening 39. Each remaining portion of the spacer dielectric material layer 154L around the trench region recesses 69' constitutes a rectangular spacer, which is herein referred to as a rectangular dielectric spacer 156. Each rectangular dielectric spacer 156 can have a pair of vertical lengthwise outer sidewalls and a pair of vertical lengthwise inner sidewalls that are parallel to each other. Each rectangular dielectric spacer 156 is formed at a periphery of and laterally surrounds a volume of the trench region recess 69' which is extended through the dielectric etch stop layer 152. This extended trench region recess is herein referred to as a rectangular spacer opening 69.

Outer sidewalls of the annular dielectric spacers 154 and the rectangular dielectric spacers 156 are formed directly on sidewalls of the first insulating cap layer 171. The inner sidewalls of the annular dielectric spacers 154 comprise lower vertical portions 54L and upper tapered portions 54U. The inner sidewalls of the rectangular dielectric spacers 156 comprise lower vertical portions 56L and upper tapered portions 56U. The annular dielectric spacers 154 and the rectangular dielectric spacers 156 are formed on a top surface of the dielectric etch stop layer 152. The anisotropic etch process that forms the annular dielectric spacers 154 and the rectangular dielectric spacers 156 can pattern the dielectric etch stop layer 152 by removing portions of the dielectric etch stop layer 152 that are not covered by the first insulating cap layer 171, the annular dielectric spacers 154, or the rectangular dielectric spacers 156 after formation of the annular dielectric spacers 154 and the rectangular dielectric spacers 156.

Figure 26:
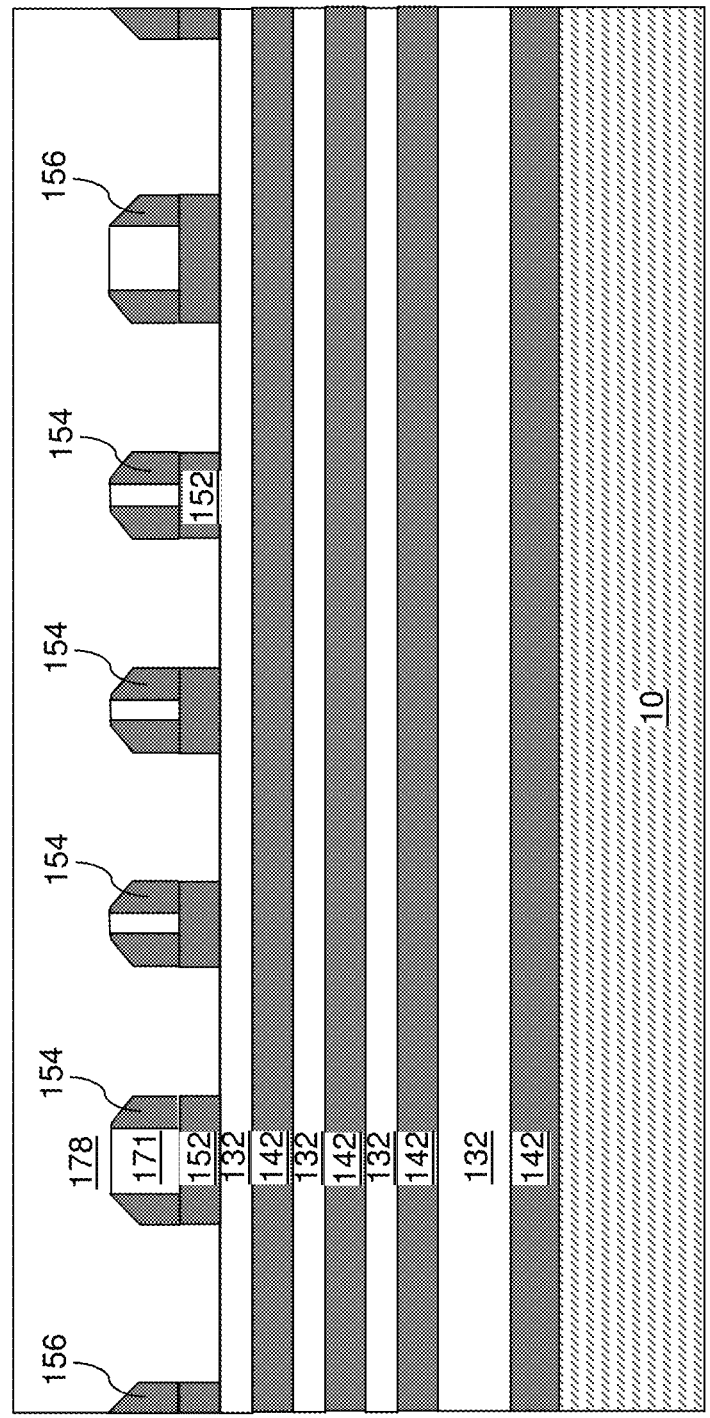
FIG. 26 is a vertical cross-sectional view of the second exemplary structure after formation of a second insulating cap layer according to the second embodiment of the present disclosure.

Referring to FIG. 26, a second insulating cap layer 178 can be formed in the respective openings (39, 69) to fill the openings. The second insulating cap layer 178 can be formed in the respective openings (39, 69) directly on the inner sidewalls of the annular dielectric spacers 154 and the rectangular dielectric spacers 156, on the top surface of the first insulating cap layer 171, and on physically exposed portions of the topmost one of the first insulating layers 132. The second insulating cap layer 178 can be formed directly on tapered portions (i.e., the upper tapered portions (54U, 56U)) of the annular dielectric spacers 154 and the rectangular dielectric spacers 156 and directly on vertical portions (i.e., the lower vertical portions (54L, 56L)) of the annular dielectric spacers 154 and the rectangular dielectric spacers 156. Optionally, the top surface of the second insulating cap layer 178 can be planarized to provide a horizontal top surface. The first and second insulating cap layers (171, 178) are formed as insulating cap layers for the first tier structure that includes all elements between the bottom surface of the first alternating stack (132, 142) and the top surface of the second insulating cap layer 178. As such, the first and second insulating cap layers (171, 178) are collectively referred to as a first insulating tier cap layer (171, 178).

Figure 27A:
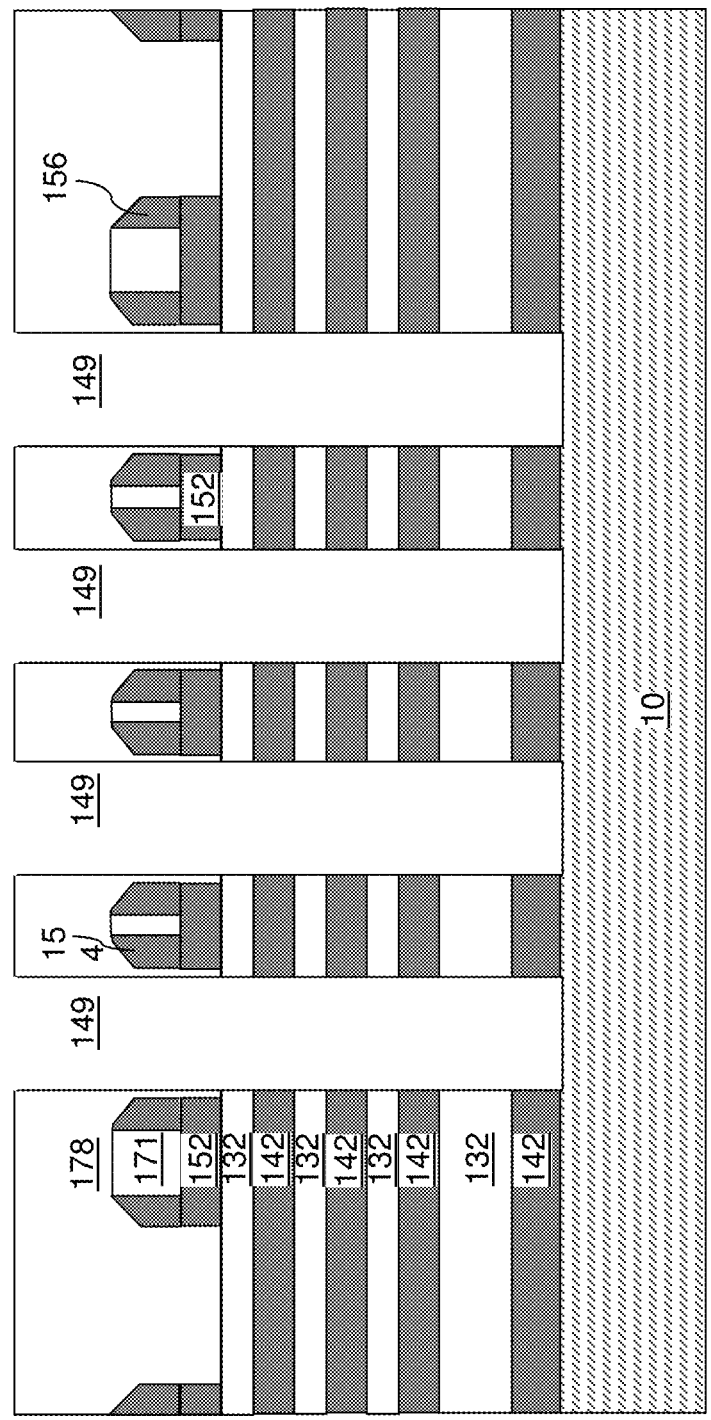
FIG. 27A is a vertical cross-sectional view of the second exemplary structure after formation of lower memory openings according to the second embodiment of the present disclosure.
Figure 27B:
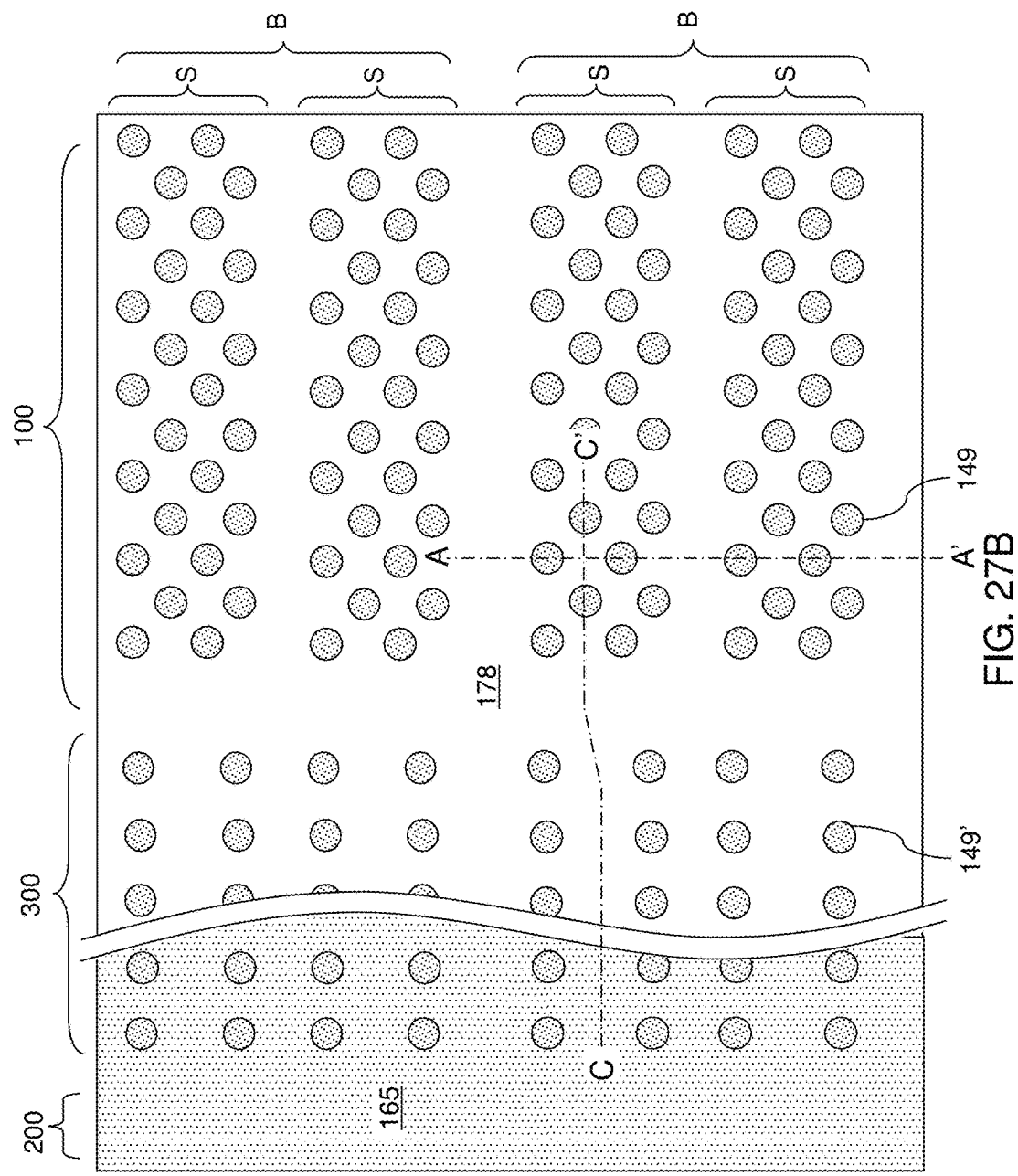
FIG. 27B is a top-down view of the second exemplary structure of FIG. 27A. The vertical plane A-A' is the plane of the vertical cross-sectional view of FIG. 27A.
Figure 27C:
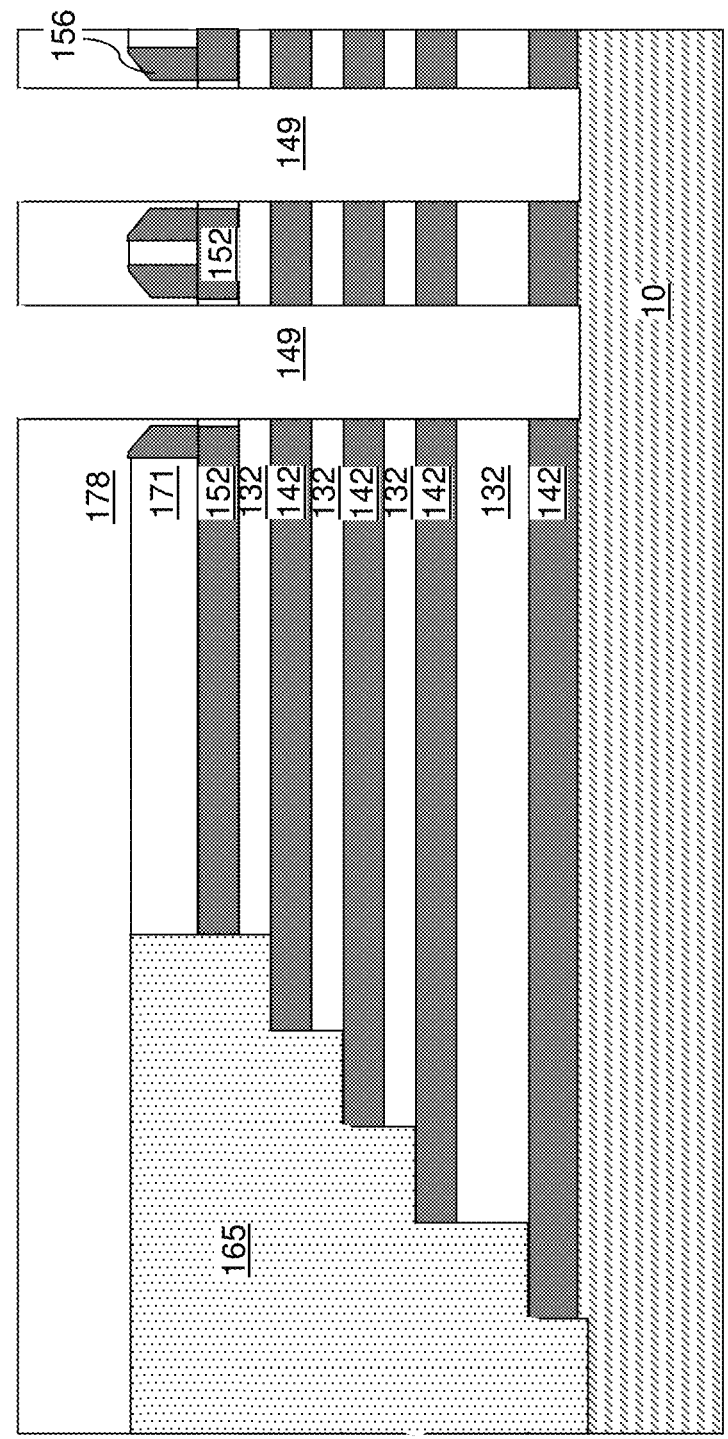
FIG. 27C is a vertical cross-sectional view of the second exemplary structure of FIG. 27A along the horizontal plane C-C'.

Referring to FIGS. 27A-27C, lower memory openings 149 extending to a top surface of the substrate 10 are formed through the second insulating cap layer 178 and the first alternating stack (132, 142). The lower memory openings 149 can be formed in the device region 100. For example, a lithographic material stack (not shown) including at least a photoresist layer can be formed over the second insulating cap layer 178, and can be lithographically patterned to form openings within the lithographic material stack. The pattern in the lithographic material stack can be transferred through the second insulating cap layer 178 and through the entirety of the first alternating stack (132, 142) by at least one anisotropic etch that employs the patterned lithographic material stack as an etch mask. Portions of the second insulating cap layer 178 and the first alternating stack (132, 142) underlying the openings in the patterned lithographic material stack are etched to form the lower memory openings 149. In other words, the transfer of the pattern in the patterned lithographic material stack through the second insulating cap layer 178 and the first alternating stack (132, 142) forms the lower memory openings 149.

Each of the lower memory openings 149 can be formed through a respective one of the annular dielectric spacers 154. In one embodiment, each of the lower memory openings 149 can be formed through an opening within a respective one of the annular dielectric spacers 154, i.e., inside the inner sidewall of the respective one of the annular dielectric spacers 154. A portion of the second insulating cap layer 178 can be present between the inner sidewall of each annular dielectric spacer 154 and the lower memory opening 149 that extends through the annular dielectric spacer 154. Thus, at least a portion of the inner sidewall of an annular dielectric spacer 154 can contact a portion of the second insulation spacer 179 that is located inside the annular dielectric spacer 154 and laterally surrounds a lower memory opening 149. In one embodiment, portions of the second insulating cap layer 178 can remain between the lower memory openings 149 and the annular spacers 154 after formation of the lower memory openings 149.

In one embodiment, the chemistry of the anisotropic etch process employed to etch through the materials of the first alternating stack (132, 142) can alternate to optimize etching of the first and second materials in the first alternating stack (132, 142). The anisotropic etch can be, for example, a series of reactive ion etches. The sidewalls of the lower memory openings 149 can be substantially vertical, or can be tapered. Subsequently, the patterned lithographic material stack can be subsequently removed, for example, by ashing.

Figure 28:
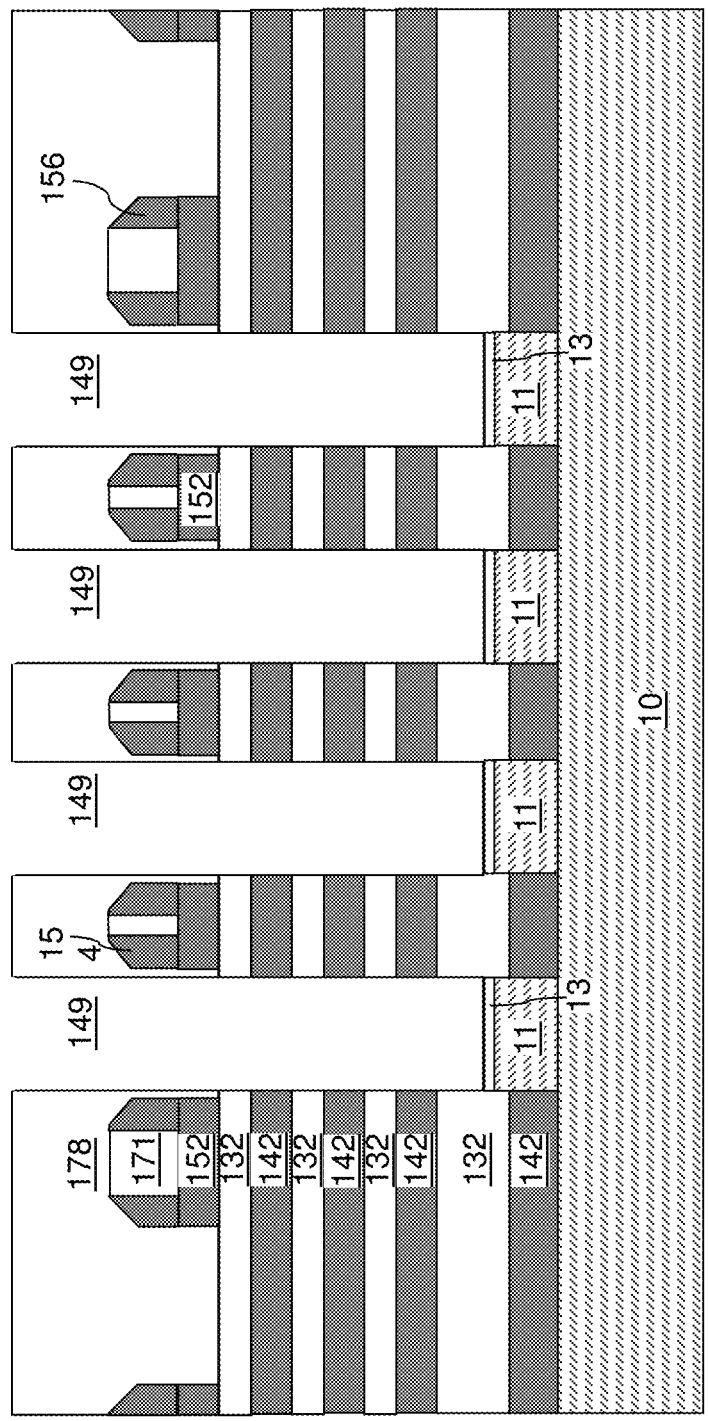
FIG. 28 is a vertical cross-sectional view of the second exemplary structure after formation of optional epitaxial channel portions and optional semiconductor oxide portions according to the second embodiment of the present disclosure.

Referring to FIG. 28, a selective semiconductor deposition process can be performed to deposit a semiconductor material on physically exposed semiconductor surfaces. For example, epitaxial channel portions 11 can grow from the semiconductor surfaces at the bottom of the lower memory openings 149 during the selective epitaxy process. Alternatively, if layer 10 includes a polycrystalline semiconductor material, a polycrystalline channel portion can be formed in lieu of an epitaxial channel portion 11 at the bottom of each lower memory opening 149. Generally, a pillar channel portion having a shape of a pillar structure and including a semiconductor material can be formed at the bottom of each lower memory opening 149 by a selective semiconductor deposition process. In one embodiment, the pillar channel portions can be the same as the epitaxial channel portions 11 illustrated in FIG. 2.

Subsequently, a thermal oxidation process or a plasma oxidation process can be performed to oxidize a surface portion of each epitaxial channel portion 11, thereby converting the surface portion into a respective semiconductor oxide portion 13. The thickness of the semiconductor oxide portion 13 can be in a range from 1 nm to 10 nm, although lesser and greater thicknesses can also be employed.

Figure 29:
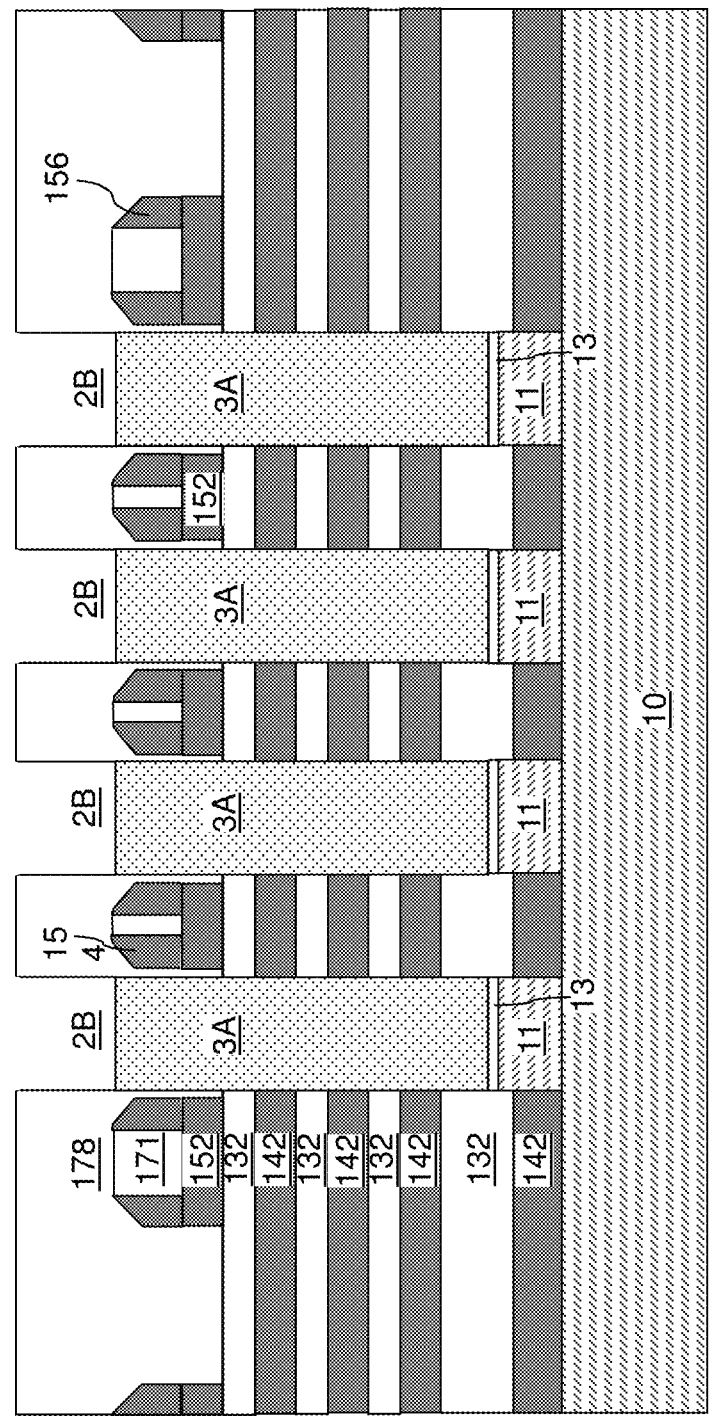
FIG. 29 is a vertical cross-sectional view of the second exemplary structure after formation of lower sacrificial pillar structures according to the second embodiment of the present disclosure.

Referring to FIG. 29, a sacrificial fill material layer can be deposited over the epitaxial channel portions 11 in the lower memory openings 149 in the same manner as in the processing steps of FIG. 3. The sacrificial fill material layer of the second embodiment can be the same as the sacrificial fill material layer 131L of the first embodiment.

Portions of the deposited sacrificial material can be removed from above the second insulating cap layer 178 by a planarization process. The planarization process can include a recess etch, chemical mechanical planarization (CMP), or a combination thereof. The top surface of the second insulating layer 178 can be employed as an etch stop layer or a planarization stop layer. Each remaining portion of the sacrificial material in a lower memory opening constitutes a lower sacrificial pillar structure 3A.

Subsequently, top surfaces of the lower sacrificial pillar structures 3A can optionally be vertically recessed below the horizontal plane including the top surface of the second insulating cap layer 178. In case the lower sacrificial pillar structures 3A are formed by recessing the sacrificial fill material layer by a recess etch process, the recess etch process can be extended so that the top surfaces of the lower sacrificial pillar structures 3A are vertically recessed to a level below the top surface of the second insulating cap layer 178. The recessed top surfaces of the lower sacrificial pillar structures 3A can be above the horizontal plane including the interface between the first insulating cap layer 171 and the second insulating cap layer 178. In case the lower sacrificial pillar structures 3A are formed by a chemical mechanical planarization (CMP) process that removes the portions of the sacrificial fill material layer from above the horizontal plane including the top surface of the second insulating cap layer 178, a recess etch process can be performed to vertically recess the top surfaces of the lower sacrificial pillar structures 3A below the horizontal plane including the top surface of the second insulating cap layer 178. The lower sacrificial pillar structures 3A may, or may not, include cavities therein. A memory recess cavity 2B can be formed above the recessed top surface of each lower sacrificial pillar structure 3A. Each lower sacrificial pillar structure 3A can extend through an openings in an annular dielectric spacer 154 and through the first alternating stack (132, 142).

Figure 30:
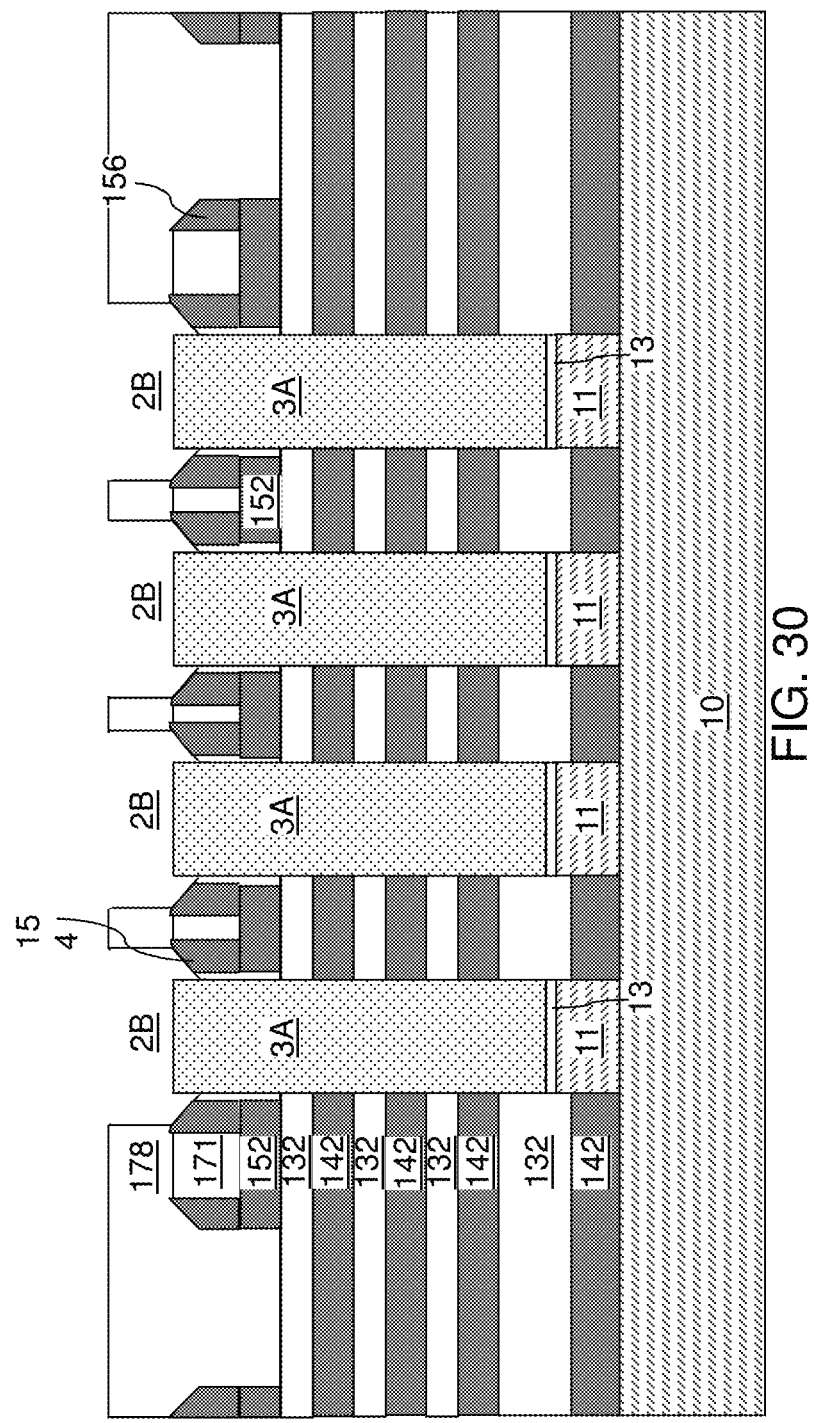
FIG. 30 is a vertical cross-sectional view of the second exemplary structure after isotropically recessing the second insulating cap layer according to the second embodiment of the present disclosure.

Referring to FIG. 30, an optional isotropic etch can be performed to isotropically recess the sidewalls and the top surface of the second insulating cap layer 178. The sidewalls of the memory recess cavities 2B can be isotropically recessed so that the lateral dimensions of the memory recess cavities 2B increase. The duration of the isotropic etch process can be controlled so that merging of the memory recess cavities 2B is prevented, and each of the memory recess cavities 2B remains as a distinct cavity.

Figure 31A:
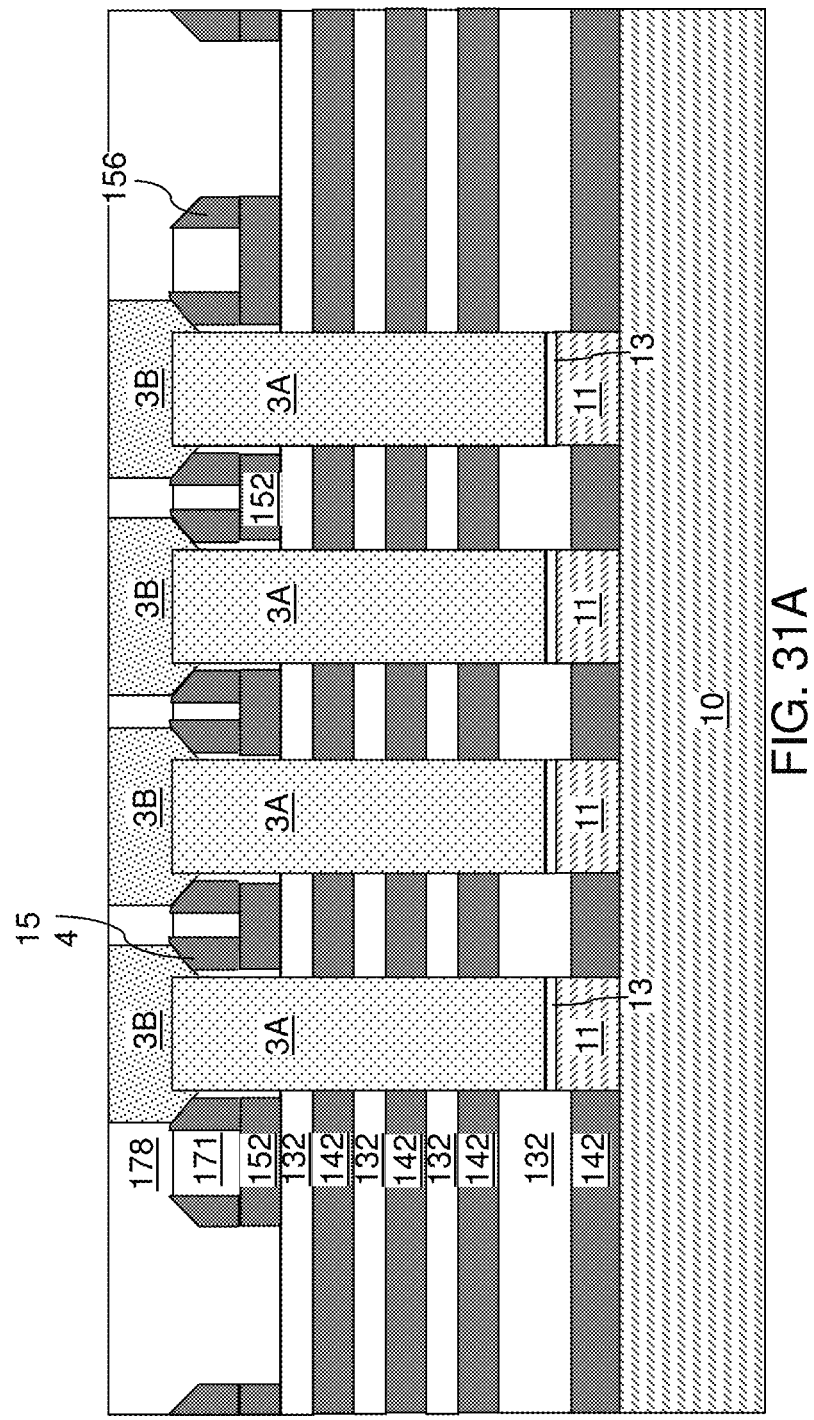
FIG. 31A is a vertical cross-sectional view of the second exemplary structure after formatting of upper sacrificial pillar structures according to the second embodiment of the present disclosure.
Figure 31B:
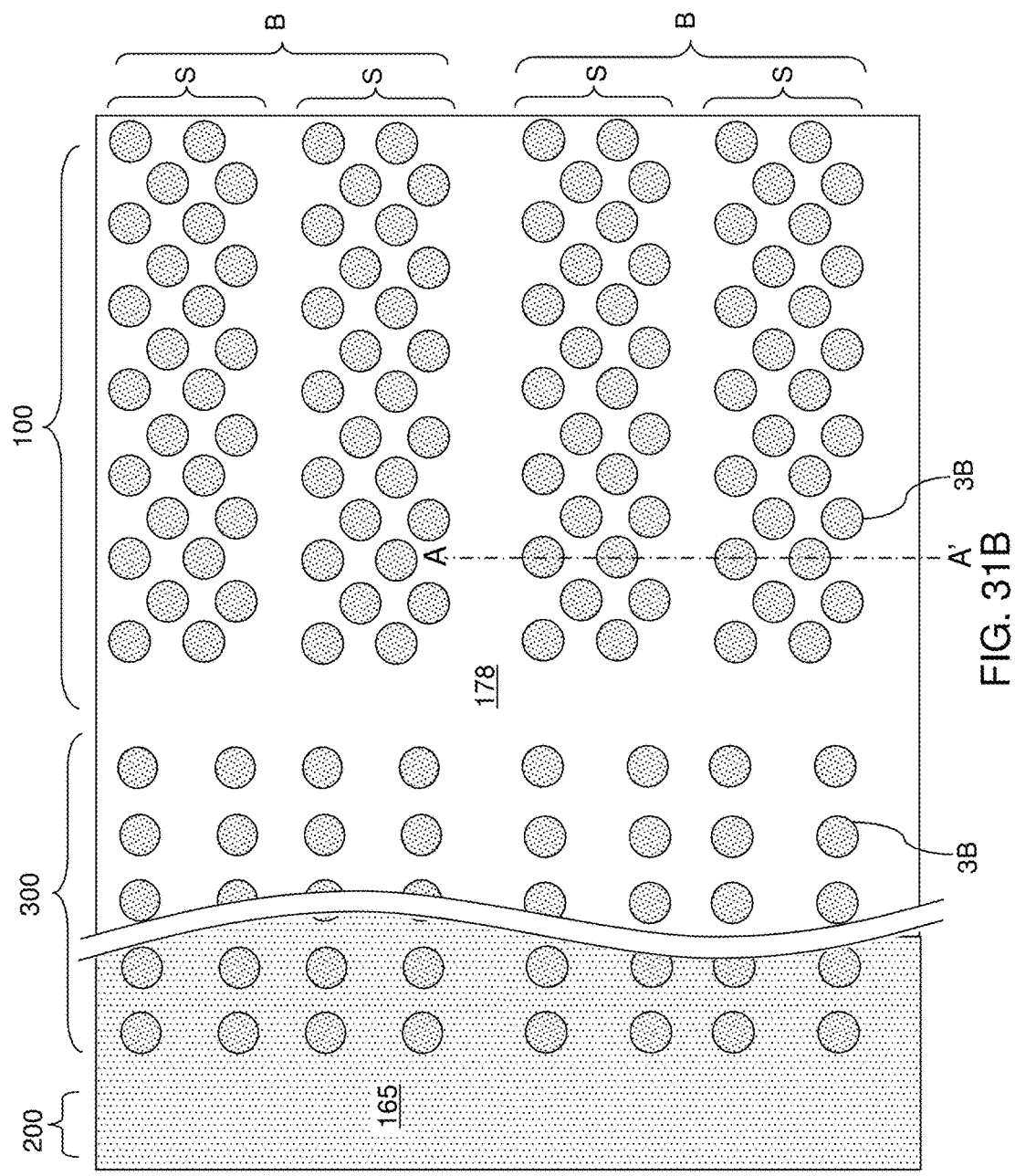
FIG. 31B is a top-down view of the second exemplary structure of FIG. 31A. The vertical plane A-A' is the plane of the vertical cross-sectional view of FIG. 31A.

Referring to FIGS. 31A and 31B, a sacrificial fill material is deposited in the memory recess cavities 2B. The sacrificial fill material can be any of the materials that can be employed for the sacrificial fill material layer 131L of the first embodiment. The sacrificial fill material may be the same as, or may be different from, the material of the lower sacrificial pillar structures 3A. Excess portions of the sacrificial material can be removed from above the horizontal plane including the top surface of the second insulating cap layer 178 by a planarization process such as chemical mechanical planarization or a recess etch. Each remaining portion of the sacrificial material filling the memory recess cavities 2B constitutes an upper sacrificial pillar structure 3B. Each vertically neighboring pair of an upper sacrificial pillar structure 3B and a lower sacrificial pillar structure 3A is herein referred to as a sacrificial pillar structure (3A, 3B).

Figure 32A:
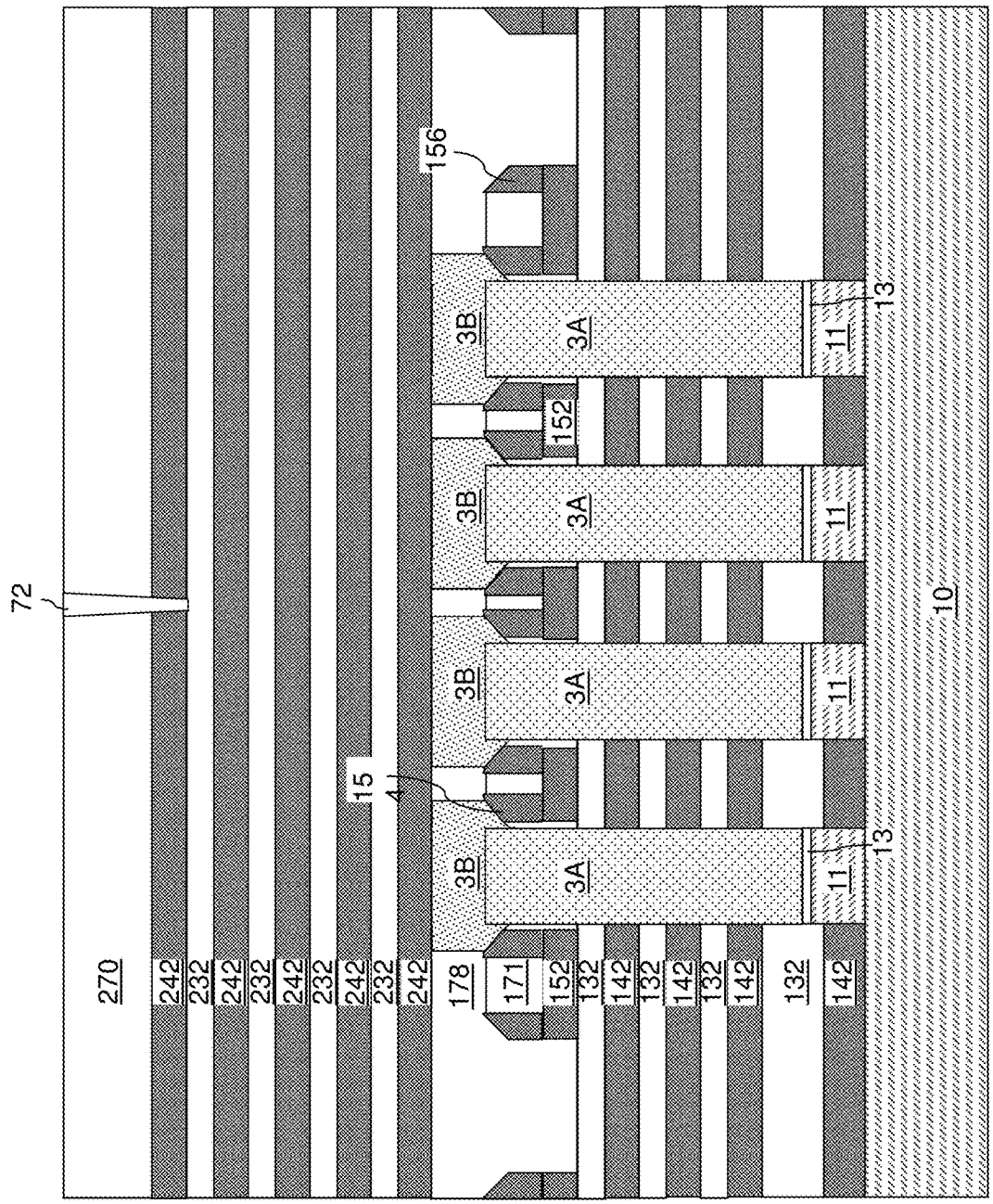
FIG. 32A is a vertical cross-sectional view of the second exemplary structure after formation of a second alternating stack of second insulating layers and second sacrificial material layers and formation of drain select level isolation structures according to the second embodiment of the present disclosure.
Figure 32B:
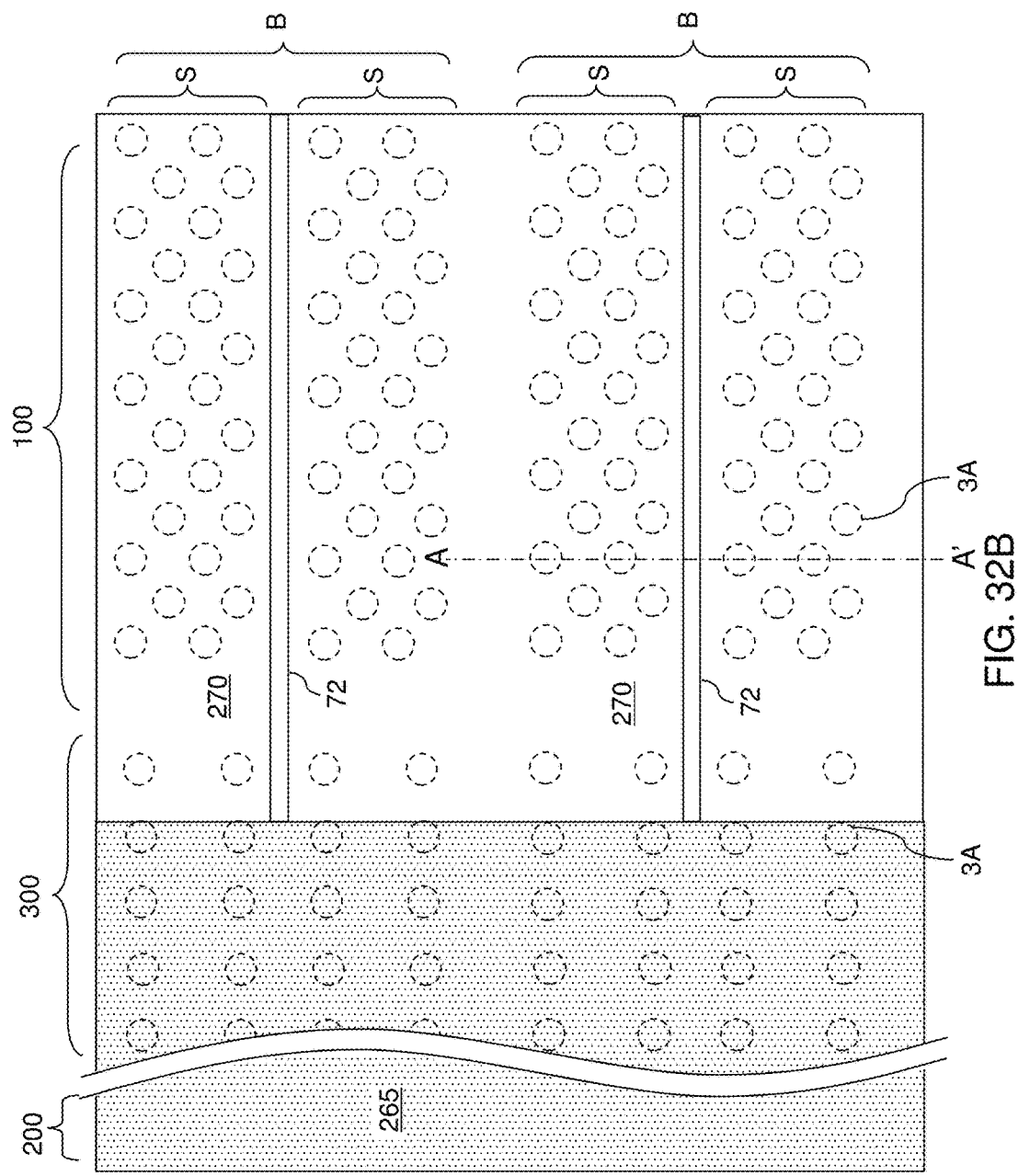
FIG. 32B is a top-down view of the second exemplary structure of FIG. 32A. The vertical plane A-A' is the plane of the vertical cross-sectional view of FIG. 32A.

Referring to FIGS. 32A and 32B, the processing steps of FIG. 8 can be performed to deposit a second alternating stack of second insulating layers 232 and second sacrificial material layers 242, and a second insulating tier cap layer 270, thereby forming a second tier structure (232, 242, 270).

As shown in FIG. 32B, a terrace region can be formed in the second tier structure by forming a stepped cavity including stepped surfaces. A second retro-stepped dielectric material portion 265 can be formed by depositing a dielectric material in the stepped cavity and removing excess portions of the dielectric material from above the horizontal plane including the top surface of the second insulting tier cap layer 270.

Optionally, drain select level isolation structures 72 can be formed through the second insulating tier cap layer 270 and a subset of the second sacrificial material layers 242 located at drain select levels. The drain select level isolation structures 72 can be formed, for example, by forming drain select level isolation trenches and filling the drain select level isolation trenches with a dielectric material such as silicon oxide. Excess portions of the dielectric material can be removed from above the top surface of the second insulating tier cap layer 270.

Figure 33A:
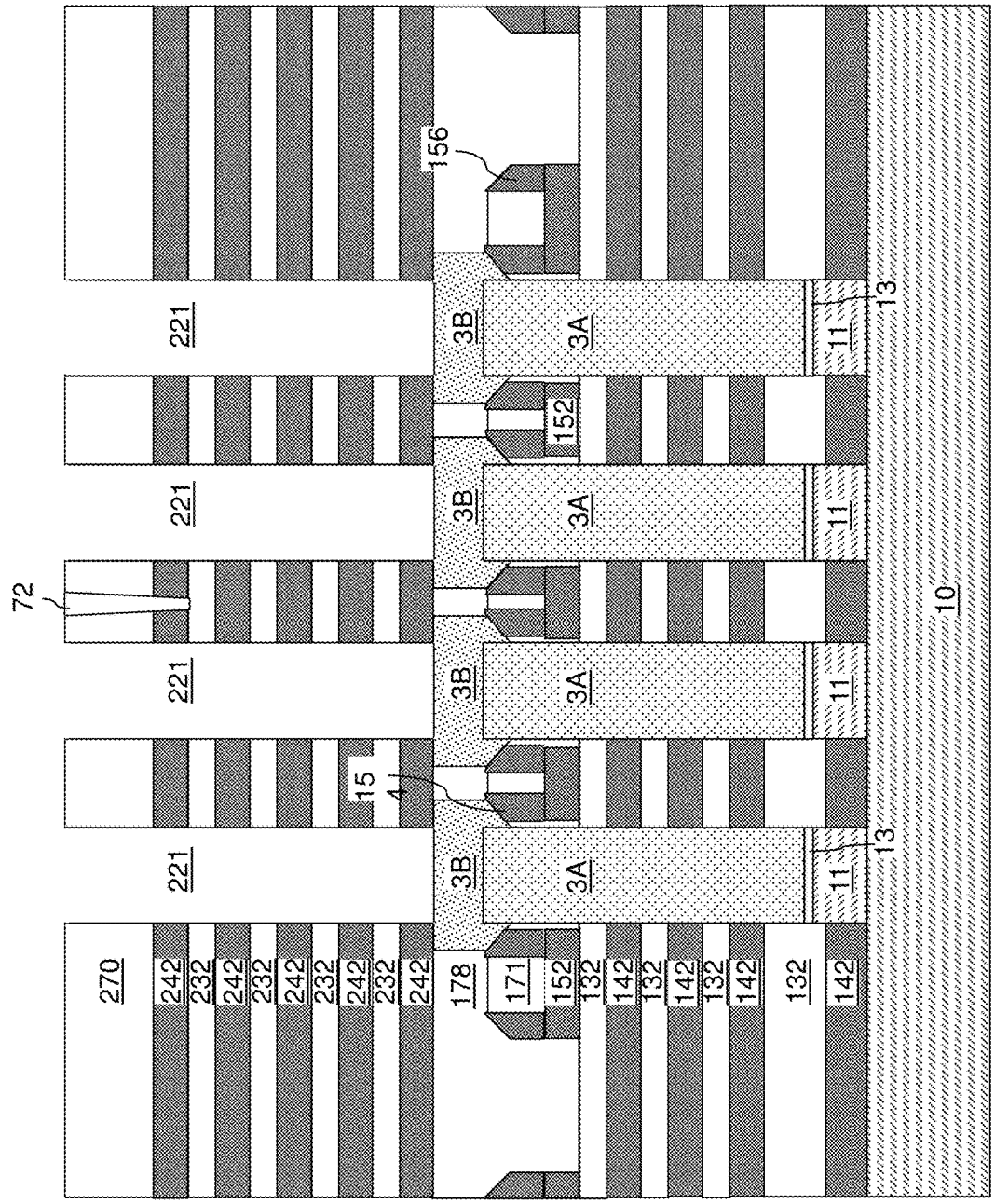
FIG. 33A is a vertical cross-sectional view of the second exemplary structure after formation of upper memory openings according to the second embodiment of the present disclosure.

Referring to FIGS. 33A and 33B, the processing steps of FIG. 9 can be performed to form upper memory openings 221. The upper memory openings 221 can be formed through the second tier structure (232, 242, 270) in areas overlying the sacrificial pillar structures (3A, 3B), i.e., the areas of lower memory openings 149. The upper memory openings 221 can vertically extend to the top surfaces of the sacrificial pillar structures (3A, 3B). For example, a lithographic material stack (not shown) including at least a photoresist layer can be formed over the second tier structure (232, 242, 270), and can be lithographically patterned to form openings within the lithographic material stack. The pattern in the lithographic material stack can be transferred through the entirety of the second tier structure (232, 242, 270) by at least one anisotropic etch that employs the patterned lithographic material stack as an etch mask. Portions of the second insulating tier cap layer 270 and the second tier structure (232, 242, 270) underlying the openings in the patterned lithographic material stack are etched to form the upper memory openings 221. In other words, the transfer of the pattern in the patterned lithographic material stack through the second insulating tier cap layer 270 and the second tier structure (232, 242, 270) forms the upper memory openings 221. While not illustrated in FIGS. 33A and 33B, a misalignment can occur between the upper memory openings 221 and the sacrificial pillar structures (3A, 3B) due to overlay variations that are inherent in lithographic alignment of a new pattern (the pattern of the openings in the photoresist layer for forming the upper memory openings 221) with a pre-existing pattern (the pattern of the sacrificial fill structures (3A, 3B)).

In one embodiment, the chemistry of the anisotropic etch process employed to etch through the materials of the second stack (232, 242) can alternate to optimize etching of the third and fourth materials in the second stack (232, 242). The anisotropic etch can be, for example, a series of reactive ion etches. The sidewalls of the upper memory openings 221 can be substantially vertical, or can be tapered. In one embodiment, the sacrificial pillar structures (3A, 3B) may be employed as stopping structures for the anisotropic etch process that forms the upper memory openings 221. An overetch into upper portions of the sacrificial pillar structures (3A, 3B) can occur during the anisotropic etch. In this case, the annular dielectric spacers 154 function as stopping layers.

Figure 34:
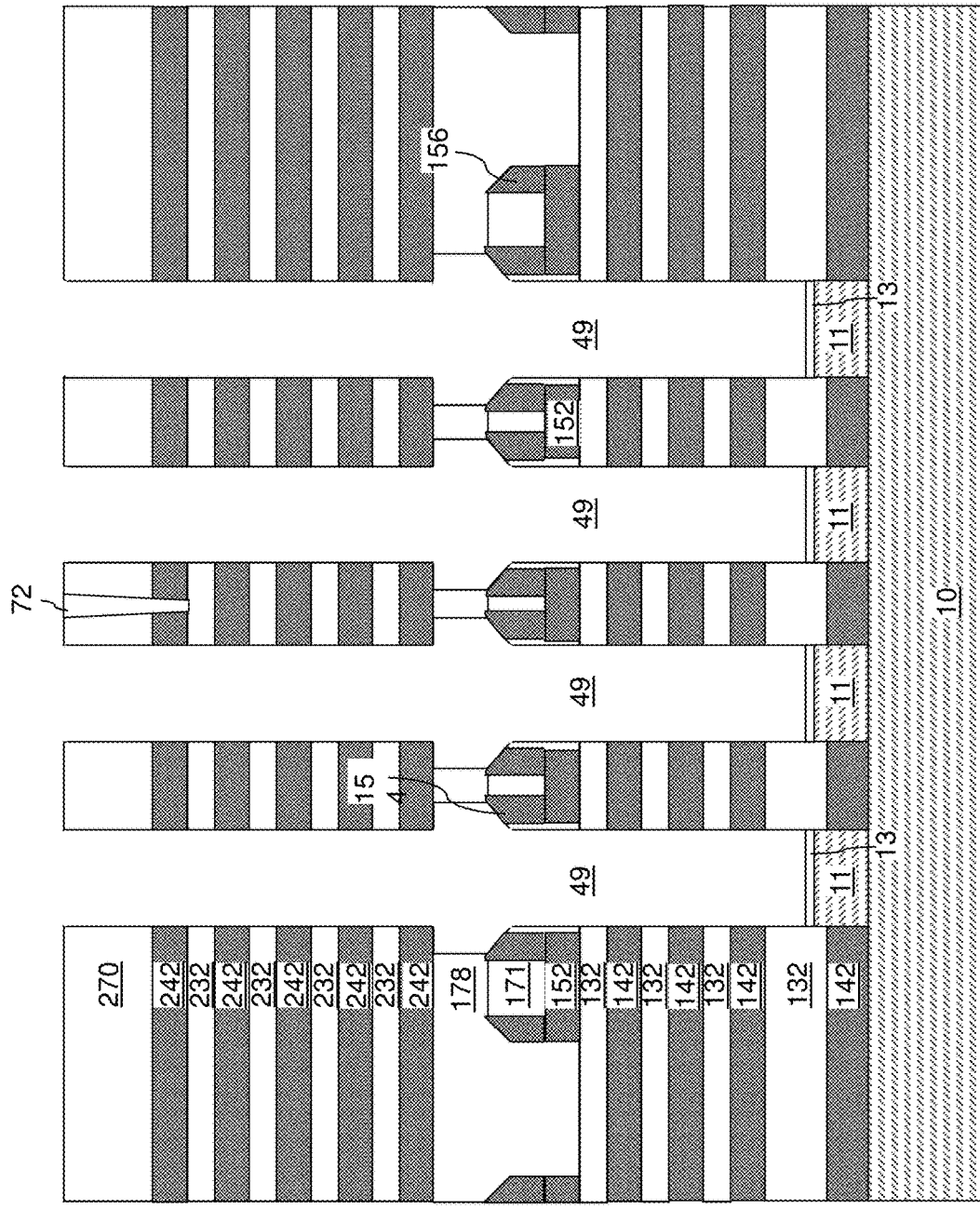
FIG. 34 is a vertical cross-sectional view of the second exemplary structure after removal of the sacrificial pillar structures to form memory openings according to the second embodiment of the present disclosure.

Referring to FIG. 34, the sacrificial pillar structures (3A, 3B) can be removed selective to the materials of the second insulating tier cap layer 270, the second alternating stack (232, 242), the second insulating cap layer 178, the first alternating stack (132, 142), the annular dielectric spacers 154, and the semiconductor oxide portions 13. In case the sacrificial pillar structures (3A, 3B) comprise an undoped semiconductor material (such as undoped amorphous silicon or polycrystalline silicon), an etch chemistry that removes the undoped semiconductor material selective to dielectric materials and to the material of the annular dielectric spacers 154 can be employed. For example, if the sacrificial pillar structures (3A, 3B) include amorphous silicon or polysilicon, a wet etch employing a KOH solution or hot trimethyl-2 hydroxyethyl ammonium hydroxide ("hot TMY") solution can be employed. The memory openings 49 are formed by extending the upper memory openings 221 through removal of the sacrificial pillar structures (3A, 3B). The memory openings 49 are formed through the first and second tier structures (132, 142, 232, 242, 171, 178, 270).

Figure 35:
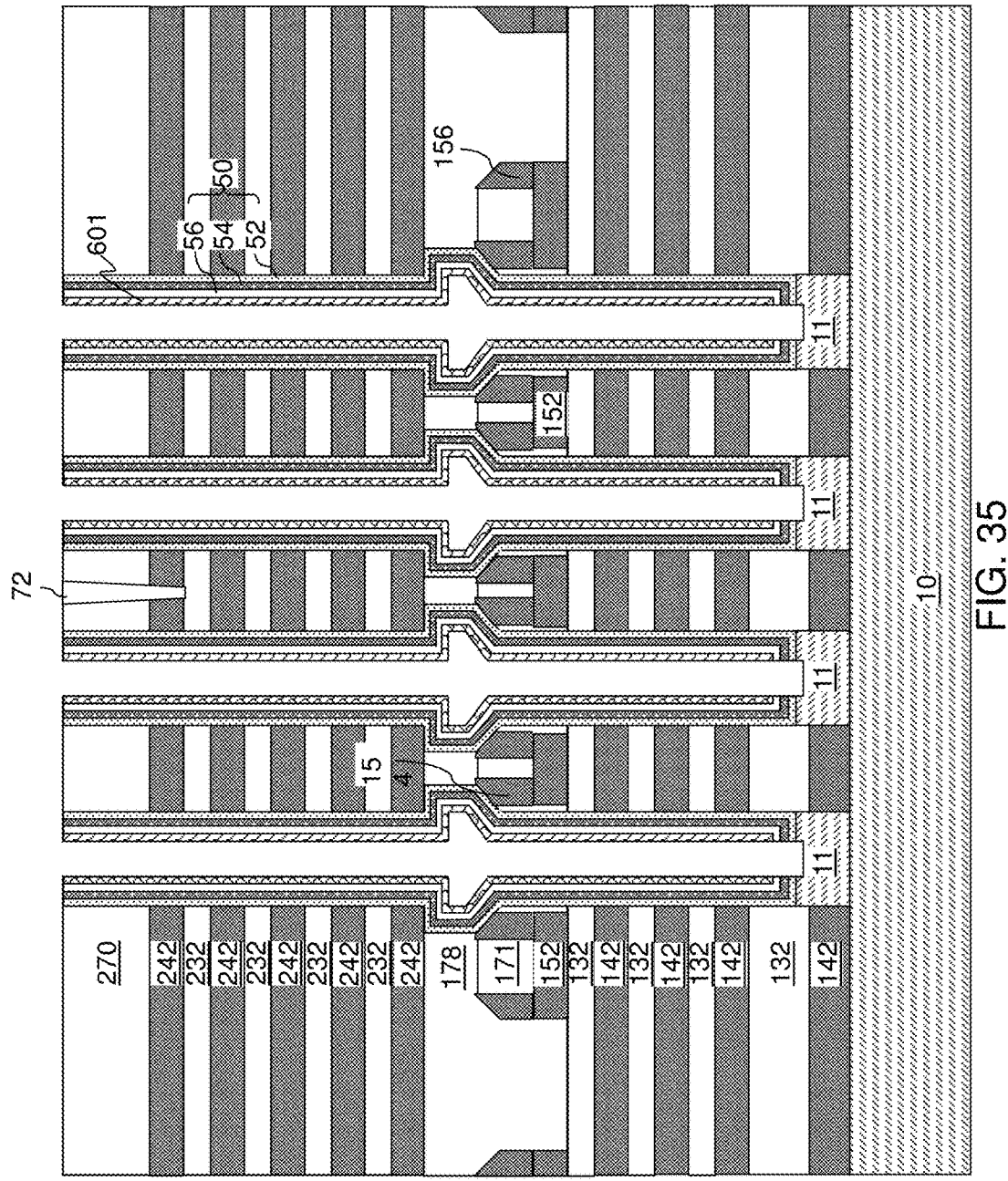
FIG. 35 is a vertical cross-sectional view of the second exemplary structure after formation of memory films and first semiconductor channels according to the second embodiment of the present disclosure.

Referring to FIG. 35, semiconductor oxide portions 13 may be optionally removed to physically expose the top surfaces of the epitaxial channel portions 11. In one embodiment, the semiconductor oxide portions 13 can be removed by a wet etch employing hydrofluoric acid. In another embodiment, the semiconductor oxide portions are not removed.

Subsequently, a subset of the processing steps of FIG. 11 can be performed to form a memory film 50 within each memory opening 49. Each component layer of the memory film 50 can be formed as a conformal material layer including laterally protruding portions at the level of the second insulating cap layer 178. The outermost layer of the memory film 50 (such as the blocking dielectric layer 52) can contact an upper tapered portion of an inner sidewall of an annular dielectric spacer 154, a vertical sidewall of the second insulating cap layer 178 overlying the annular dielectric spacer 154, and another vertical sidewall of the second insulating cap layer 178 underlying the annular dielectric spacer 154. Further, a first semiconductor channel 601 can be formed on each memory film 50 by depositing and anisotropically etching a first semiconductor channel layer.

Figure 36A:
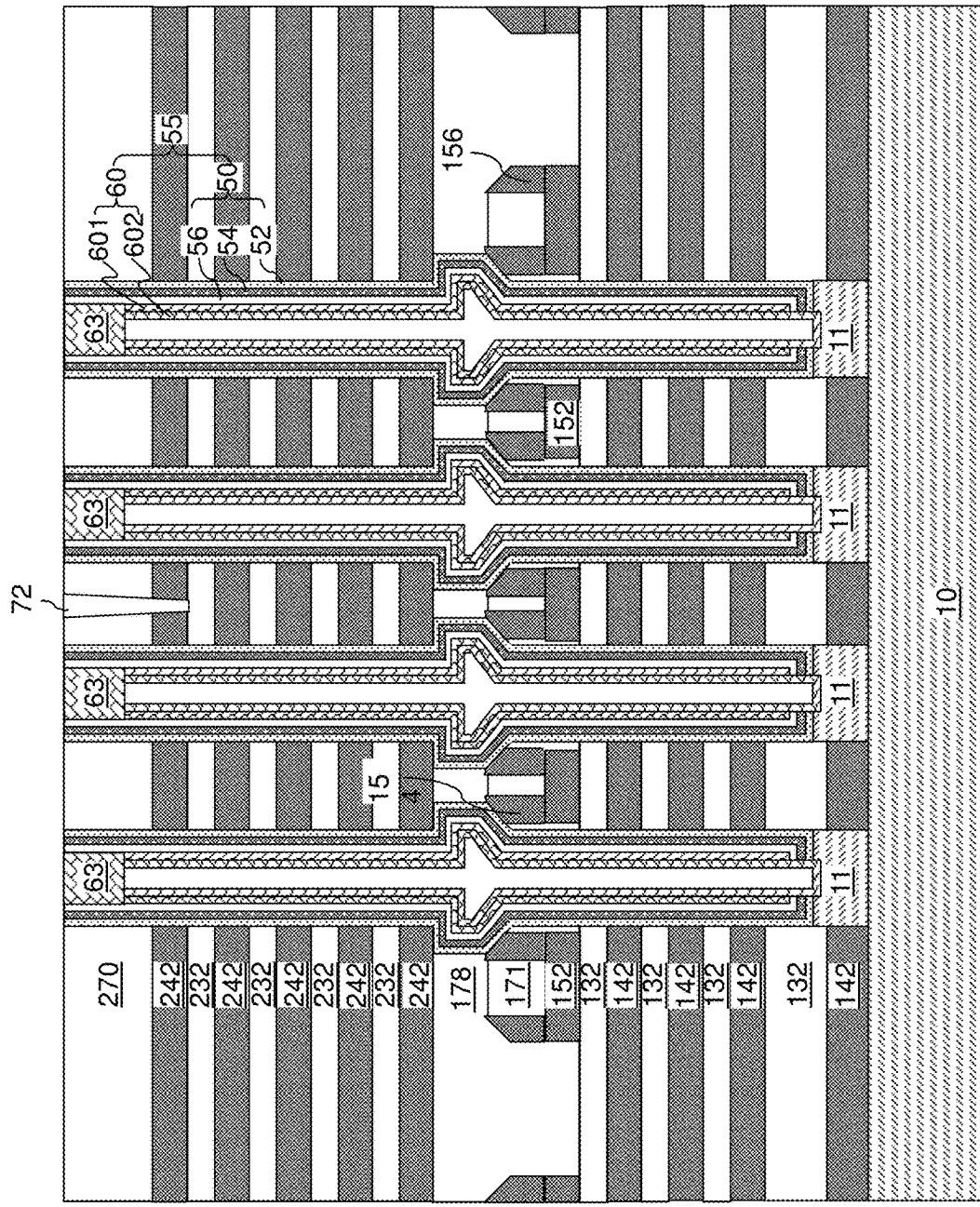
FIG. 36A is a vertical cross-sectional view of the second exemplary structure after formation of dielectric cores and drain regions according to the second embodiment of the present disclosure.
Figure 36B:
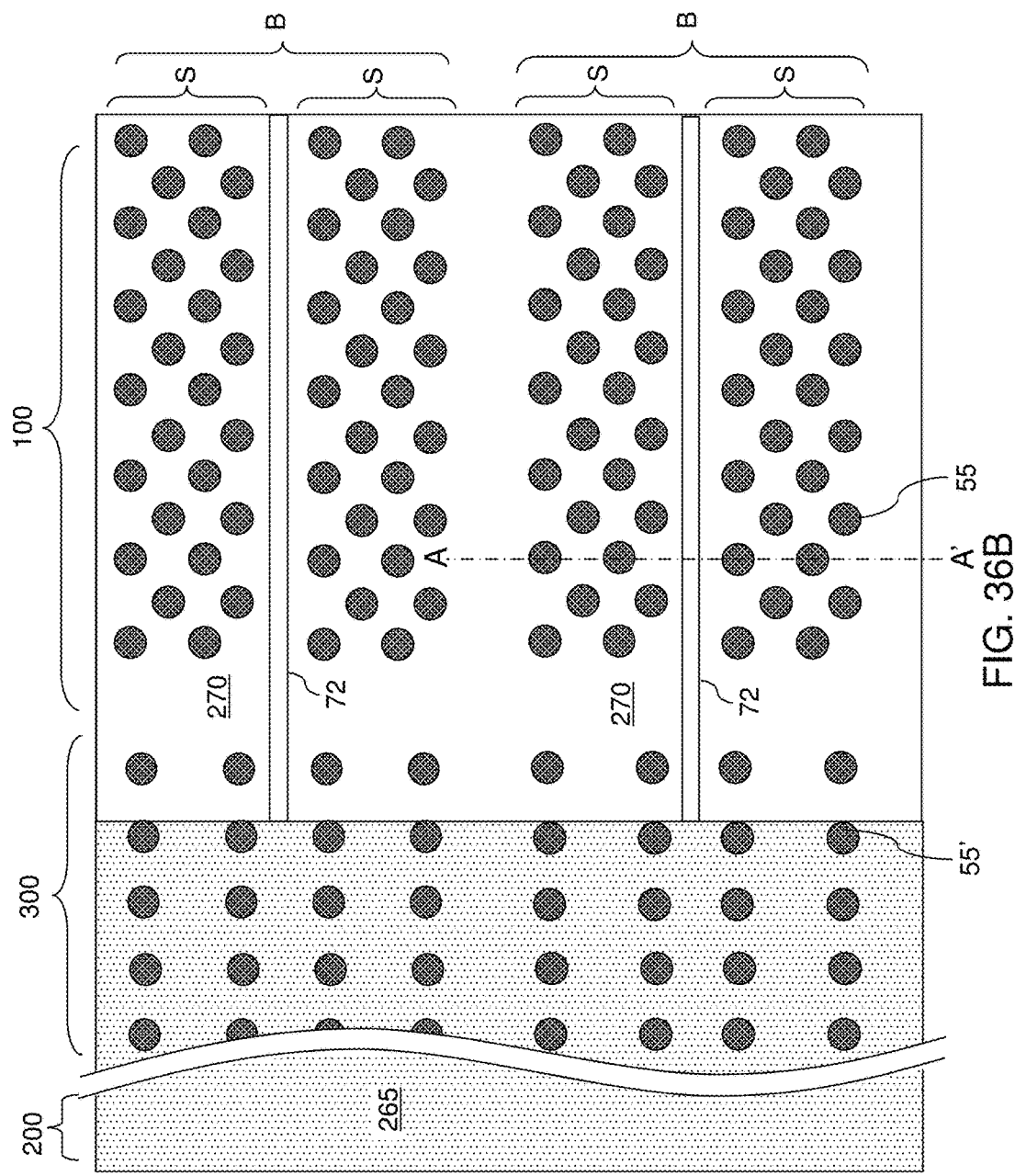
FIG. 36B is a top-down view of the second exemplary structure of FIG. 36A. The vertical plane A-A' is the plane of the vertical cross-sectional view of FIG. 36A.

Referring to FIGS. 36A and 36B, a second semiconductor channel 602, a dielectric core 62, and a drain region 63 can be formed inside each memory film by performing the processing steps of FIG. 11 of the first embodiment. Memory stack structures 55 are formed in the memory openings 49. Each of the memory stack structures 55 comprises a semiconductor channel 60 and a memory film 50 including a plurality of charge storage regions (which may be embodied as portions of a memory material layer 54 that are located at the levels of the first and second sacrificial material layers (142, 242)).

Figure 37A:
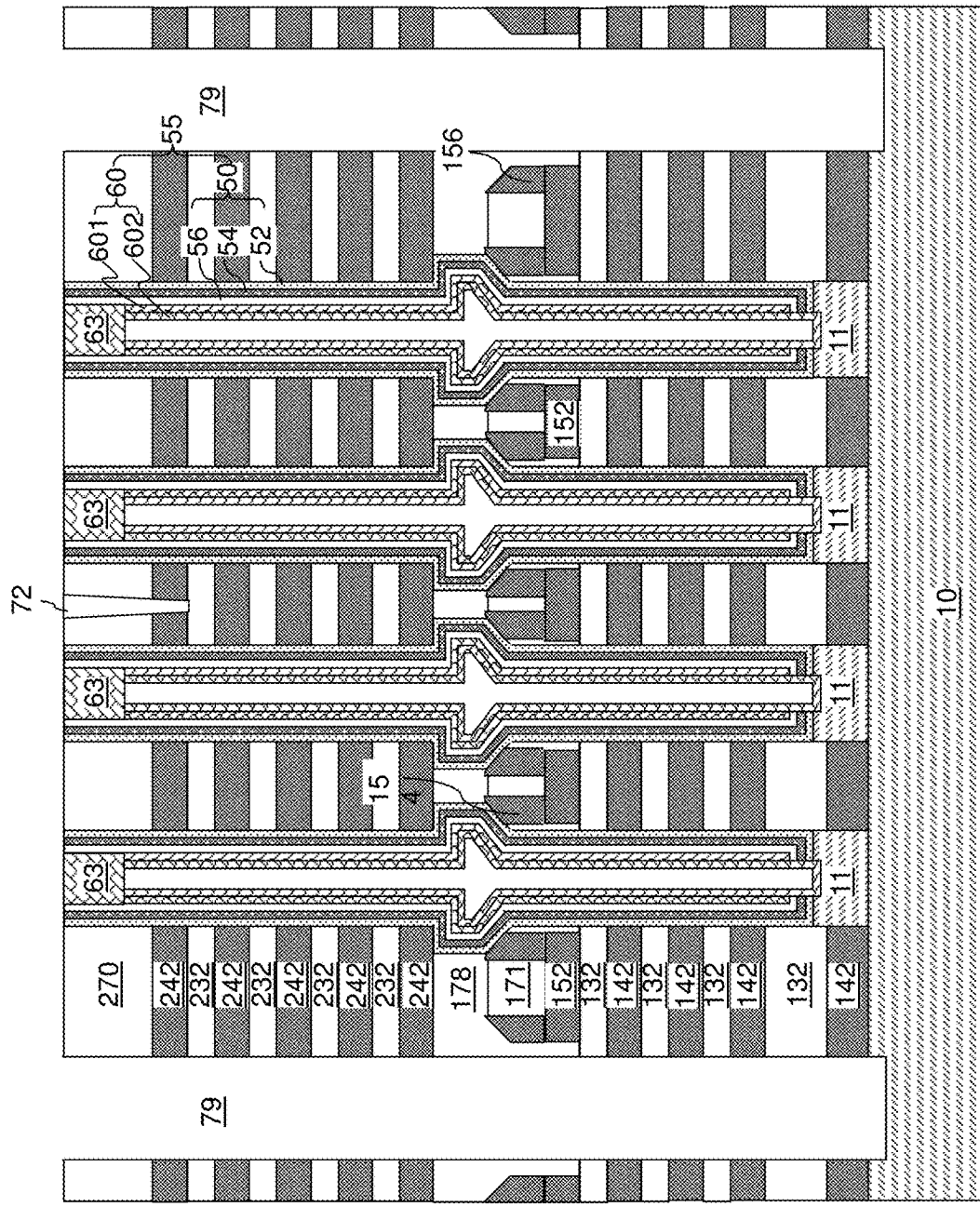
FIG. 37A is a vertical cross-sectional view of the second exemplary structure after formation of backside trenches according to the second embodiment of the present disclosure.
Figure 37B:
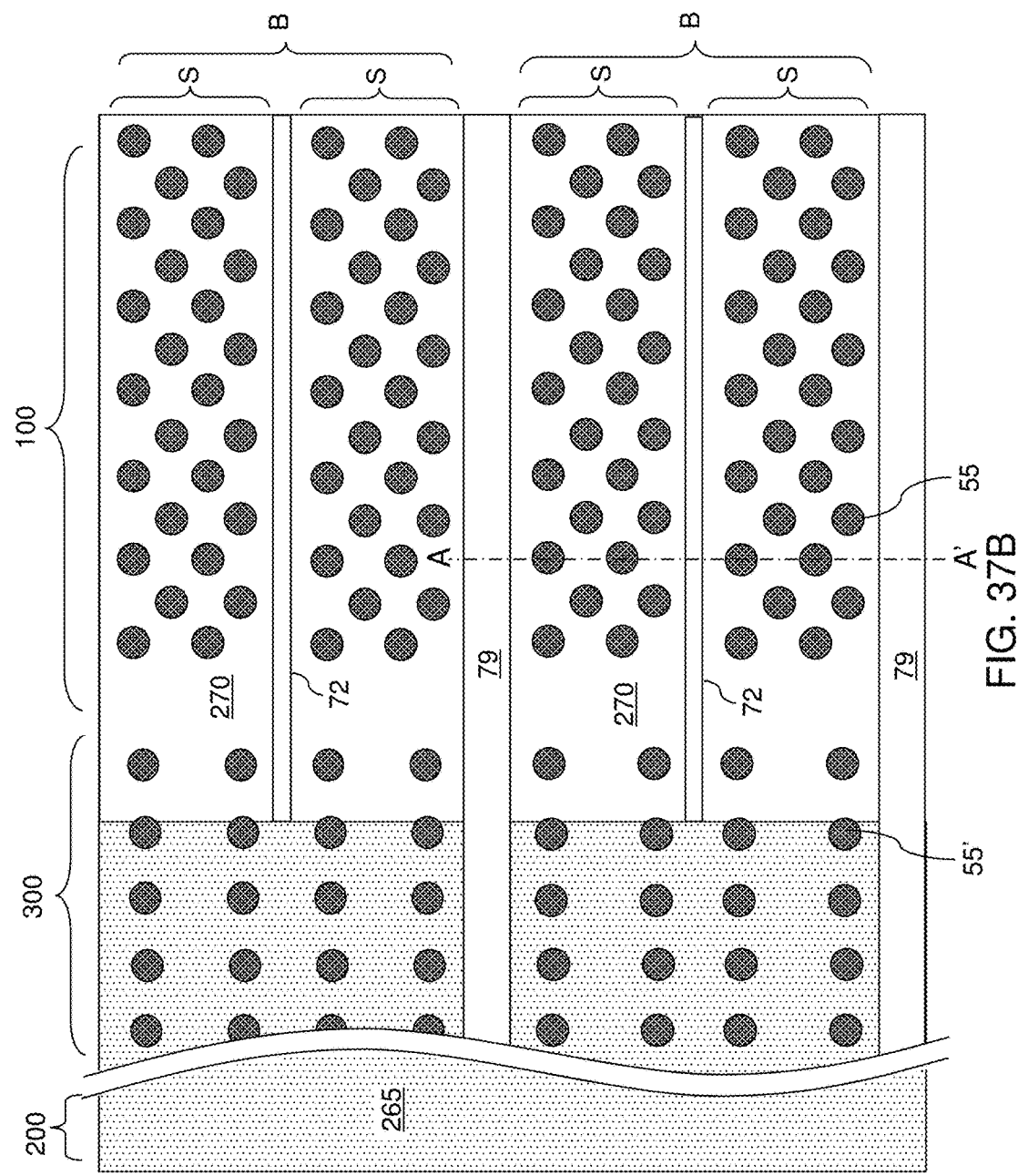
FIG. 37B is a top-down view of the second exemplary structure of FIG. 37A. The vertical plane A-A' is the plane of the vertical cross-sectional view of FIG. 37A.

Referring to FIGS. 37A and 37B, the processing steps of FIG. 14 can be performed to form backside trenches 79. An embodiment is illustrated, in which the planarization material layer 280 of FIG. 14 is omitted. Formation of the planarization material layer 280 over the second insulating tier cap layer 270 prior to formation of the backside trenches 79 is optional. As such, embodiments are expressly contemplated herein, in which the planarization material layer 280 of FIG. 14 is formed over the second insulating tier cap layer 270 prior to formation of the backside trenches 79.

The backside trenches 79 can be formed within the areas of the openings inside the rectangular dielectric spacers 156. In one embodiment, a backside trench 79 can be located entirely within the area of the opening within a rectangular dielectric spacer 156, and sidewalls of backside trench 79 can be laterally offset inward from the inner sidewalls of the rectangular dielectric spacer 156. Thus, surfaces of the rectangular dielectric spacers 156 are not physically exposed to the backside trenches 79. Further, each of the backside trenches 79 is laterally spaced from the dielectric etch stop layer 152. In one embodiment, inner sidewalls of the annular dielectric spacer 154 can be vertically coincident with sidewalls of the dielectric etch stop layer 152. Further, inner sidewalls of the rectangular dielectric spacers 156 can be vertically coincident with sidewalls of the dielectric etch stop layer 152.

Figure 38:
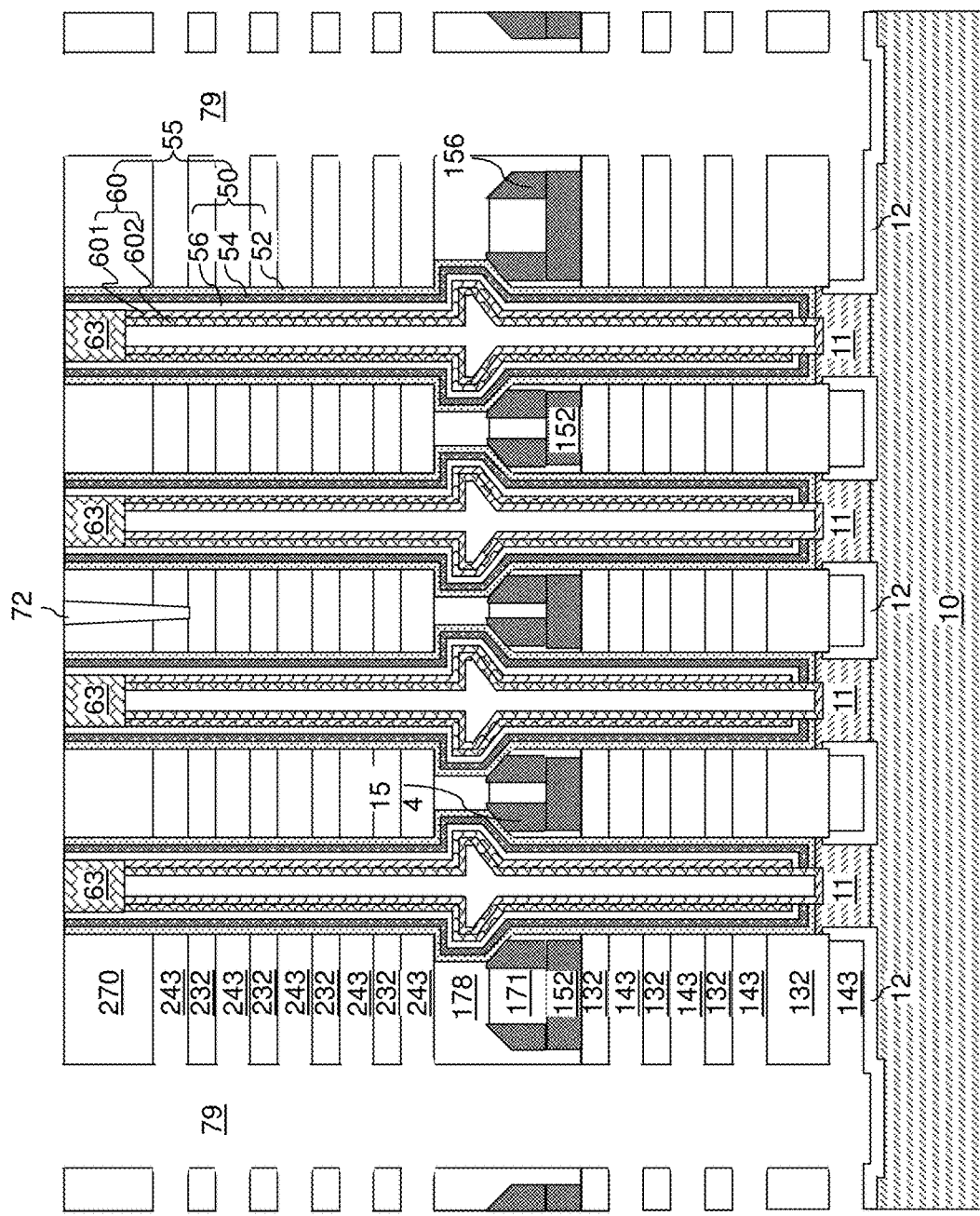
FIG. 38 is a vertical cross-sectional view of the second exemplary structure after formation of backside recesses by removal of the sacrificial material layers and formation of a gate dielectric layer according to the second embodiment of the present disclosure.

Referring to FIG. 38, the processing steps of FIG. 15 can be performed to form first and second backside recesses (143, 243). An etchant that selectively etches the materials of the first and second sacrificial material layers (142, 242) with respect to the materials of the first and second insulating layers (132, 232), the second insulating cap layer 178, the second insulating tier cap layer 270, the first and second retro-stepped dielectric material portions (165, 265), the substrate 10, and the outermost layer of each memory film 50. First backside recesses 143 are formed in volumes from which the first sacrificial material layers 142 are removed. Second backside recesses 243 are formed in volumes from which the second sacrificial material layers 242 are removed. In one embodiment, the first and second sacrificial material layers (142, 242) can include silicon nitride, and the materials of the first and second insulating layers (132, 232), can be silicon oxide. The dielectric etch stop layer 152 and the respective spacers (154, 156) are not removed at this step because they are offset from the backside trenches 79.

Each of the first and second backside recesses (143, 243) can be a laterally extending cavity having a lateral dimension that is greater than the vertical extent of the cavity. In other words, the lateral dimension of each of the first and second backside recesses (143, 243) can be greater than the height of the respective backside recess (143, 243). Each of the first and second backside recesses (143, 243) can extend substantially parallel to the top surface of the substrate 10. In one embodiment, each of the first and second backside recesses (143, 243) can have a uniform height throughout.

In one embodiment, a sidewall surface of each epitaxial channel portion 11 and a top surface of a semiconductor material layer in the substrate (i.e., the substrate semiconductor layer 10) can be physically exposed below the bottommost first backside recess 143 after removal of the first and second sacrificial material layers (142, 242).

A gate dielectric layer 12 can be formed by converting surface portions of the epitaxial channel portions 11 and the substrate (e.g., the substrate semiconductor layer 10) into a continuous dielectric material layer. In one embodiment, the gate dielectric layer 12 can be formed by thermal conversion of the surface portions of the epitaxial channel portions 11 and the substrate semiconductor layer 10. In one embodiment, the thermal conversion process can include a thermal oxidation process and/or a thermal nitridation process. In one embodiment, the gate dielectric layer 12 can include a thermal oxide of the semiconductor material of the substrate semiconductor layer 10. The gate dielectric layer 12 can be formed as a single continuous layer.

Figure 39A:
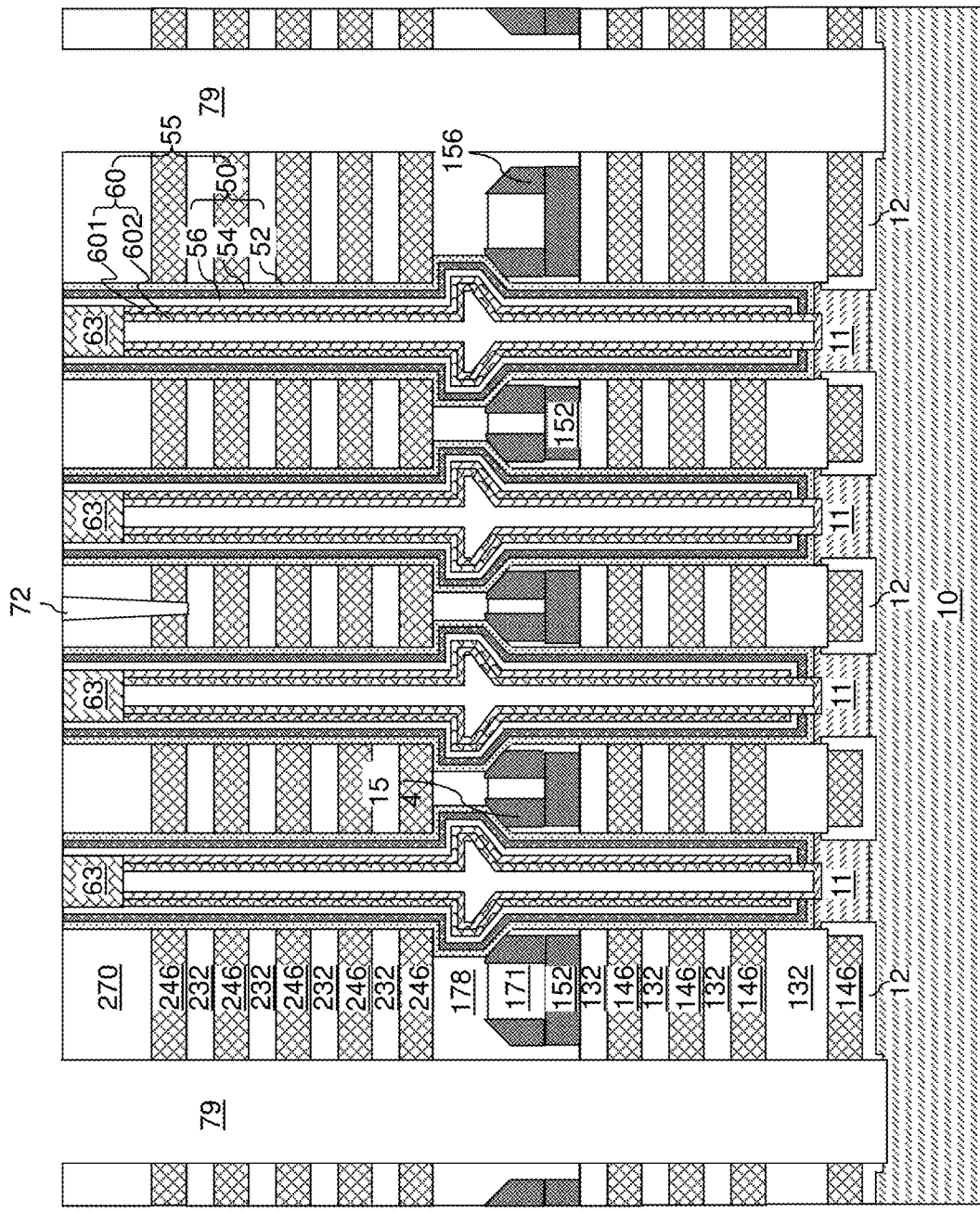
FIG. 39A is a vertical cross-sectional view of the second exemplary structure after formation of electrically conductive layers and removal of residual materials from the backside trenches according to the second embodiment of the present disclosure.
Figure 39C:
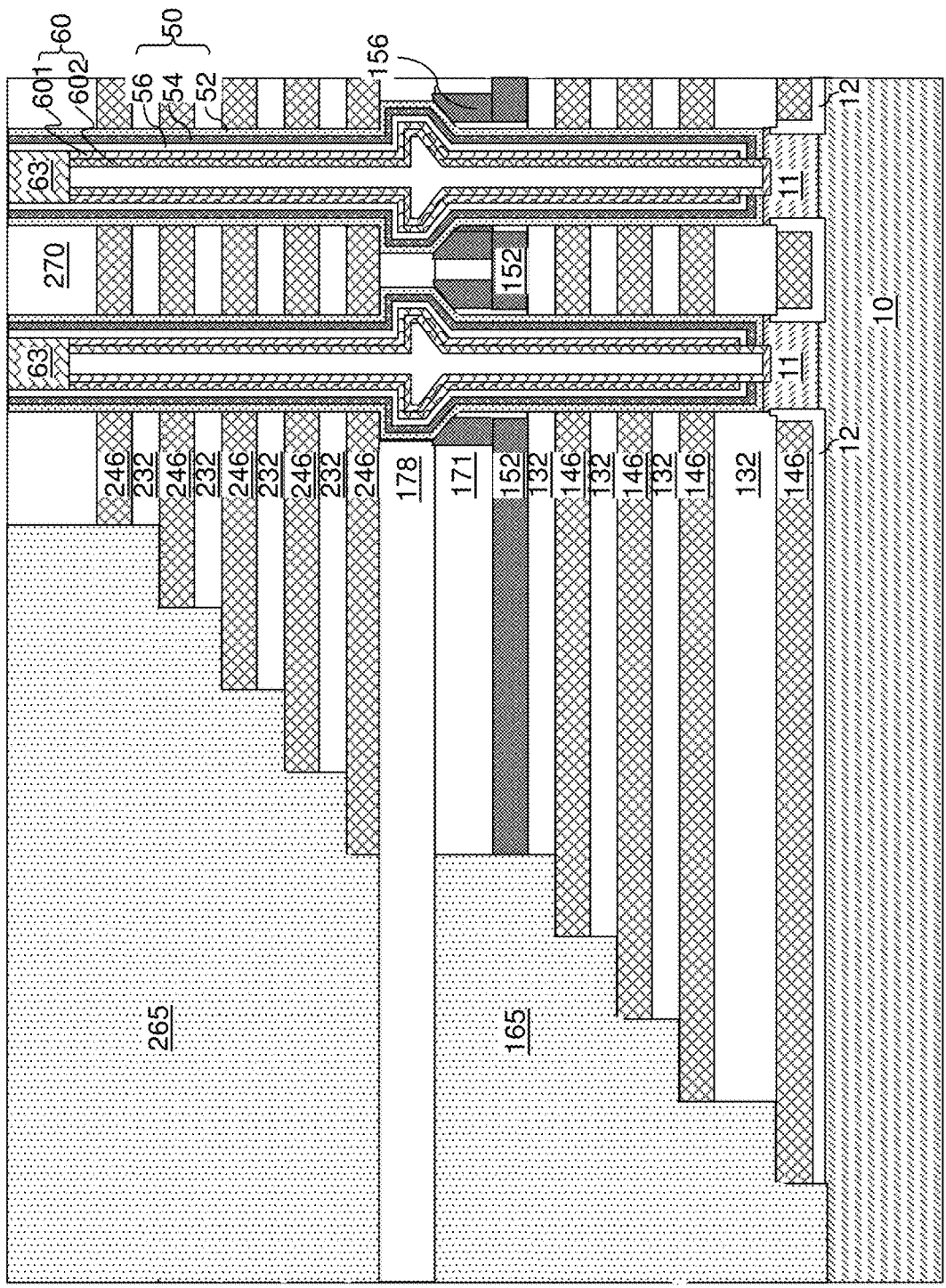
FIG. 39C is a vertical cross-sectional view of the second exemplary structure of FIG. 39A along the horizontal plane C-C'.

Referring to FIGS. 39A-39C, the processing steps of FIGS. 18 and 19 can be performed to form electrically conductive layers (146, 246) in the backside recesses (143, 243). A backside blocking dielectric layer (not shown) can be optionally deposited in the backside recesses (143, 243) and the backside trenches 79 and over the planarization dielectric layer 280 as in the first embodiment. At least one conductive material can be deposited in the plurality of backside recesses (143, 243) and on the sidewalls of the backside trenches 79. The at least one conductive material can include at least one metallic material, i.e., an electrically conductive material that includes at least one metallic element.

A plurality of first electrically conductive layers 146 can be formed in the plurality of first backside recesses 143, a plurality of second electrically conductive layers 246 can be formed in the plurality of second backside recesses 243, and a continuous metallic material layer can be formed on the sidewalls of each backside trench 79. Residual portions of the at least one conductive material can be removed from the inside of each backside trench 79 by an isotropic etch or an anisotropic etch. Each remaining portion of the deposited metallic material in the first backside recesses 143 constitutes a first electrically conductive layer 146. Each remaining portion of the deposited metallic material in the second backside recesses 243 constitutes a second electrically conductive layer 246.

The electrically conductive layers (146, 246) include word lines for controlling the memory stack structures 55. The bottommost first electrically conductive layer 146 can be a source select gate electrode located over the gate dielectric layer 12, which can control activation of a horizontal channel portion of a semiconductor channel that extends between a source region 61 (which is previously formed or which will be subsequently formed underneath each backside trench 79) and drain regions 63. One or more uppermost second electrically conductive layers 246 that are divided by drain select level isolation structures 72 can be drain select gate electrodes that can be employed to select sub-block of memory stack structures 55 (e.g., NAND strings) for read, write and/or erase operation. Likewise, one or more lowermost first electrically conductive layers 146 can be source select gate electrodes.

Figure 40:
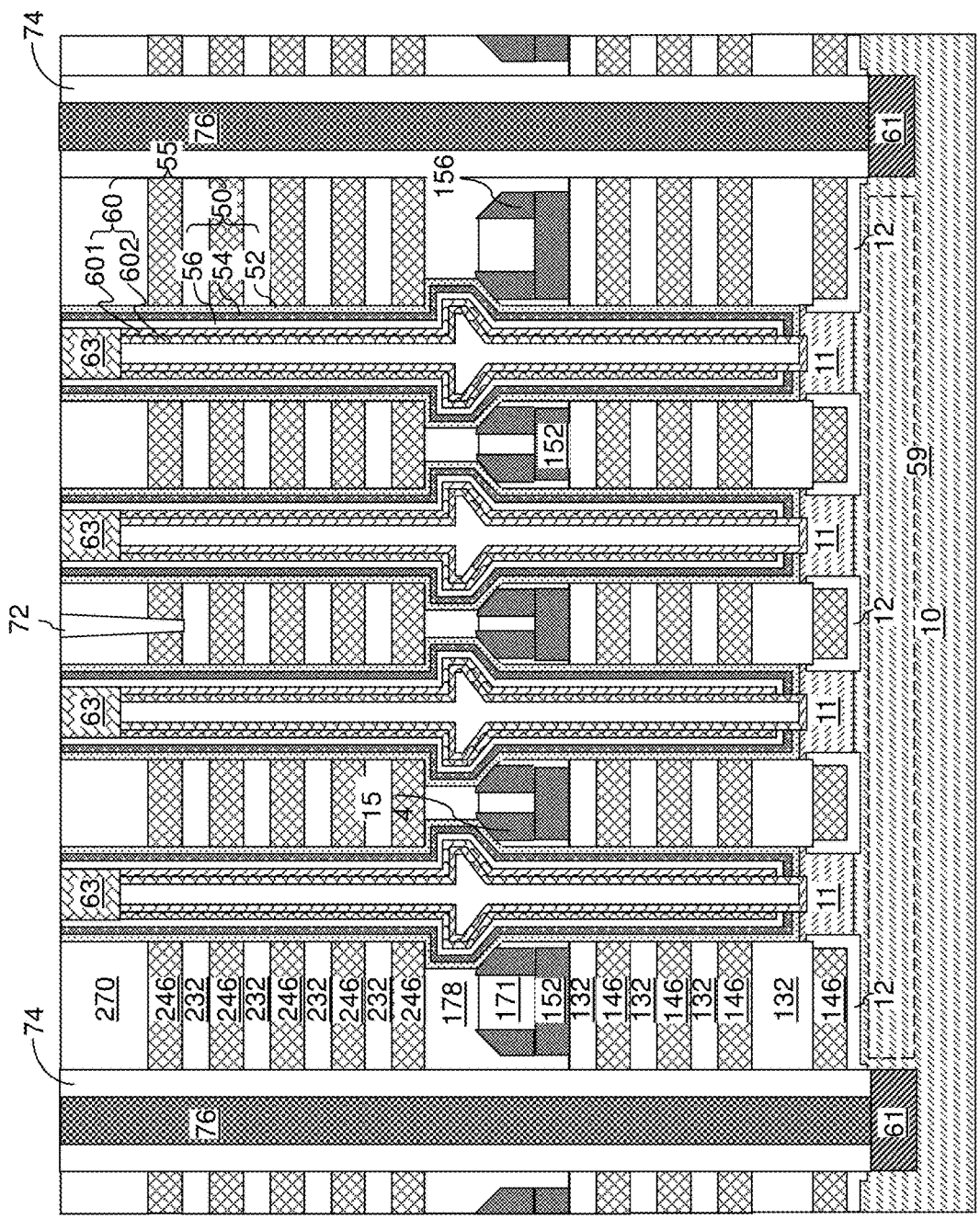
FIG. 40 is a vertical cross-sectional view of the second exemplary structure after formation of source regions, insulating spacers, and backside contact structures according to the second embodiment of the present disclosure.

Referring to FIG. 40, dopants of a second conductivity type, which is the opposite of the first conductivity type of the substrate semiconductor layer 10, can be implanted into a surface portion of the substrate semiconductor layer 10 to form a source region 61 underneath the bottom surface of each backside trench 79. An insulating spacer 74 including a dielectric material can be formed at the periphery of each backside trench 79, for example, by deposition of a conformal insulating material (such as silicon oxide) and a subsequent anisotropic etch.

A backside contact via structure 76 can be formed in the remaining volume of each backside trench 79, for example, by deposition of at least one conductive material and removal of excess portions of the deposited at least one conductive material from above a horizontal plane including the top surface of the second insulating tier cap layer 270 by a planarization process such as chemical mechanical planarization or a recess etch. Each backside contact via structure 76 can be formed through the at least one tier structure (132, 146, 232, 246) and on a source region 61, which may be a source region. The top surface of each backside contact via structure 76 can be formed within the horizontal plane that includes the top surfaces of the memory stack structures 55. Surface portions of the semiconductor substrate layer 10 between a source region 61 and epitaxial channel portions 11 constitute a horizontal semiconductor channel 59.

As shown in FIG. 40, the dielectric etch stop layer 152 and the respective spacers (154, 156) are retained in the final device and are located at the joint region between the first (e.g., lower) and second (e.g., upper) tier structures containing the respective electrically conductive layers (146, 246), such as tungsten layers. The dielectric etch stop layer 152 can be made of silicon nitride, which can offset some of the stress exerted on the substrate by the tungsten layers (146, 246) which decreases the amount of warping imposed on the substrate. Furthermore, the silicon nitride spacers 154 can act as protective spacers during the reactive ion etching of the memory openings 49 to protect the joint region of the memory openings from etching damage.

Figure 41A:
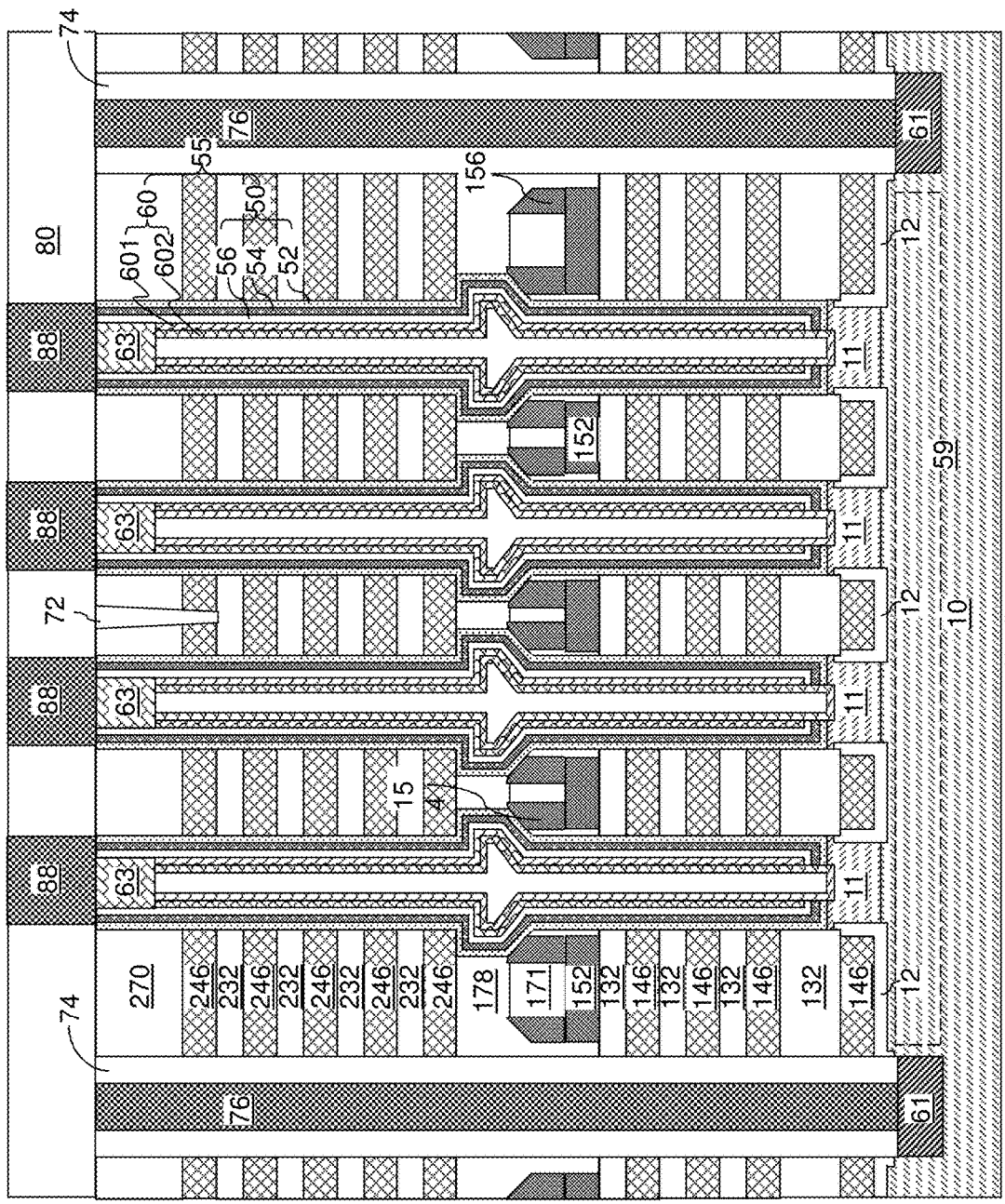
FIG. 41A is a vertical cross-sectional view of the second exemplary structure after formation of additional contact via structures according to the second embodiment of the present disclosure.
Figure 41B:
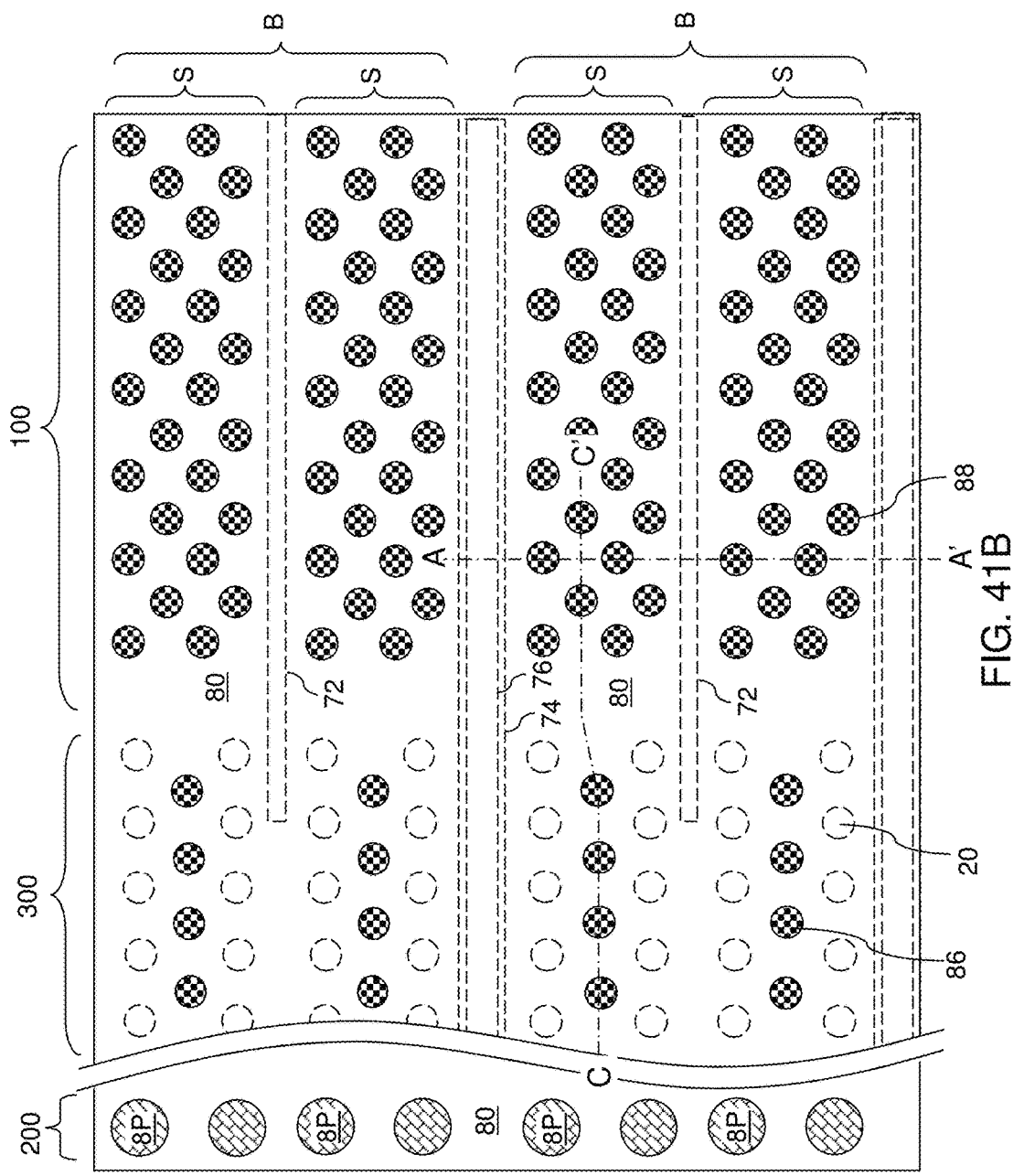
FIG. 41B is a top-down view of the second exemplary structure of FIG. 41A. The vertical plane A-A' is the plane of the vertical cross-sectional view of FIG. 41A.
Figure 41C:
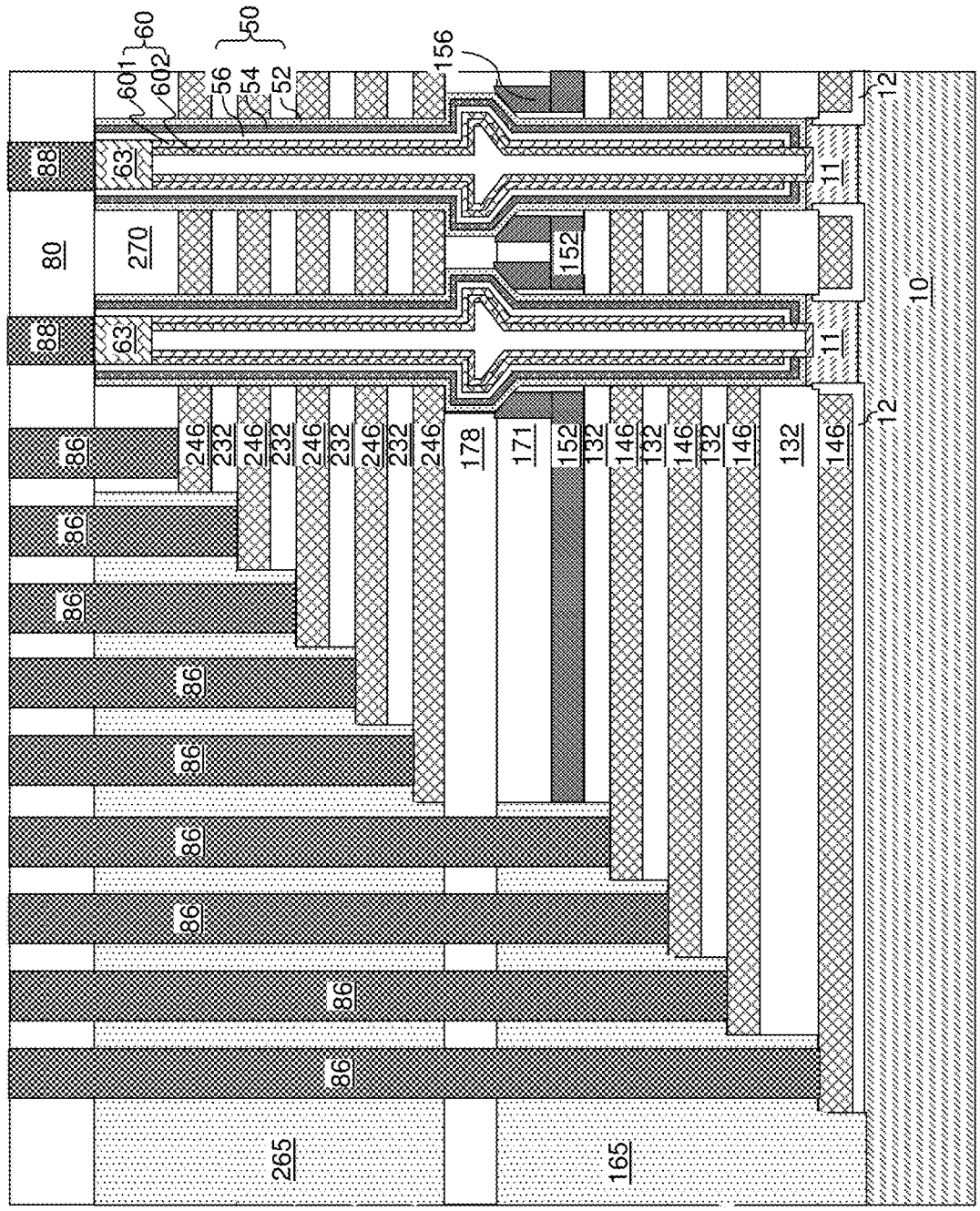
FIG. 41C is a vertical cross-sectional view of the second exemplary structure of FIG. 41A along the horizontal plane C-C'.

Referring to FIGS. 41A-41C, a contact level dielectric layer 80 can be formed over the second insulating tier cap layer 270. Additional contact via structures (88, 86) can be formed through the contact level dielectric layer 80, and optionally through the retro-stepped dielectric material portions (165, 265). For example, drain contact via structures 88 can be formed through the contact level dielectric layer 80 on each drain region 63. Word line contact via structures 86 can be formed on the electrically conductive layers (146, 246) through the contact level dielectric layer 80, through the second retro-stepped dielectric material portion 265, and optionally through the second insulating cap layer 178 and the first retro-stepped dielectric material portion 165. Peripheral device contact via structures (not shown) can be formed through the retro-stepped dielectric material portions (165, 265) directly on respective nodes of the peripheral devices.

The various embodiments of the present disclosure provide a monolithic three-dimensional memory device, which comprises: a first alternating stack of first insulating layers 132 and first electrically conductive layers 146 located over a top surface of a substrate 10; an insulating cap layer {e.g., (171, 178) or 170} overlying the first alternating stack (132, 146); a second alternating stack of second insulating layers 232 and second electrically conductive layers 246 and overlying the insulating cap layer {(171, 178) or 170}; memory openings 49 extending through the second alternating stack (232, 246), the insulating cap layer {(171, 178) or 170}, and the first alternating stack (132, 146); memory stack structures 55 located within the memory openings 49, wherein each of the memory stack structures 55 comprises a semiconductor channel 60 and a memory film 50 including a plurality of charge storage regions; and annular spacers (154 or 171) located within the insulating cap layer {(171, 178) or 170} and laterally surrounding a respective one of the memory stack structures 55.

In one embodiment, the annular spacers 154 can be annular dielectric spacers 154. Rectangular dielectric spacers 156 can be provided at the same level as the annular dielectric spacers 154. The annular dielectric spacers 154 and the rectangular dielectric spacers 516 comprise a dielectric material having a different composition than the first and second insulating layers (132, 232). In one embodiment, the first and second insulating layers (132, 232) comprise silicon oxide, and the annular dielectric spacers 154 comprise silicon nitride.

In one embodiment, a portion of inner sidewalls of the annular spacers 154 is not in physical contact with any of the memory films 50 of the memory stack structures 55, and is laterally spaced from a most proximal one of the memory films 50 by a portion of the insulating cap layer (171, 178), such as a portion of a second insulating cap layer 178.

In one embodiment, outer sidewalls of the annular spacers 154 can be vertical; inner sidewalls of the annular spacers 154 comprise lower vertical portions 54L and upper tapered portions 54U; and the upper tapered portions 54U contact tapered bottom surfaces of the memory films 50 of the memory stack structures 55.

In one embodiment, the monolithic three-dimensional memory device can further comprise a dielectric etch stop layer 152 contacting bottom surfaces of the annular spacers 154 and comprising a dielectric material that is different in composition from the first and second insulating layers (132, 232). In one embodiment, the insulating cap layer (171, 178) comprises a first insulating cap layer 171 and a second insulating cap layer 178 contacting a top surface of the first insulating cap layer 171; and the second insulating cap layer 178 includes downward-protruding portions that contact sidewalls of the dielectric etch stop layer 152. In one embodiment, the first insulating cap layer 171 contacts outer sidewalls of the annular spacers 154; and the second insulating cap layer 178 contacts tapered portions of inner sidewalls of the annular spacers 154.

In one embodiment, the monolithic three-dimensional memory device further comprises a first retro-stepped dielectric material portion 165 overlying first stepped surfaces of the first alternating stack (132, 146); a second retro-stepped dielectric material portion 265 overlying second stepped surfaces of the second alternating stack (232, 246); and word line contact via structures 86 extending at least through the second retro-stepped dielectric material portion 265 and contacting top surfaces of a respective one of the first and second electrically conductive layers (146, 246), wherein the second insulating cap layer 178 is disposed between the first retro-stepped dielectric material portion 165 and the second dielectric material portion 265.

In one embodiment, the monolithic three-dimensional memory device further comprises: backside trenches 79 vertically extending through the second alternating stack (232, 246), the insulating cap layer (171, 178), and the first alternating stack (132, 146); and insulating material portions (such as the insulating spacers 74) located in the backside trenches 79 and contacting sidewalls of the backside trenches 79 and laterally spaced from the dielectric etch stop layer 152. In one embodiment, the monolithic three-dimensional memory device further comprises: backside contact via structures 76 located within a respective one of the insulating material portions 74 in the backside trenches 79; and source regions 61 located in the substrate 10 and contacting a bottom surface of a respective one of the backside contact via structures 76.

In one embodiment, each of the memory stack structures 55 has a laterally bulging portion that is located within the insulating cap layer (171, 178) and overlying a respective one of the annular spacers 154, wherein top surfaces of the laterally bulging portions are within a horizontal plane including a top surface of the insulating cap layer (171, 178) such as the top surface of the second insulating cap layer 178.

In one embodiment, the monolithic three-dimensional memory structure comprises a monolithic three-dimensional NAND memory device. The first and second electrically conductive layers (146, 246) can comprise, or can be electrically connected to, a respective word line of the monolithic three-dimensional NAND memory device. The substrate 10 can comprise a silicon substrate. The monolithic three-dimensional NAND memory device can comprise an array of monolithic three-dimensional NAND strings over the silicon substrate. At least one memory cell in a first device level of the array of monolithic three-dimensional NAND strings can be located over another memory cell in a second device level of the array of monolithic three-dimensional NAND strings. The silicon substrate can contain an integrated circuit comprising a driver circuit for the memory device located thereon. The array of monolithic three-dimensional NAND strings can comprise a plurality of semiconductor channels (59, 11, 60). At least one end portion of each of the plurality of semiconductor channels (59, 11, 60) extends substantially perpendicular to a top surface of the substrate 10. The array of monolithic three-dimensional NAND strings can comprises a plurality of charge storage elements. Each charge storage element can be located adjacent to a respective one of the plurality of semiconductor channels (59, 11, 60). The array of monolithic three-dimensional NAND strings can comprise a plurality of control gate electrodes having a strip shape extending substantially parallel to the top surface of the substrate. The plurality of control gate electrodes can comprise at least a first control gate electrode located in the first device level and a second control gate electrode located in the second device level.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A monolithic three-dimensional memory device, comprising:
    a first alternating stack of first insulating layers and first electrically conductive layers located over a top surface of a substrate;
    an insulating cap layer overlying the first alternating stack;
    a second alternating stack of second insulating layers and second electrically conductive layers and overlying the insulating cap layer;
    memory openings extending through the second alternating stack, the insulating cap layer, and the first alternating stack;
    memory stack structures located within the memory openings, wherein each of the memory stack structures comprises a semiconductor channel and a memory film; and
    annular spacers located within the insulating cap layer and laterally surrounding a respective one of the memory stack structures,
    wherein:
    outer sidewalls of the annular spacers are vertical;
    inner sidewalls of the annular spacers comprise lower vertical portions and upper tapered portions; and
    the upper tapered portions contact tapered bottom surfaces of the memory films of the memory stack structures.

2. A monolithic three-dimensional memory device, comprising:
    a first alternating stack of first insulating layers and first electrically conductive layers located over a top surface of a substrate;
    an insulating cap layer overlying the first alternating stack;
    a second alternating stack of second insulating layers and second electrically conductive layers and overlying the insulating cap layer;
    memory openings extending through the second alternating stack, the insulating cap layer, and the first alternating stack;
    memory stack structures located within the memory openings, wherein each of the memory stack structures comprises a semiconductor channel and a memory film;
    annular spacers located within the insulating cap layer and laterally surrounding a respective one of the memory stack structures; and
    a dielectric etch stop layer contacting bottom surfaces of the annular spacers and comprising a dielectric material that is different in composition from the first and second insulating layers.

3. The monolithic three-dimensional memory device of claim 2, wherein:
    the first and second insulating layers comprise silicon oxide; and
    the annular spacers and the dielectric etch stop layer comprise silicon nitride.

4. The monolithic three-dimensional memory device of claim 2, wherein:
    the insulating cap layer comprises a first insulating cap layer and a second insulating cap layer contacting a top surface of the first insulating cap layer; and
    the second insulating cap layer includes downward-protruding portions that contact sidewalls of the dielectric etch stop layer.

5. The monolithic three-dimensional memory device of claim 4, wherein:
    the first insulating cap layer contacts outer sidewalls of the annular spacers; and
    the second insulating cap layer contacts tapered portions of inner sidewalls of the annular spacers.

6. The monolithic three-dimensional memory device of claim 4, further comprising:
    a first retro-stepped dielectric material portion overlying first stepped surfaces of the first alternating stack;
    a second retro-stepped dielectric material portion overlying second stepped surfaces of the second alternating stack; and
    word line contact via structures extending at least through the second retro-stepped dielectric material portion and contacting top surfaces of a respective one of the first and second electrically conductive layers,
    wherein the second insulating cap layer is disposed between the first retro-stepped dielectric material portion and the second dielectric material portion.

7. The monolithic three-dimensional memory device of claim 2, further comprising:
    backside trenches vertically extending through the second alternating stack, the insulating cap layer, and the first alternating stack; and insulating material portions located in the backside trenches and contacting sidewalls of the backside trenches and laterally spaced from the dielectric etch stop layer.

8. The monolithic three-dimensional memory device of claim 7, further comprising:
    backside contact via structures located within a respective one of the insulating material portions in the backside trenches; and
    source regions located in the substrate and contacting a bottom surface of a respective one of the backside contact via structures.

9. A monolithic three-dimensional memory device, comprising:
    a first alternating stack of first insulating layers and first electrically conductive layers located over a top surface of a substrate;
    an insulating cap layer overlying the first alternating stack;
    a second alternating stack of second insulating layers and second electrically conductive layers and overlying the insulating cap layer;
    memory openings extending through the second alternating stack, the insulating cap layer, and the first alternating stack;
    memory stack structures located within the memory openings, wherein each of the memory stack structures comprises a semiconductor channel and a memory film; and
    annular spacers located within the insulating cap layer and laterally surrounding a respective one of the memory stack structures,
    wherein each of the memory stack structures has a laterally bulging portion that is located within the insulating cap layer and overlying a respective one of the annular spacers, wherein top surfaces of the laterally bulging portions are within a horizontal plane including a top surface of the insulating cap layer.

10. A monolithic three-dimensional memory device, comprising:
    a first alternating stack of first insulating layers and first electrically conductive layers located over a top surface of a substrate;
    an insulating cap layer overlying the first alternating stack;
    a second alternating stack of second insulating layers and second electrically conductive layers and overlying the insulating cap layer;
    memory openings extending through the second alternating stack, the insulating cap layer, and the first alternating stack;
    memory stack structures located within the memory openings, wherein each of the memory stack structures comprises a semiconductor channel and a memory film; and
    annular spacers located within the insulating cap layer and laterally surrounding a respective one of the memory stack structures,
wherein:
    the monolithic three-dimensional memory structure comprises a monolithic three-dimensional NAND memory device;
    the first and second electrically conductive layers comprise, or are electrically connected to, a respective word line of the monolithic three-dimensional NAND memory device;
    the substrate comprises a silicon substrate;
    the monolithic three-dimensional NAND memory device comprises an array of monolithic three-dimensional NAND strings over the silicon substrate;
    at least one memory cell in a first device level of the array of monolithic three-dimensional NAND strings is located over another memory cell in a second device level of the array of monolithic three-dimensional NAND strings;
    the silicon substrate contains an integrated circuit comprising a driver circuit for the memory device located thereon; and
    the array of monolithic three-dimensional NAND strings comprises:
        a plurality of semiconductor channels, wherein at least one end portion of each of the plurality of semiconductor channels extends substantially perpendicular to a top surface of the substrate;
        a plurality of charge storage elements, each charge storage element located adjacent to a respective one of the plurality of semiconductor channels; and
        a plurality of control gate electrodes having a strip shape extending substantially parallel to the top surface of the substrate, the plurality of control gate electrodes comprise at least a first control gate electrode located in the first device level and a second control gate electrode located in the second device level.

* * * * *